United States Patent
Ratnam

(10) Patent No.: US 9,484,092 B2
(45) Date of Patent: Nov. 1, 2016

(54) INTRINSIC VERTICAL BIT LINE ARCHITECTURE

(71) Applicant: SANDISK 3D LLC, Milpitas, CA (US)

(72) Inventor: Perumal Ratnam, Fremont, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/715,562

(22) Filed: May 18, 2015

(65) Prior Publication Data

US 2016/0019952 A1    Jan. 21, 2016

Related U.S. Application Data

(60) Provisional application No. 62/041,138, filed on Aug. 24, 2014, provisional application No. 62/000,967, filed on May 20, 2014.

(51) Int. Cl.
*G11C 13/00* (2006.01)
*G06F 11/10* (2006.01)
(Continued)

(52) U.S. Cl.
CPC ......... *G11C 13/004* (2013.01); *G06F 11/1048* (2013.01); *G11C 7/12* (2013.01); *G11C 7/18* (2013.01); *G11C 13/0007* (2013.01); *G11C 13/0021* (2013.01); *G11C 13/0026* (2013.01); *G11C 13/0028* (2013.01); *G11C 13/0033* (2013.01); *G11C 13/0069* (2013.01); *G11C 13/0097* (2013.01); *G11C 16/08* (2013.01); *G11C 16/10* (2013.01); *G11C 16/24* (2013.01); *G11C 16/26* (2013.01); *G11C 29/025* (2013.01);
(Continued)

(58) Field of Classification Search
CPC . G11C 13/004; G11C 29/025; G11C 29/028; G11C 7/18; G11C 7/12; G11C 16/08; G11C 13/0026; G11C 13/0028; G11C 16/26; G11C 16/24; G11C 16/10; G11C 13/0097; G11C 13/0033; G11C 13/0021; G11C 13/0007; G11C 13/006; G11C 2213/71; G11C 2216/10; G06F 11/1048
See application file for complete search history.

(56) References Cited

U.S. PATENT DOCUMENTS 8,338,224 B2    12/2012  Yoon
8,809,933 B2    8/2014   Lee
(Continued)

OTHER PUBLICATIONS

PCT International Search Report and Written Opinion of the International Searching Authority dated Sep. 9, 2015, PCT Patent Application No. PCT/US2015/031804.
(Continued)

*Primary Examiner* — Khamdan Alrobaie
(74) *Attorney, Agent, or Firm* — Vierra Magen Marcus LLP

(57) ABSTRACT

Methods for reducing leakage currents through unselected memory cells of a memory array during a memory operation are described. In some cases, the leakage currents through the unselected memory cells of the memory array may be reduced by setting an adjustable resistance bit line structure connected to the unselected memory cells into a non-conducting state. The adjustable resistance bit line structure may comprise a bit line structure in which the resistance of an intrinsic (or near intrinsic) polysilicon portion of the bit line structure may be adjusted via an application of a voltage to a select gate portion of the bit line structure that is not directly connected to the intrinsic polysilicon portion. The intrinsic polysilicon portion may be set into a conducting state or a non-conducting state based on the voltage applied to the select gate portion.

20 Claims, 62 Drawing Sheets

(51) Int. Cl.

| | |
|---|---|
| *H01L 27/24* | (2006.01) |
| *H01L 29/786* | (2006.01) |
| *H01L 45/00* | (2006.01) |
| *G11C 16/08* | (2006.01) |
| *G11C 16/10* | (2006.01) |
| *G11C 16/24* | (2006.01) |
| *G11C 16/26* | (2006.01) |
| *G11C 7/12* | (2006.01) |
| *G11C 7/18* | (2006.01) |
| *G11C 29/02* | (2006.01) |
| *G11C 29/12* | (2006.01) |

(52) U.S. Cl.
CPC .......... *G11C 29/028* (2013.01); *H01L 27/249* (2013.01); *H01L 27/2436* (2013.01); *H01L 27/2481* (2013.01); *H01L 29/786* (2013.01); *H01L 45/122* (2013.01); *H01L 45/1246* (2013.01); *G11C 13/0002* (2013.01); *G11C 2029/1204* (2013.01); *G11C 2213/71* (2013.01); *G11C 2216/10* (2013.01)

(56) References Cited

U.S. PATENT DOCUMENTS

| | | | |
|---|---|---|---|
| 9,224,459 | B1 | 12/2015 | Murooka |
| 2009/0196092 | A1 | 8/2009 | Jagasivamani |
| 2011/0299340 | A1 | 12/2011 | Samachisa |
| 2012/0306004 | A1 | 12/2012 | Yoon |
| 2013/0229846 | A1 | 9/2013 | Chien |
| 2013/0292630 | A1 | 11/2013 | Sasago |
| 2013/0336037 | A1 | 12/2013 | Chen |
| 2014/0003144 | A1 | 1/2014 | Banna |
| 2014/0301130 | A1 | 10/2014 | Siau |

OTHER PUBLICATIONS

U.S. Appl. No. 14/715,566, filed May 18, 2015.
U.S. Appl. No. 14/716,382, filed May 18, 2015.
U.S. Appl. No. 14/715,575, filed May 18, 2015.
U.S. Appl. No. 14/715,579, filed May 18, 2015.
U.S. Appl. No. 14/715,583, filed May 18, 2015.
U.S. Appl. No. 14/715,586, filed May 18, 2015.
U.S. Appl. No. 14/716,388, filed May 18, 2015.
Office Action dated Dec. 22, 2015, U.S. Appl. No. 14/716,382.
Office Action dated Dec. 18, 2015, U.S. Appl. No. 14/416,579.
PCT International Search Report, dated Sep. 9, 2015, PCT Patent Application PCT/US2015/031804.
Response to Office Action dated Mar. 18, 2016, U.S. Appl. No. 14/716,382.
Notice of Allowance dated Apr. 6, 2016, U.S. Appl. No. 14/716,382.
Office Action dated Feb. 12, 2016 U.S. Appl. No. 14/715,575.
Response to Office Action dated Mar. 18, 2016, U.S. Appl. No. 14/715,579.
Office Action dated Mar. 8, 2016, U.S. Appl. No. 14/715,583.
Notice of Allowance dated Apr. 15, 2016, U.S. Appl. No. 14/716,382.
Response to Office Action dated May 12, 2016 U.S. Appl. No. 14/715,575.
Supplemental Amendment filed May 31, 2016 in U.S. Appl. No. 14/715,575, 7 pages.
Notice of Allowance dated May 20, 2016 in U.S. Appl. No. 14/715,579, 17 pages.
Response to Office Action filed Jun. 8, 2016 in U.S. Appl. No. 14/715,583, 8 pages.
Notice of Allowance dated Jul. 11, 2016 in U.S. Appl. No. 14/715,583, 11 pages.
Office Action dated Jun. 20, 2016 in U.S. Appl. No. 14/715,586, 6 pages.
Response to Office Action dated Aug. 5, 2016 in U.S. Appl. No. 14/715,586.
Office Action dated Jul. 1, 2016 in U.S. Appl. No. 14/716,388, 6 pages.
Notice of Allowance dated Aug. 12, 2016 in U.S. Appl. No. 14/715,575, 16 pages.
Response to Restriction Requirement filed Aug. 15, 2016 in U.S. Appl. No. 14/715,566, 7 pages.

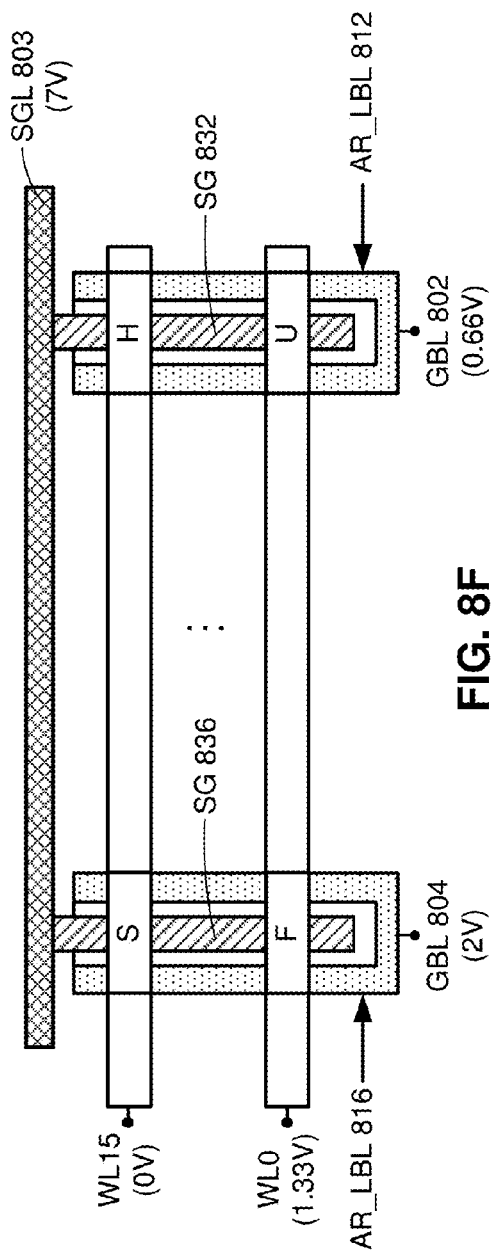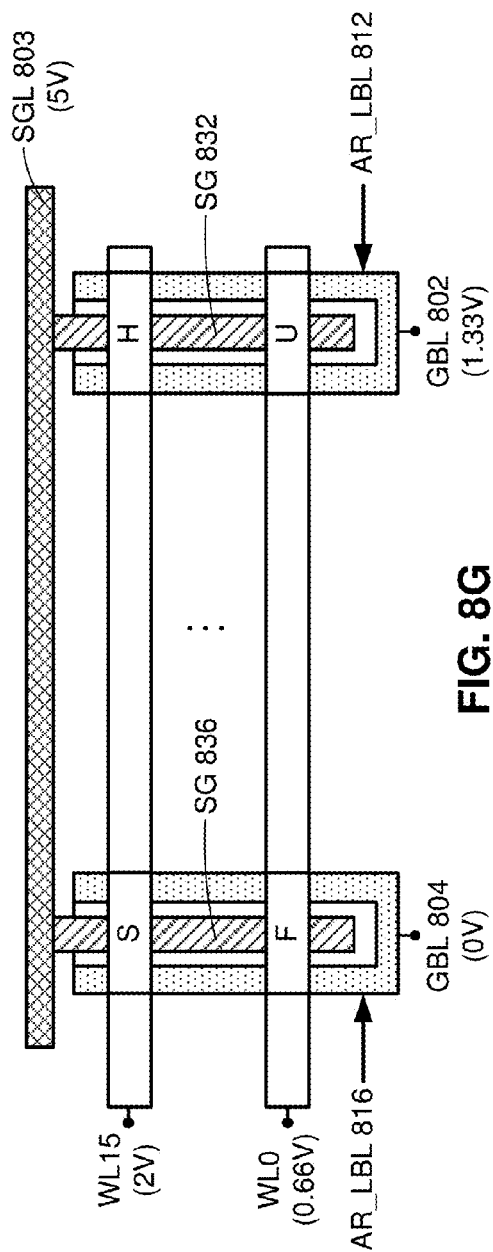

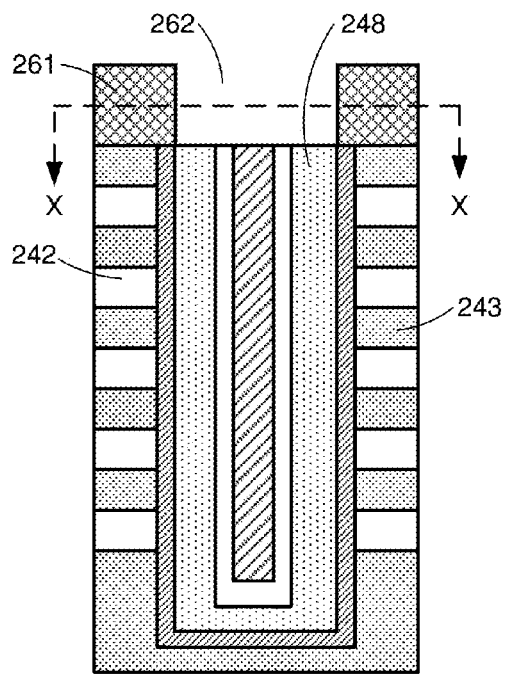
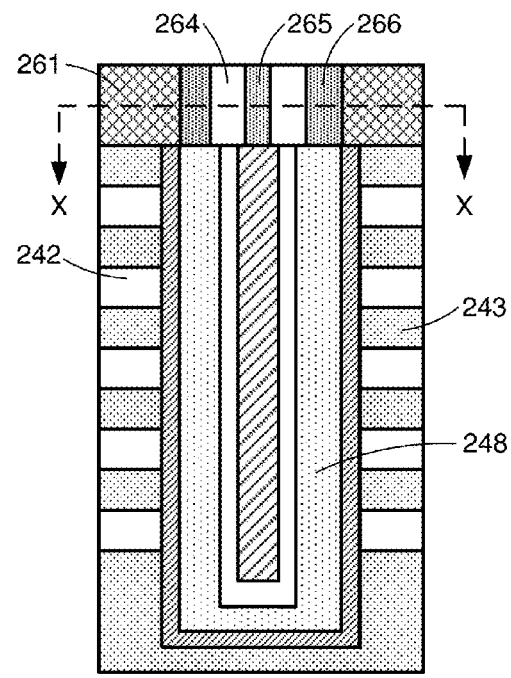
FIG. 10M FIG. 10O
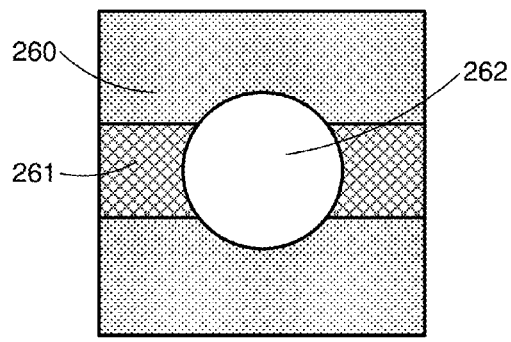
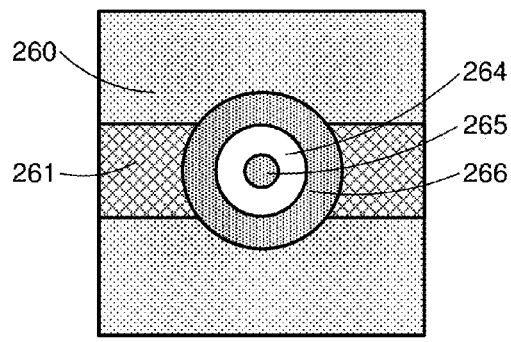
FIG. 10N FIG. 10P

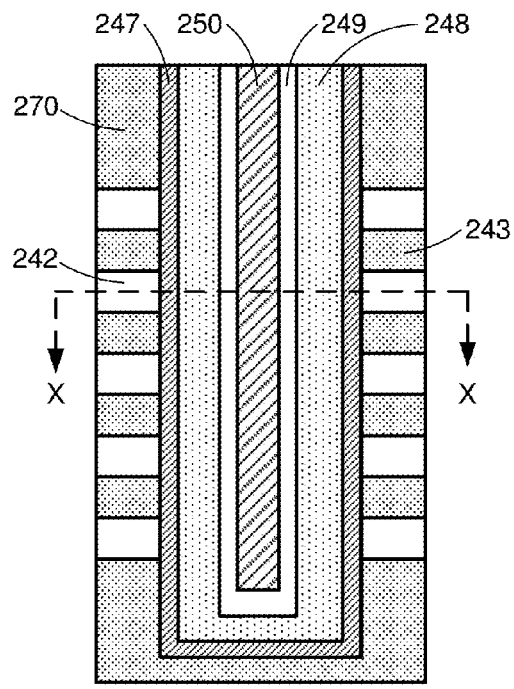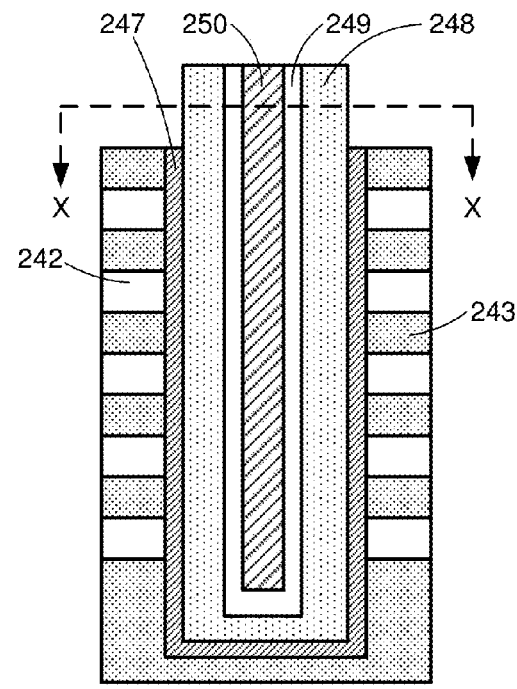
FIG. 10Q  FIG. 10S
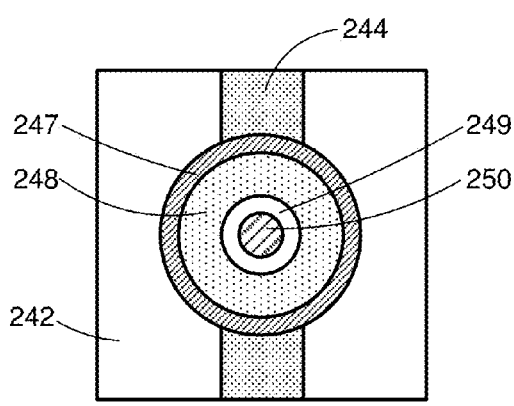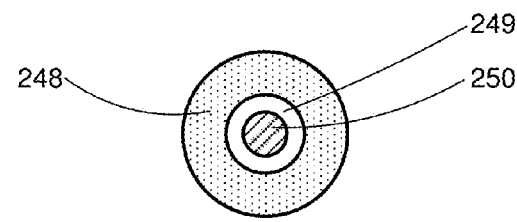
FIG. 10R  FIG. 10T

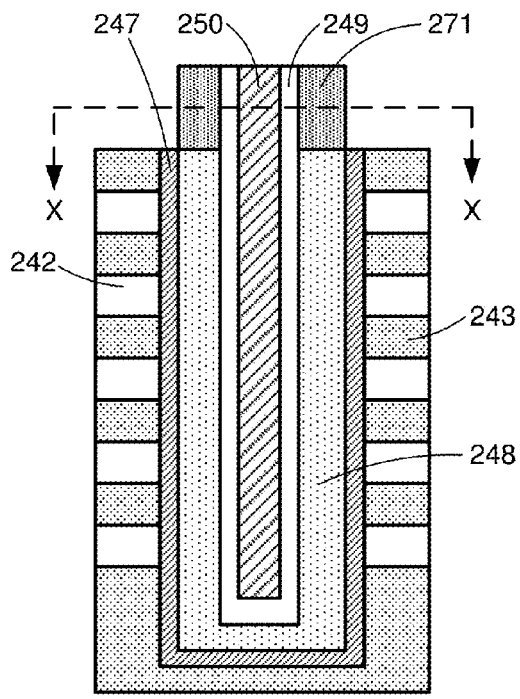
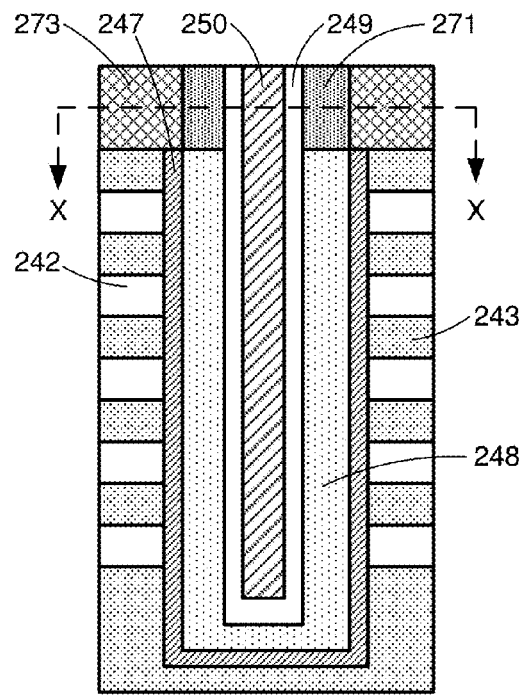
FIG. 10U          FIG. 10W
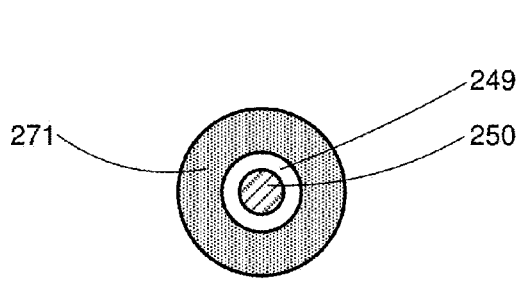
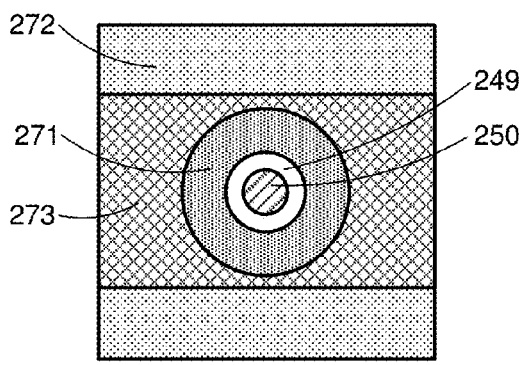
FIG. 10V          FIG. 10X

INTRINSIC VERTICAL BIT LINE ARCHITECTURE

CLAIM OF PRIORITY

The present application claims priority to U.S. Provisional Application No. 62/000,967, entitled "Intrinsic Vertical Bit Line Architecture," filed May 20, 2014, and claims priority to U.S. Provisional Application No. 62/041,138, entitled "Intrinsic Vertical Bit Line Architecture," filed Aug. 24, 2014, both of which are herein incorporated by reference in their entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations and increased leakage currents through unselected memory cells.

BRIEF DESCRIPTION OF THE DRAWINGS

FIGS. 8D-8G depict various embodiments of a portion of a memory array during a memory operation.

FIGS. 8K-8Q depict various embodiments of adjustable resistance bit line structures during a RESET operation.

DETAILED DESCRIPTION

Figure 1A:
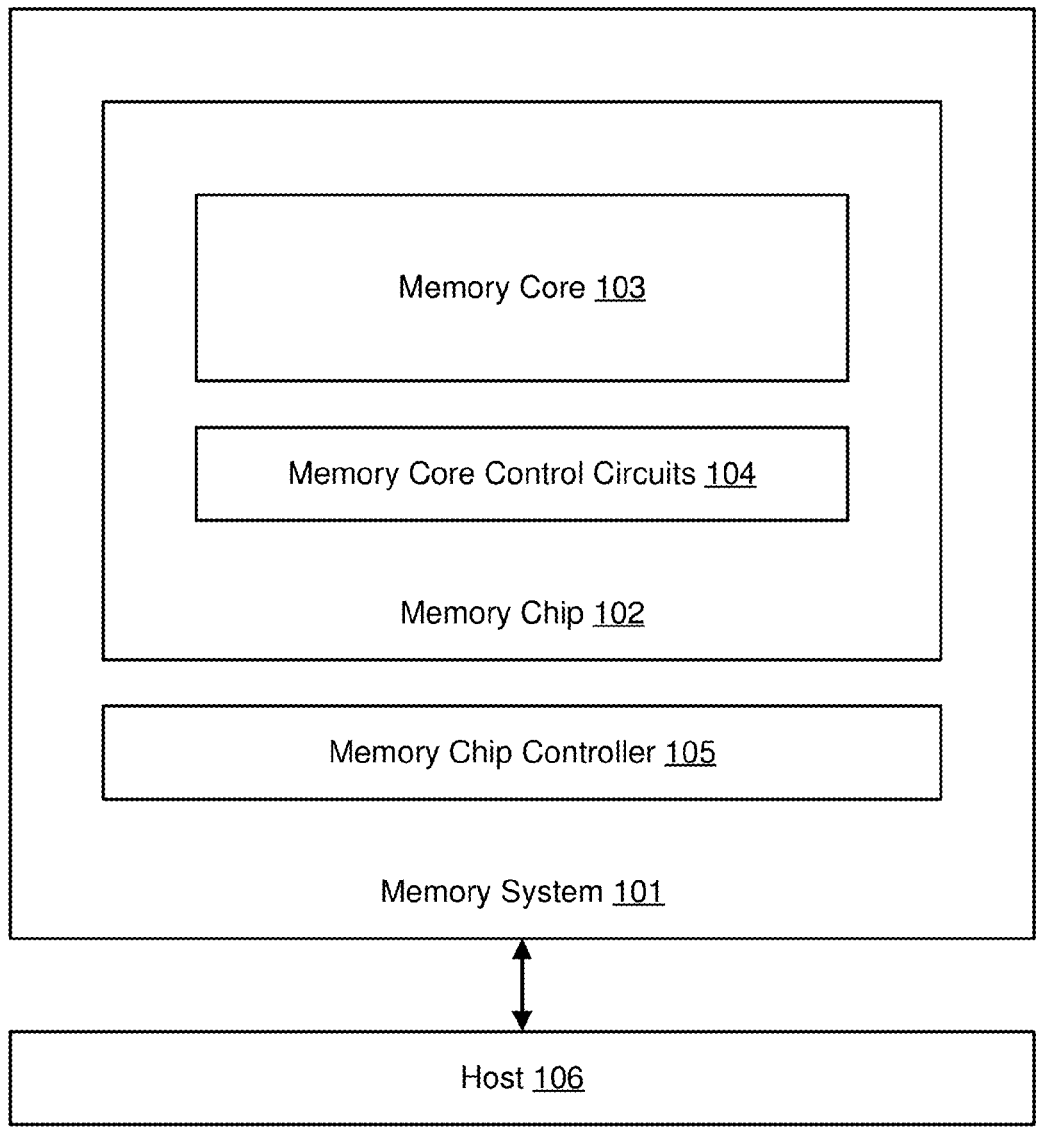
FIGS. 1A-1H depict various embodiments of a memory system.

Technology is described for reducing leakage currents through unselected memory cells (e.g., H-cells and/or U-cells) of a memory array during a memory operation (e.g., a read operation, a programming operation, an erase operation, a program verify operation, or an erase verify operation). In some embodiments, leakage currents through unselected memory cells of the memory array may be reduced by setting an adjustable resistance bit line structure connected to the unselected memory cells into a high resistance state or a non-conducting state. The adjustable resistance bit line structure may comprise a bit line structure in which the resistance of an intrinsic (or near intrinsic) polysilicon portion of the bit line structure may be adjusted via an application of a voltage to a select gate (SG) portion of the bit line structure that is isolated or separated from the intrinsic polysilicon portion (e.g., an oxide layer or a gate dielectric layer may be arranged between the intrinsic polysilicon portion and the select gate portion of the bit line structure). In this case, the intrinsic polysilicon portion may be set into a conducting state or a non-conducting state based on the voltage applied to the select gate portion of the bit line structure. The adjustable resistance bit line structure may comprise a vertical bit line structure (e.g., a bit line structure that is arranged in a direction that is substantially orthogonal to a substrate) or a horizontal bit line structure (e.g., a bit line structure that is arranged in a direction that is substantially parallel to a substrate).

In one embodiment, a memory array may include a first bit line structure and a second bit line structure. The first bit line structure may be connected to a first set of memory cells that includes a selected memory cell and the second bit line structure may be connected to a set of unselected memory cells. In some cases, the first bit line structure and the second bit line structure may be connected to a global bit line. During a memory operation, the first bit line structure may be set into a first resistance state and the second bit line structure may be set into a second resistance state that is greater than the first resistance state. During the memory operation, the first bit line structure may be set into a conducting state and the second bit line structure may be set into a non-conducting state. In one example, the first set of memory cells may comprise ReRAM memory cells and the memory operation may comprise a programming operation or a read operation. In another example, the first set of memory cells may comprise conductive bridge memory cells or programmable metallization memory cells. In some cases, the first bit line structure may include a first semiconducting body region and a first select gate region that is separated from the first semiconducting body region by a first gate dielectric. The first bit line structure may be set into a conducting state by applying a first voltage to the first select gate region. The second bit line structure may include a second semiconducting body region and a second select gate region that is separated from the second semiconducting body region by a second gate dielectric. The second bit line structure may be set into a non-conducting state by applying a second voltage different from the first voltage to the second select gate region.

In some embodiments, a bit line structure may include a distributed FET structure. The distributed FET structure may comprise a distributed NMOS FET structure or a distributed PMOS FET structure. In some cases, the distributed FET structure may not include defined drain junctions. With the distributed NMOS FET structure, the semiconducting body region of the bit line structure may comprise undoped polycrystalline silicon (or polysilicon), undoped silicon germanium, or undoped indium gallium arsenide. In one embodiment, the carrier concentration of the polycrystalline silicon may be less than $10^{15}$ carriers/cm$^3$ at 25 C or may be about $10^{15}$ carriers/cm$^3$ at 25 C or at room temperature. In another embodiment, the carrier concentration of the polycrystalline silicon may be less than $10^{17}$ carriers/cm$^3$ at 25 C or may be about $10^{17}$ carriers/cm$^3$ at 25 C or at room temperature. In these cases, a voltage may be applied to the select gate region of the bit line structure to increase the carrier concentration in the semiconducting body region and to set the distributed NMOS FET structure into a conducting state. With the distributed PMOS FET structure, the semiconducting body region of the bit line structure may comprise heavily doped polycrystalline silicon (e.g., creating a pinch-off FET or causing the bit line structure to include a pinch-off FET). The carrier concentration of the heavily doped polycrystalline silicon may be greater than $10^{20}$ carriers/cm$^3$ at 25 C or may be about $10^{20}$ carriers/cm$^3$ at 25 C or at room temperature. In this case, a voltage may be applied to the select gate region of the bit line structure to reduce the carrier concentration in the semiconducting body region and to set the distributed PMOS FET structure into a non-conducting state. Thus, a bit line structure may include an intrinsic or undoped semiconducting body region whose resistance may be reduced through the application of a voltage to the select gate region or a bit line structure may include a heavily doped semiconducting body region whose resistance may be increased through the application of a voltage to the select gate region.

One issue with having a bit line with high resistance is that sensing margins may be reduced due to the variability in voltage drops along the high resistance bit line during sensing operations. Moreover, a high resistance bit line may cause an increase in the programming voltages required to program a memory cell during programming operations. Thus, using bit lines with high resistance is typically not advisable.

One benefit of using adjustable resistance bit lines or adjustable resistance bit line structures is that leakage currents through unselected memory cells (e.g., H-cells and/or U-cells) may be significantly reduced. The reduction in leakage currents may allow for improved memory array efficiency and for larger memory array sizes. Furthermore, the reduction in leakage currents during memory operations may lead to reduced power consumption, reduced energy consumption, improved memory reliability, and/or reduced voltages required to bias a memory array during the memory operations.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
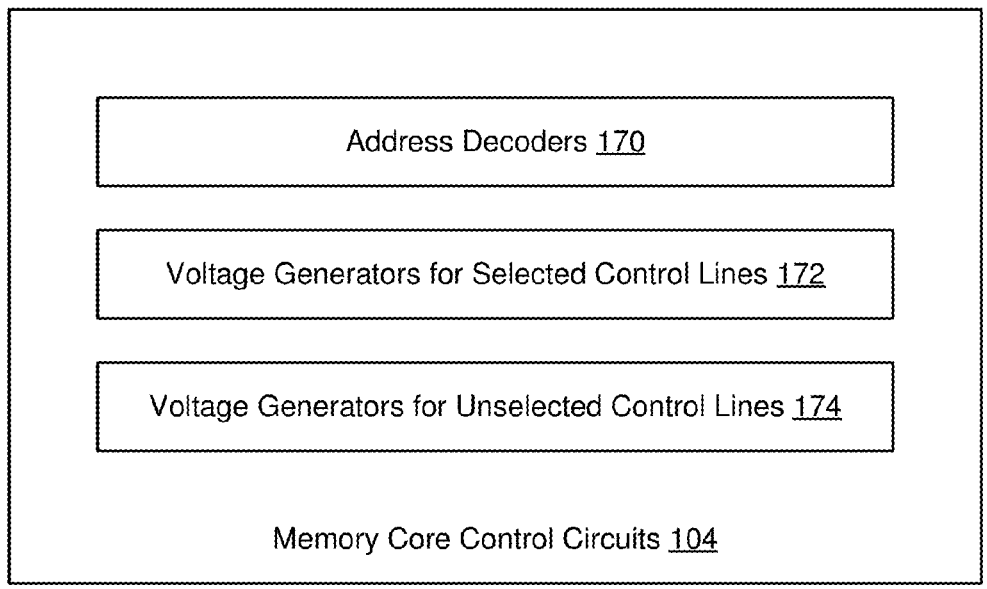

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
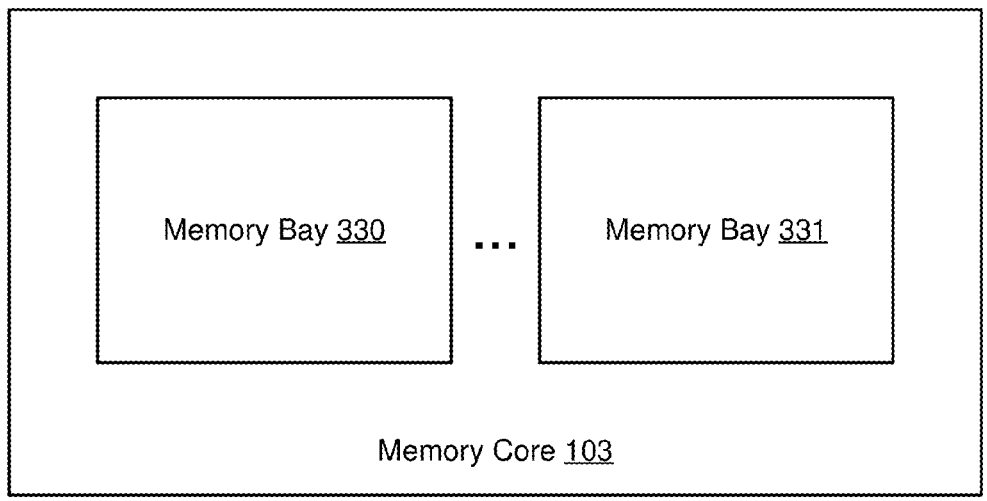

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
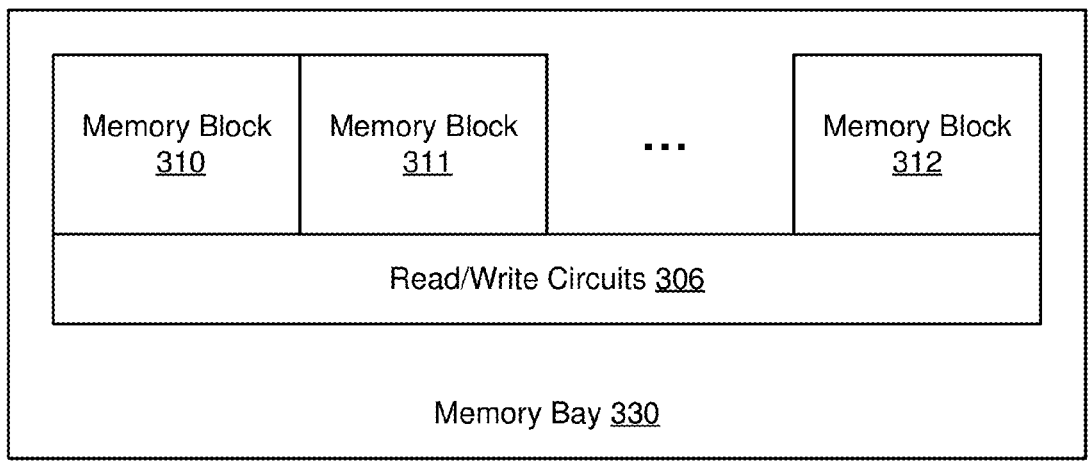

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be set to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
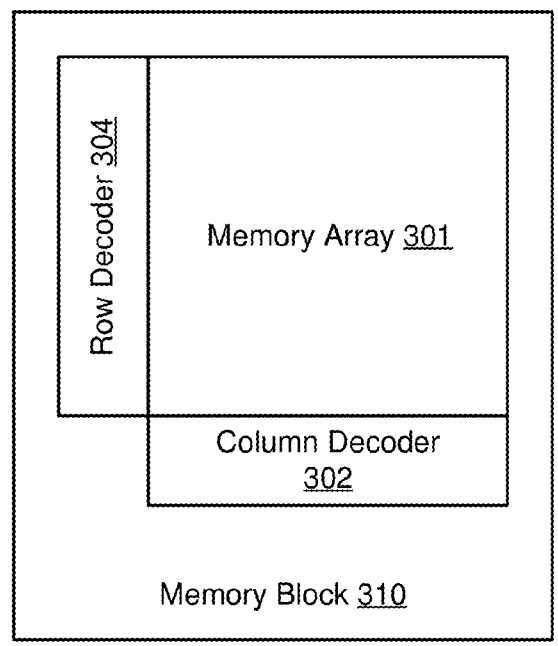

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
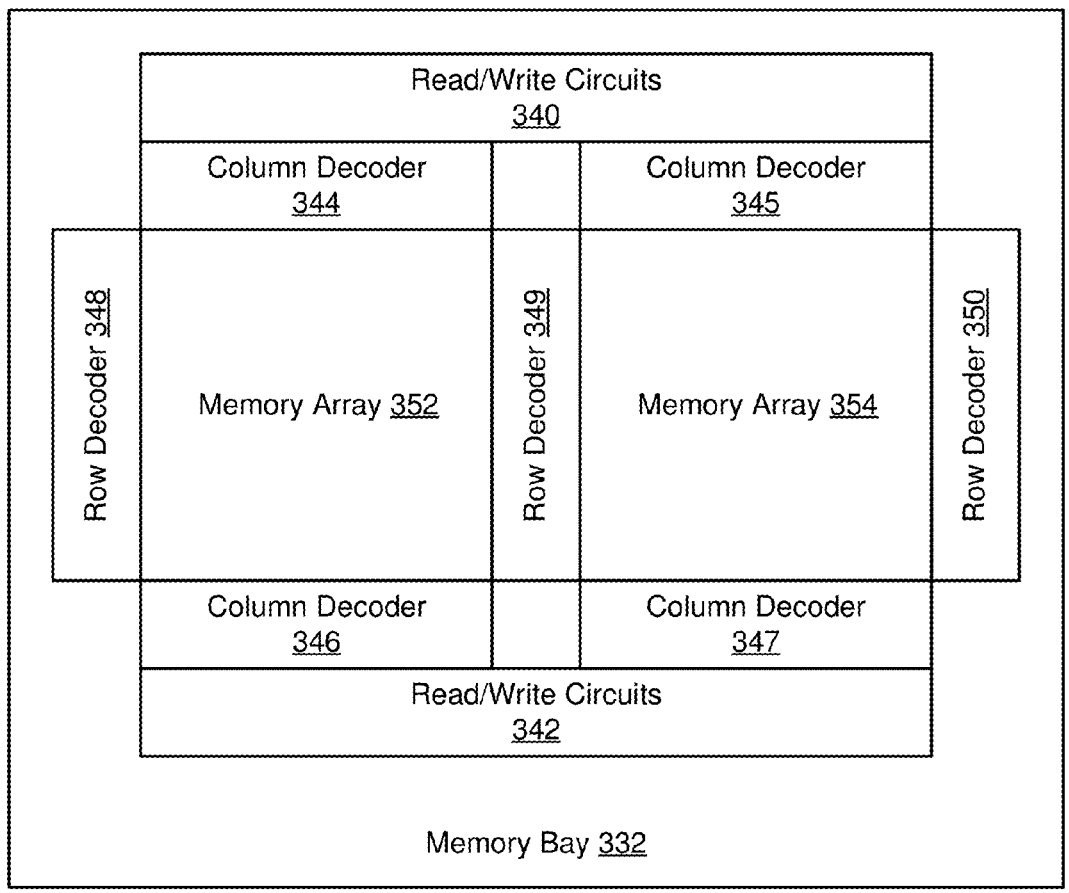

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 1G:
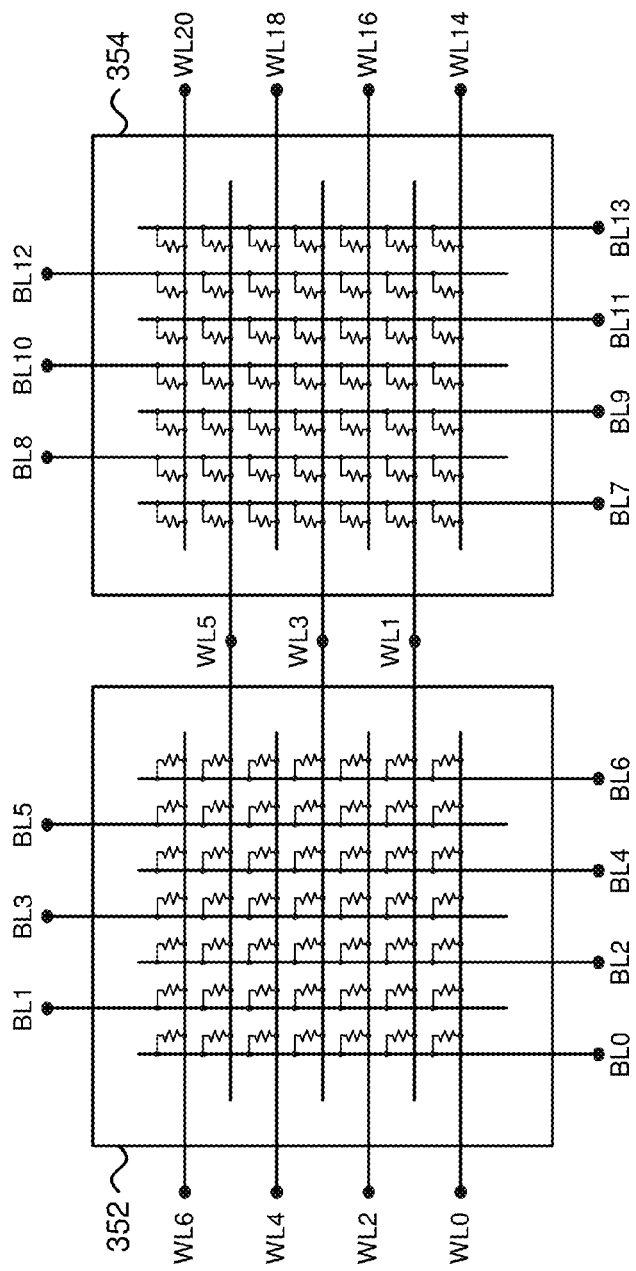

FIG. 1G depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 1H:
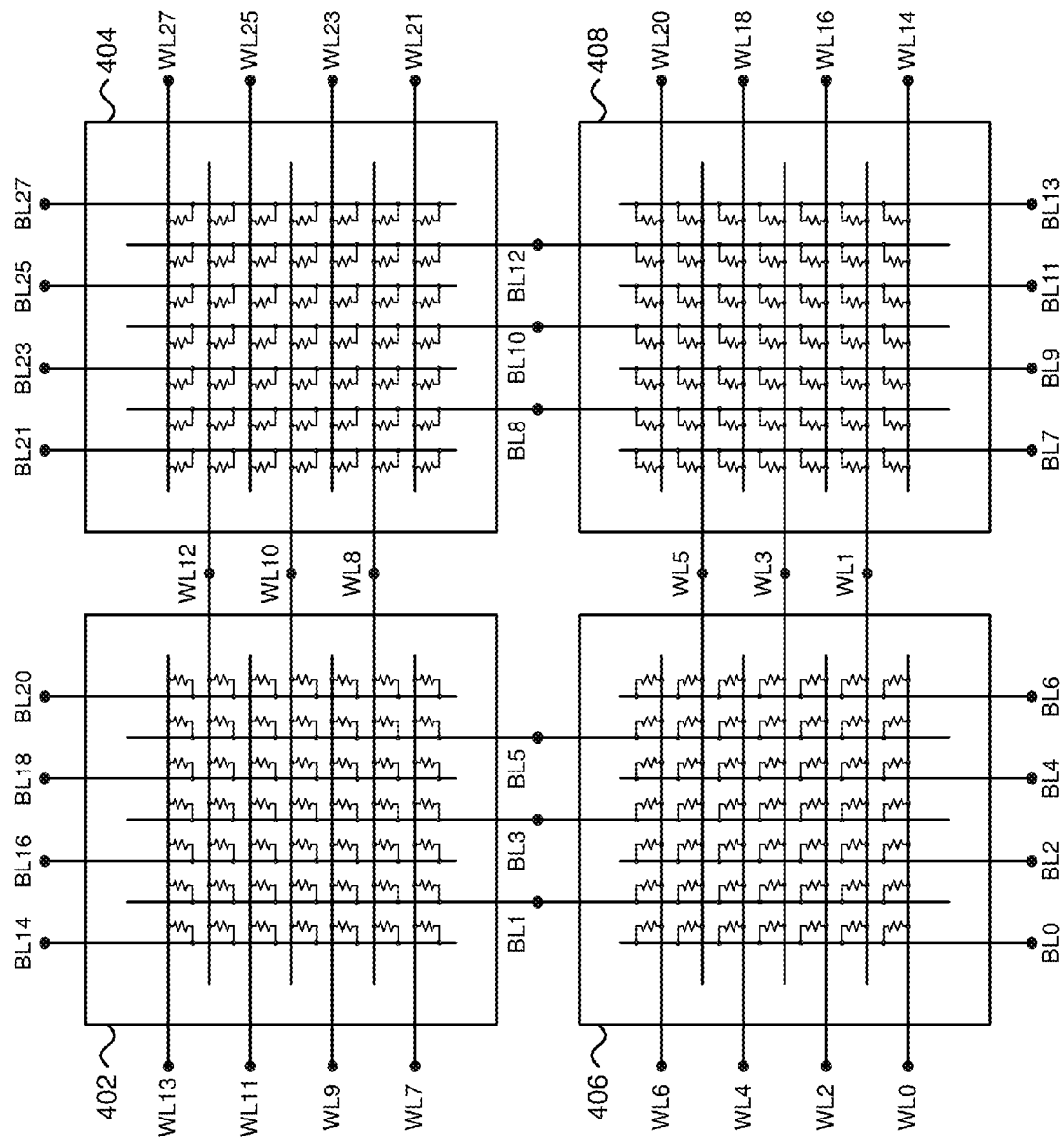

FIG. 1H depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 2A:
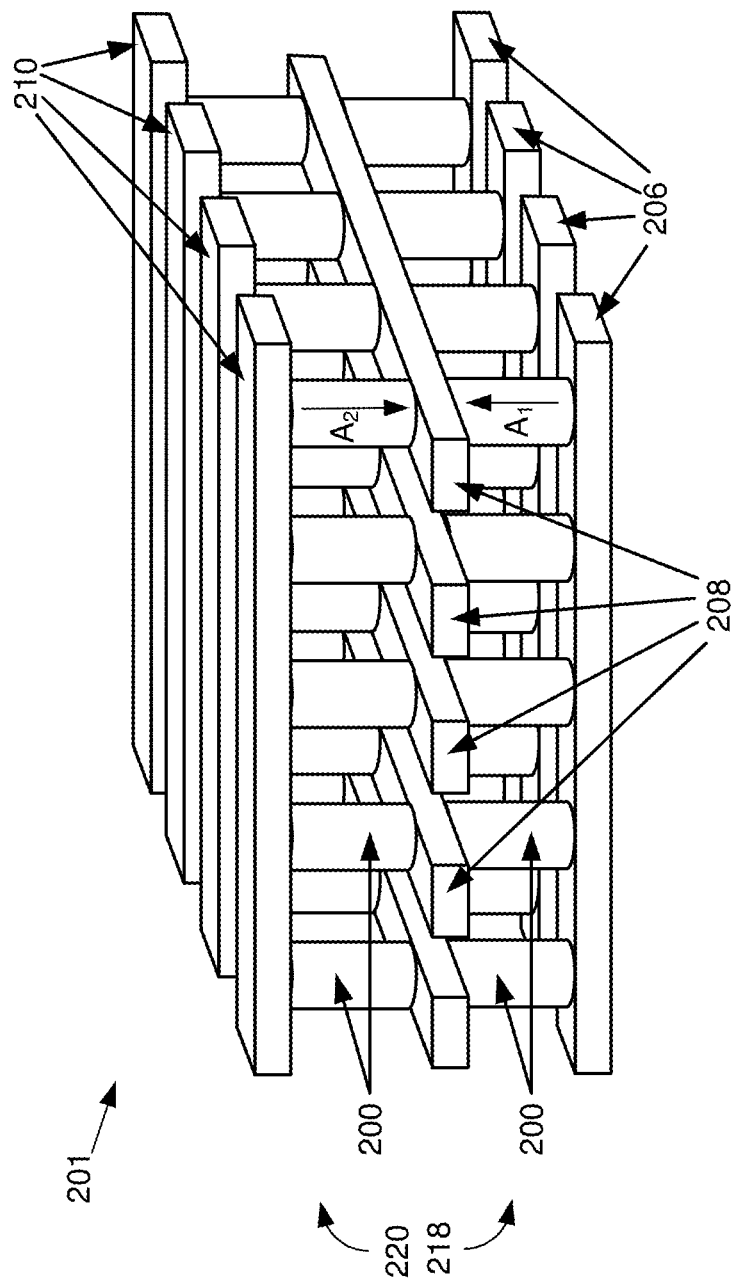
FIGS. 2A-2B depict various embodiments of a portion of a three-dimensional memory array.

FIG. 2A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 2A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 2A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
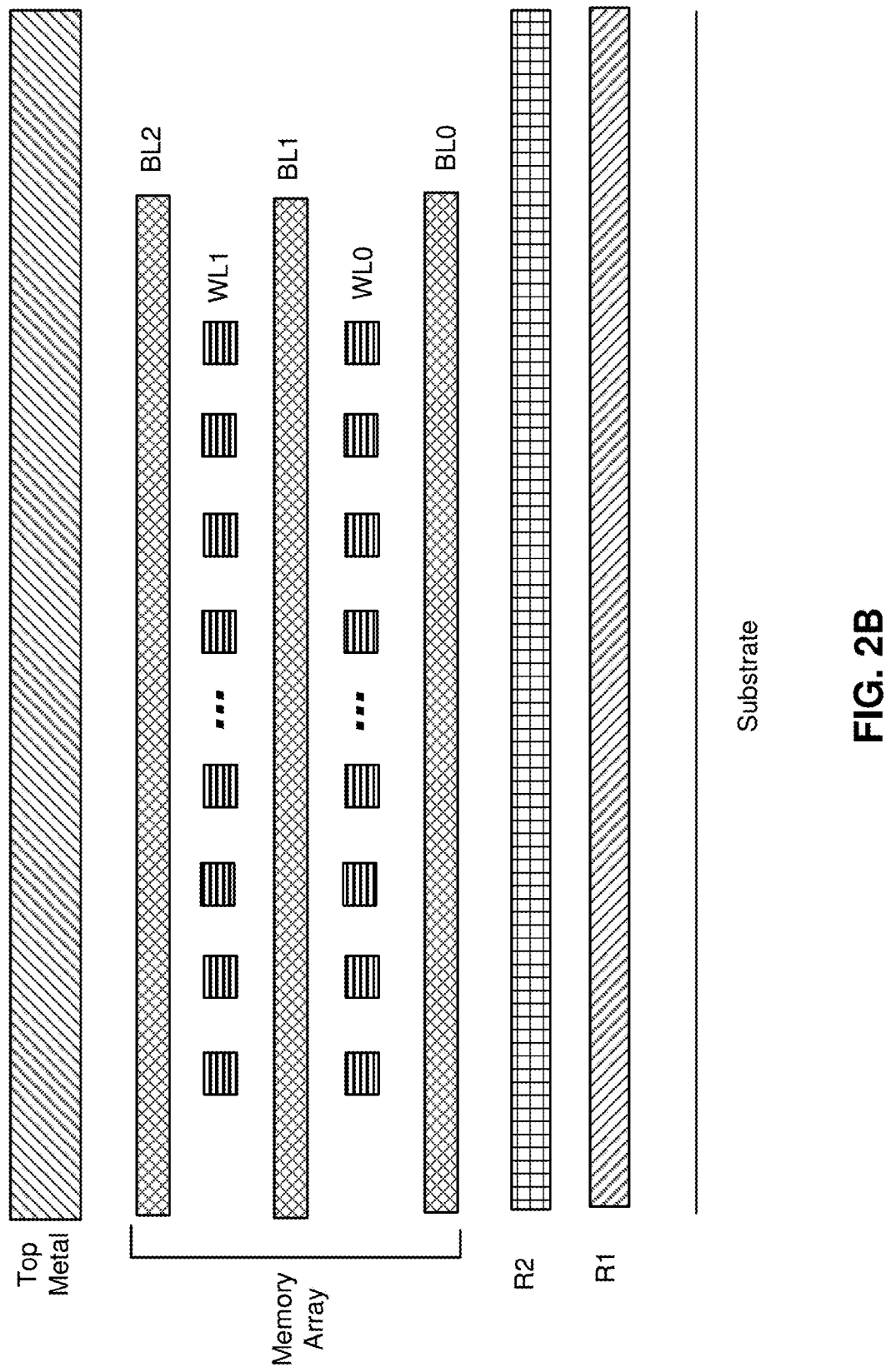

FIG. 2B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
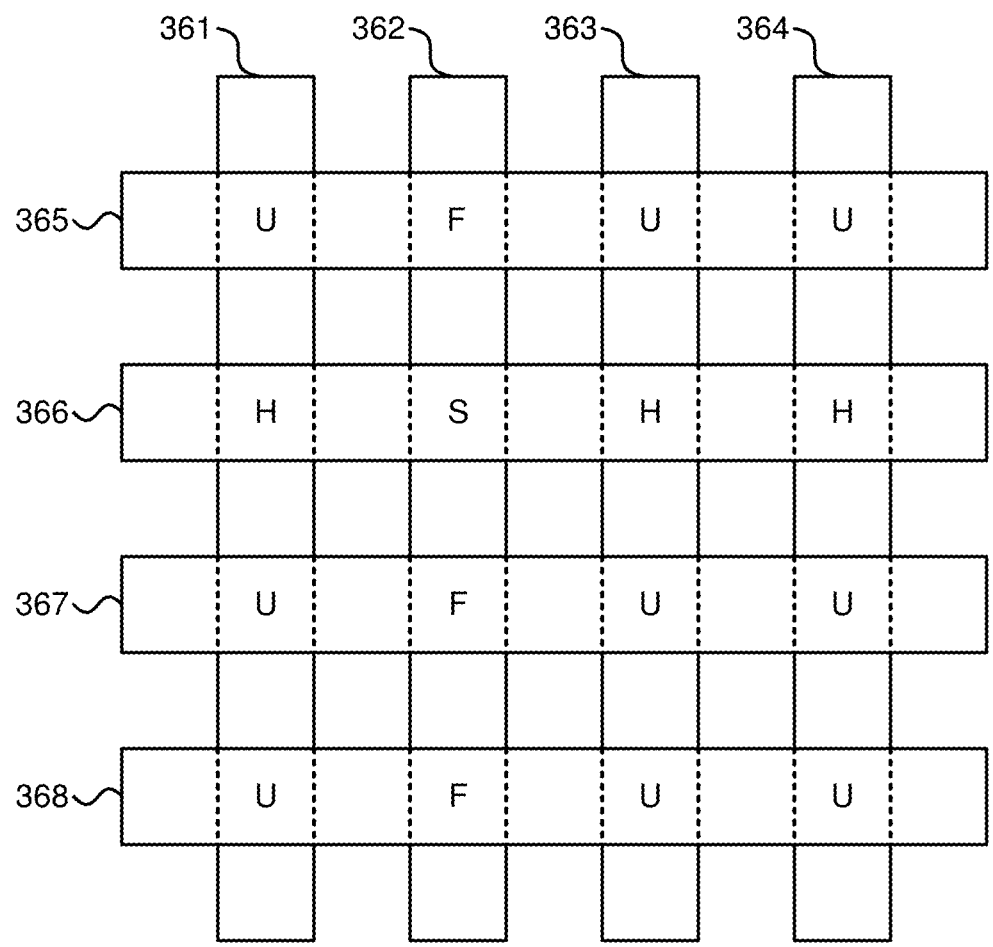
FIGS. 3A-3B depict embodiments of a cross-point memory array.

FIG. 3A depicts one embodiment of a cross-point memory array 360. In one example, the cross-point memory array 360 may correspond with memory array 201 in FIG. 2A. As depicted, cross-point memory array 360 includes word lines 365-368 and bit lines 361-364. The bit lines 361 may comprise vertical bit lines or horizontal bit lines. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3B:
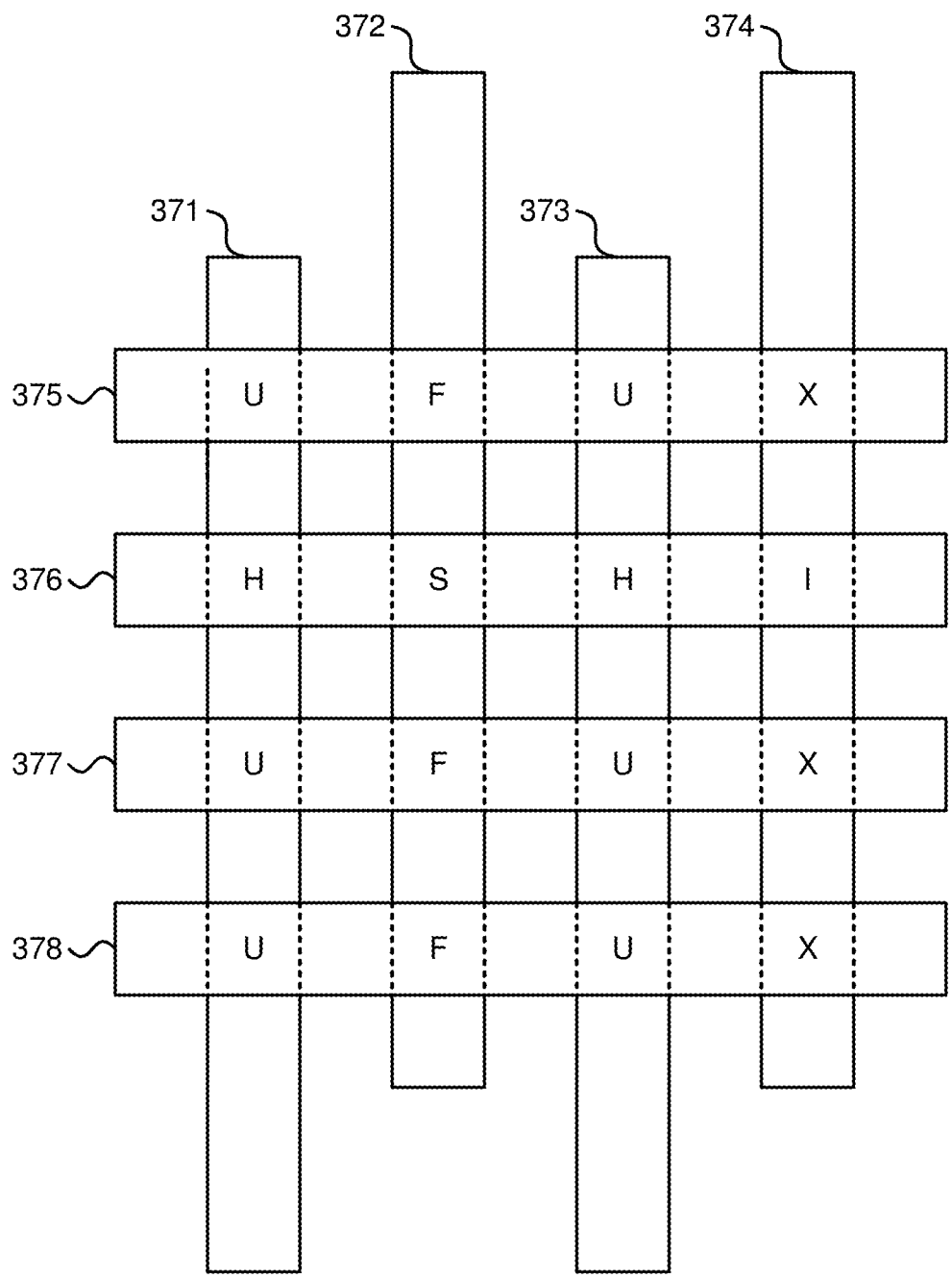

FIG. 3B depicts an alternative embodiment of a cross-point memory array 370. In one example, the cross-point memory array 370 may correspond with memory array 201 in FIG. 2A. As depicted, cross-point memory array 370 includes word lines 375-378 and bit lines 371-374. The bit lines 361 may comprise vertical bit lines or horizontal bit lines. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines.

Figure 4A:
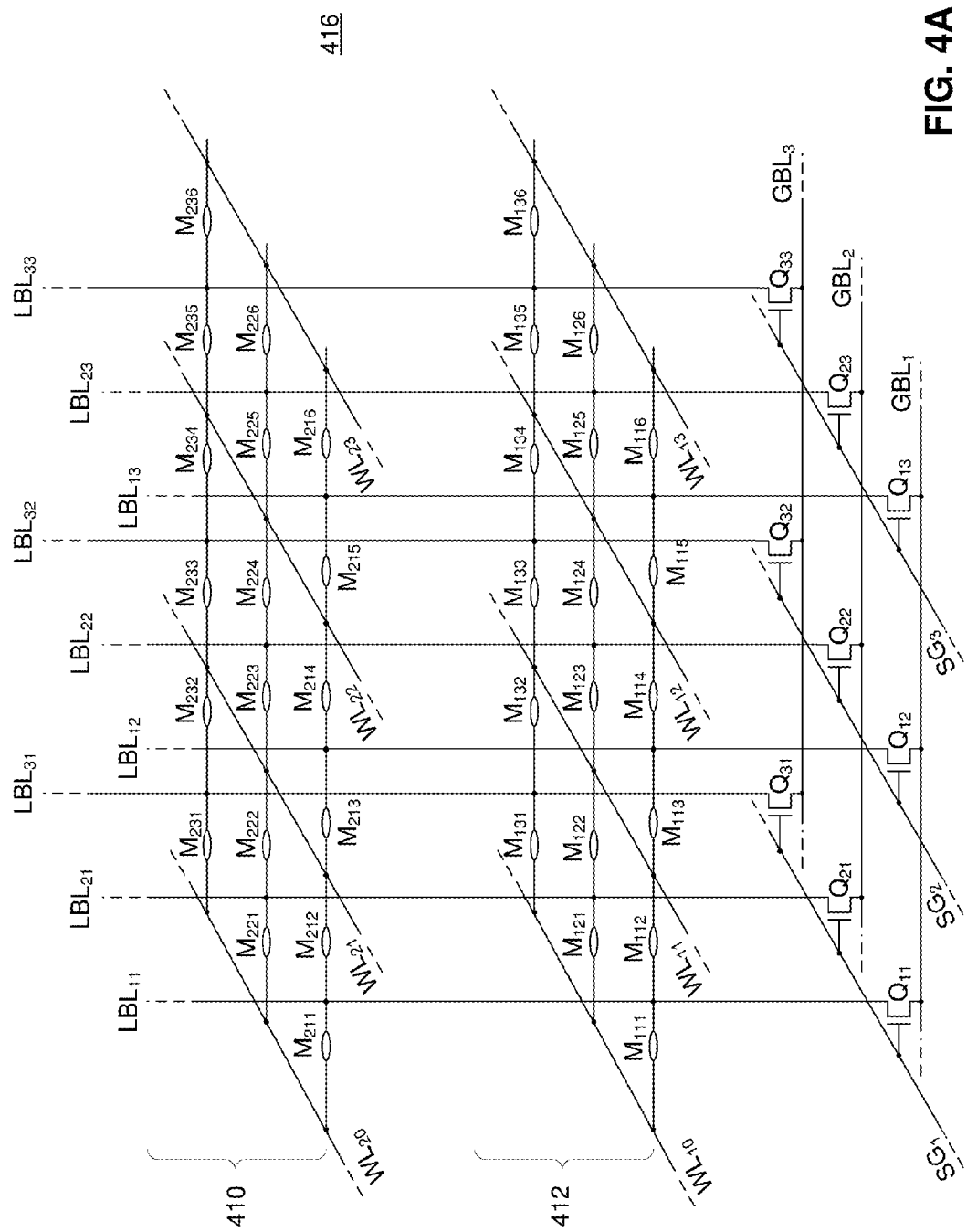
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
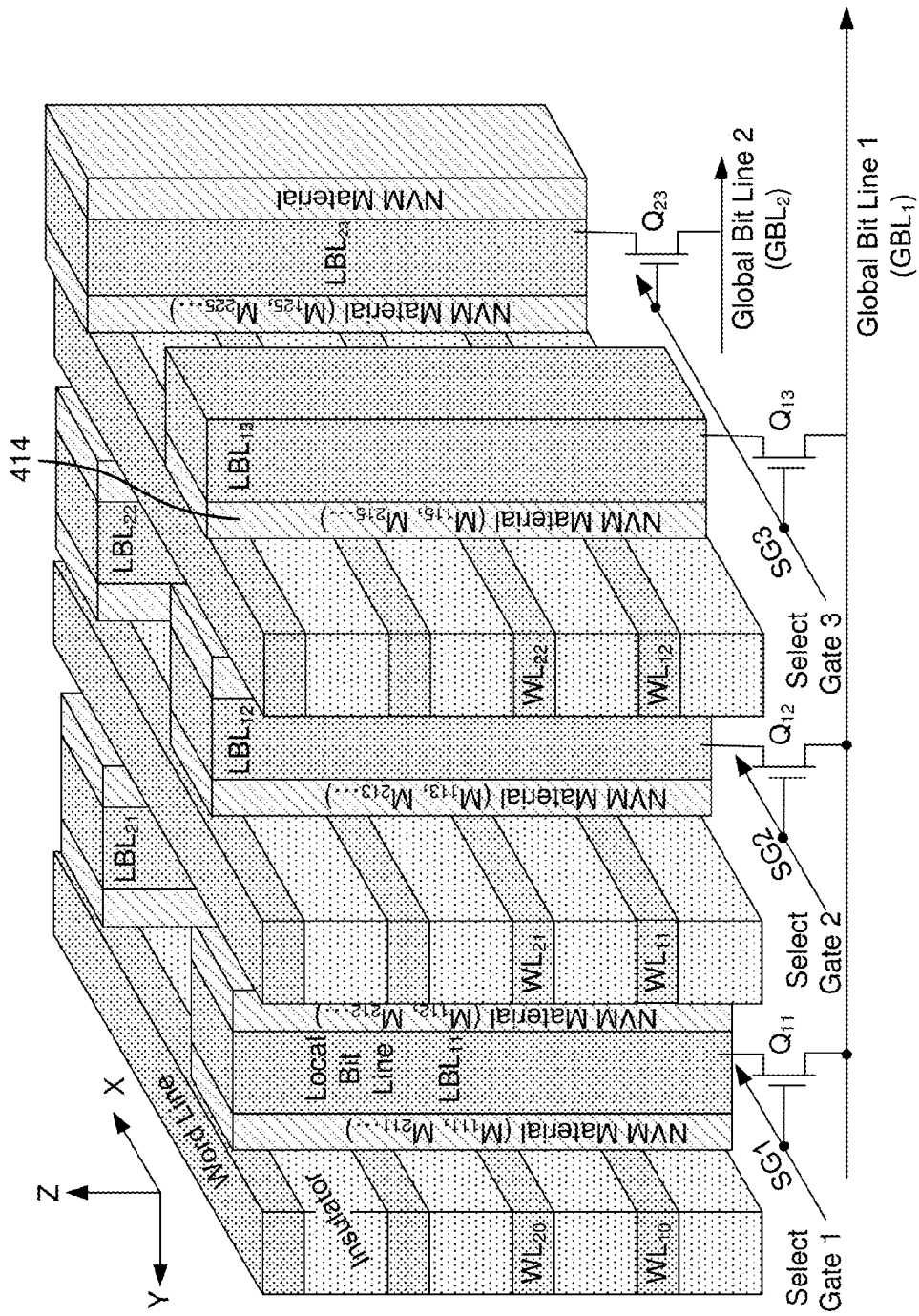

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
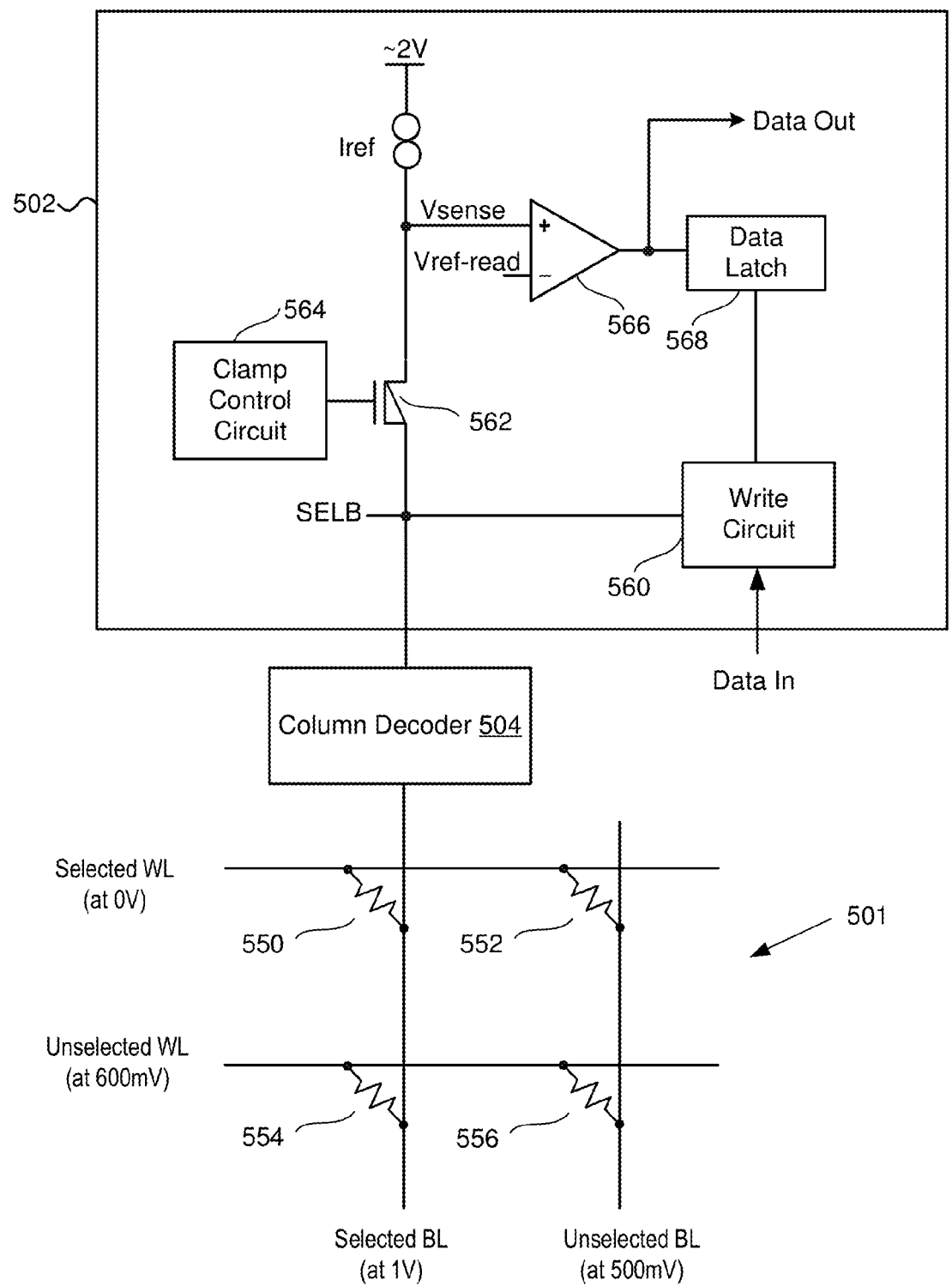
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figures 6A, 6B:
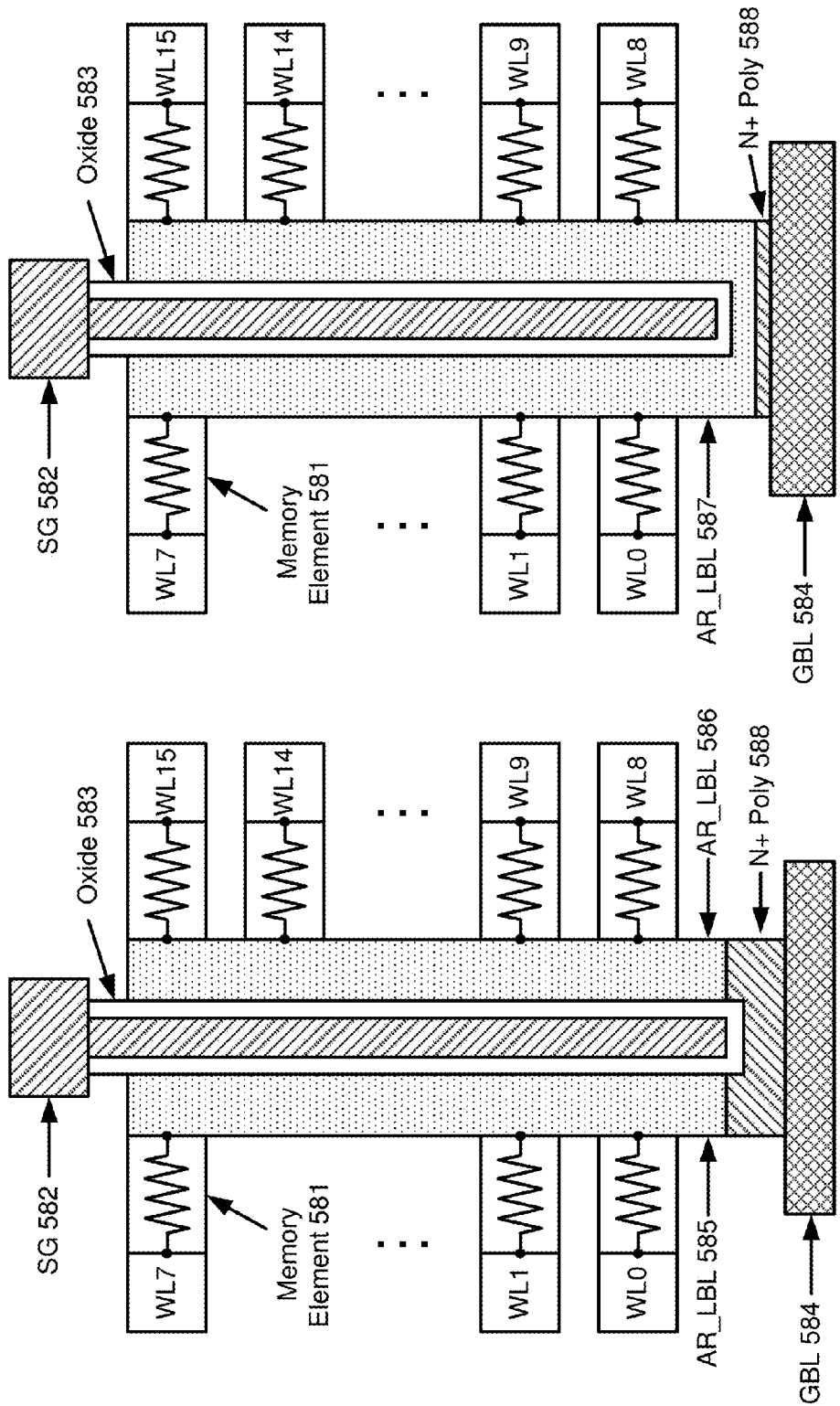
FIGS. 6A-6W depict various embodiments of adjustable resistance bit line structures within a memory array.

FIG. 6A depicts one embodiment of an adjustable resistance bit line structure. As depicted, the adjustable resistance bit line structure may comprise a vertical bit line structure that includes an adjustable resistance local bit line AR_LBL 585 that is arranged in a direction that is substantially orthogonal to a substrate (e.g., the adjustable resistance local bit line AR_LBL 585 may comprise part of a vertical pillar that is orthogonal to a silicon substrate). The adjustable resistance local bit line AR_LBL 585 may comprise intrinsic (or near intrinsic) polysilicon. The adjustable resistance bit line structure also includes a select gate SG 582 and an oxide layer Oxide 583 or other dielectric layer (e.g., a high-k dielectric layer) that is arranged between the adjustable resistance local bit line AR_LBL 585 and the select gate SG 582. The oxide layer Oxide 583 is also arranged between the adjustable resistance local bit line AR_LBL 586 and the select gate SG 582. Both the adjustable resistance local bit line AR_LBL 585 and the adjustable resistance local bit line AR_LBL 586 extend to the N+ polysilicon layer 588 that may be formed over or abut the global bit line GBL 584. In some cases, the select gate SG 582 and the oxide layer Oxide 583 may extend into the N+ polysilicon layer 588 such that the bottom of the select gate SG 582 is below the top of the N+ polysilicon layer 588. The select gate SG 582 may comprise titanium nitride (TiN) or polysilicon. The adjustable resistance local bit line AR_LBL 585 and the adjustable resistance local bit line AR_LBL 586 may comprise undoped polysilicon or lightly doped N− polysilicon. The Oxide layer 583 may comprise silicon dioxide. The global bit line GBL 584 may comprise TiN or tungsten.

In some cases, the adjustable resistance bit line structure may comprise a vertical pillar. The vertical pillar may comprise a rectangular pillar or a cylindrical pillar. The vertical pillar may be formed by etching through a stack of alternating word line layers and oxide layers (e.g., etching through layers of TiN or polysilicon that are separated by oxide layers) to form a rectangular, square, or cylindrical trench (or hole) and then depositing the layers for forming the vertical pillar within the trench. In one example, the vertical pillar may be formed by depositing a ReRAM layer, depositing an intrinsic polysilicon layer adjacent to the ReRAM layer, depositing an oxide layer adjacent to the intrinsic polysilicon layer, and depositing a polysilicon layer adjacent to the oxide layer to form the select gate that extends through at least a portion of the vertical pillar.

In some embodiments, a plurality of adjustable resistance bit line structures may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). After the plurality of memory holes have been created, the layers for forming vertical pillars within the plurality of memory holes may be deposited. In one example, the vertical pillars may be formed by depositing a ReRAM layer within the memory holes, depositing an intrinsic polysilicon layer on the ReRAM layer, depositing an oxide layer on the intrinsic polysilicon layer, and depositing a polysilicon layer on the oxide layer to form the select gates of the adjustable resistance bit line structures. The layers of the vertical pillars may be deposited using various deposition techniques such as chemical vapor deposition (CVD), physical vapor deposition (PVD), or atomic layer deposition (ALD).

In one embodiment, the resistance or the conductivity of the adjustable resistance local bit line AR_LBL 585 may be adjusted via an application of a voltage to the select gate SG 582. In one example, the adjustable resistance local bit line AR_LBL 585 may be set into either a conducting state or a non-conducting state based on the voltage applied to the select gate SG 582. When the adjustable resistance local bit line AR_LBL 585 is set into a conducting state, then a low resistance path (e.g., less than 100 ohm or less than 1 Kohm) or a conducting path may be formed between the memory elements connected to the word lines WL0-WL7 and the global bit line GBL 584. When the adjustable resistance local bit line AR_LBL 585 is set into a non-conducting state, then a high resistance path (e.g., more than 1 Gohm or more than 10 Gohm) is placed between the memory elements connected to the word lines WL0-WL7 and the global bit line GBL 584. In effect, the high resistance path may cause the memory elements corresponding with the word lines WL0-WL7 to be electrically disconnected from the global bit line GBL 584. Furthermore, each memory element of the memory elements corresponding with the word lines WL0-WL7 may be electrically disconnected from the other memory elements (e.g., memory element 581 connected to word line WL7 may be electrically disconnected from the other memory elements connected to word lines WL6-WL0). Therefore, in the case that the adjustable resistance local bit line AR_LBL 585 has been set into a non-conducting state and word line WL7 comprises a selected word line that has been set to a selected word line voltage, then the leakage currents (e.g., H-cell leakage currents) from word line WL7 to the other word lines WL6-WL0 via the memory elements connected to the adjustable resistance local bit line AR_LBL 585 may be significantly reduced or eliminated.

Referring to FIG. 6A, word lines WL0-WL7 are arranged on a first side of the vertical bit line structure and word lines WL8-WL15 are arranged on a second side of the vertical bit line structure. The word lines may comprise TiN, polysilicon, or tungsten (W). The word lines may be isolated from each other using an oxide layer not depicted that is arranged between the word line layers. A first set of memory elements including memory element 581 is arranged between the word lines WL0-WL7 and the adjustable resistance local bit line AR_LBL 585. A second set of memory elements is arranged between the word lines WL8-WL15 and the adjustable resistance local bit line AR_LBL 586. The memory element 581 may comprise a reversible resistance-switching element. As examples, the memory element 581 may include a ReRAM material, a metal oxide, nickel oxide, hafnium oxide, aluminum oxide, tantalum oxide, a phase change material, or a chalcogenide material.

In one embodiment, the word lines WL0-WL15 may extend into the page while the global bit line GBL 584 may extend horizontally from left to right. The word lines WL0-WL15 may comprise lines that extend in a first direction (e.g., the X direction) and the global bit line GBL 584 may comprise a line that extends in a second direction (e.g., the Y direction) that is orthogonal to the first direction. The vertical bit line structure may extend in a third direction (e.g., the Z direction) that is orthogonal to both the first direction and the second direction.

FIG. 6B depicts another embodiment of an adjustable resistance bit line structure. As depicted, the adjustable resistance bit line structure is similar to the adjustable resistance bit line structure depicted in FIG. 6A except that the Oxide layer 583 does not extend to and abut the N+ polysilicon layer 588. As depicted, the Oxide layer 583 does not share a common boundary with the N+ polysilicon layer 588.

In one embodiment, the resistance or the conductivity of the adjustable resistance local bit line AR_LBL 587 may be adjusted via an application of a voltage to the select gate SG 582. In one example, the adjustable resistance local bit line AR_LBL 587 may be set into a conducting state or a non-conducting state based on the voltage applied to the select gate SG 582. When the adjustable resistance local bit line AR_LBL 587 is set into a conducting state, then a low resistance path or a conducting path may be formed between the memory elements corresponding with the word lines WL0-WL15 and the global bit line GBL 584. When the adjustable resistance local bit line AR_LBL 587 is set into a non-conducting state, then a high resistance path is placed between the memory elements corresponding with the word lines WL0-WL15 and the global bit line GBL 584. In effect, the high resistance path may cause the memory elements corresponding with the word lines WL0-WL15 to be electrically disconnected from the global bit line GBL 584.

Figure 6C:
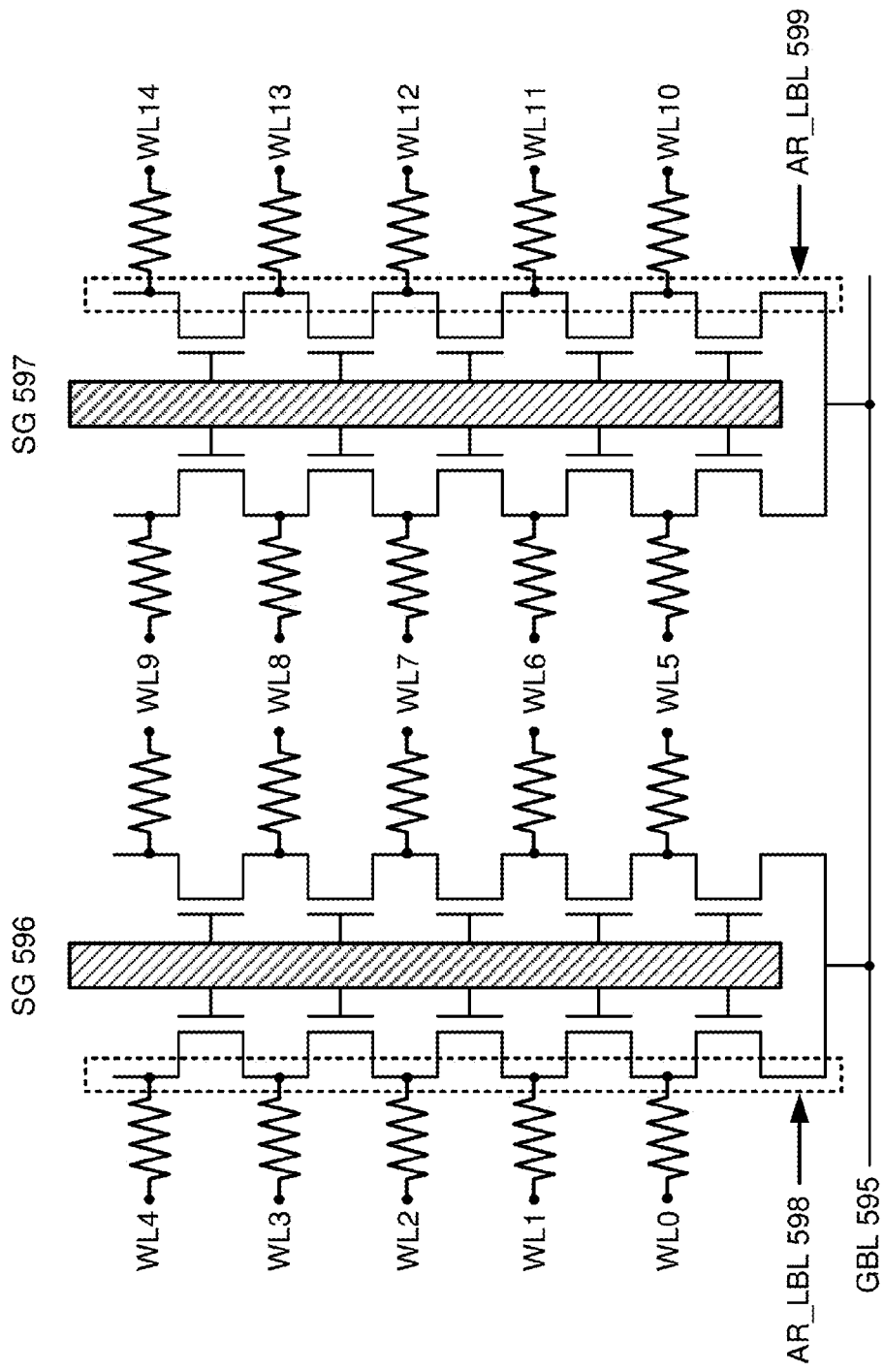

FIG. 6C depicts one embodiment of a first adjustable resistance bit line structure and a second adjustable resistance bit line structure. The first adjustable resistance bit line structure includes a select gate SG 596 and an adjustable resistance local bit line AR_LBL 598. The second adjustable resistance bit line structure includes a select gate SG 597 and an adjustable resistance local bit line AR_LBL 599. The adjustable resistance local bit line AR_LBL 598 and the adjustable resistance local bit line AR_LBL 599 are connected to the global bit line GBL 595 (e.g., via an N+ polysilicon layer).

In some embodiments, the first adjustable resistance bit line structure may comprise a first distributed FET structure and the second adjustable resistance bit line structure may comprise a second distributed FET structure. The first adjustable resistance bit line structure may be set into a conducting state by applying a first voltage to the select gate SG 596 and the second adjustable resistance bit line structure may be set into a non-conducting state by applying a second voltage different from the first voltage to the select gate SG 597. In the case that the first distributed FET structure comprises a distributed NMOS FET structure, then a positive voltage (e.g., 2V-7V) may be applied to the select gate SG 596. The positive voltage applied to the select gate SG 596 may depend on the type of memory operation being performed (e.g., a RESET operation, a SET operation, or a read operation). The positive voltage applied to the select gate SG 596 may be higher during a RESET operation compared with during a SET operation. The positive voltage applied to the select gate SG 596 may be higher during a SET operation compared with during a read operation. The second adjustable resistance bit line structure may be set into a non-conducting state by applying 0V or a negative voltage (e.g., −2V) to the select gate SG 597.

In one embodiment, the first adjustable resistance bit line structure may be connected to a first set of memory cells that includes memory elements that are connected to word lines WL0-WL4 and the second adjustable resistance bit line structure may be connected to a second set of memory cells that includes memory elements that are connected to word lines WL10-WL14. During a memory operation (e.g., a read operation, a programming operation, an erase operation, a program verify operation, or an erase verify operation), the first adjustable resistance bit line structure may be set into a conducting state such that a conducting path exists between the memory elements that are connected to word lines WL0-WL4 and the global bit line GBL 595 and the second adjustable resistance bit line structure may be set into a non-conducting state such that a conducting path does not exist between the memory elements that are connected to word lines WL10-WL14 and the global bit line GBL 595. In this case, the memory elements that are connected to word lines WL10-WL14 are electrically disconnected from the global bit line GBL 595.

Figure 6D:
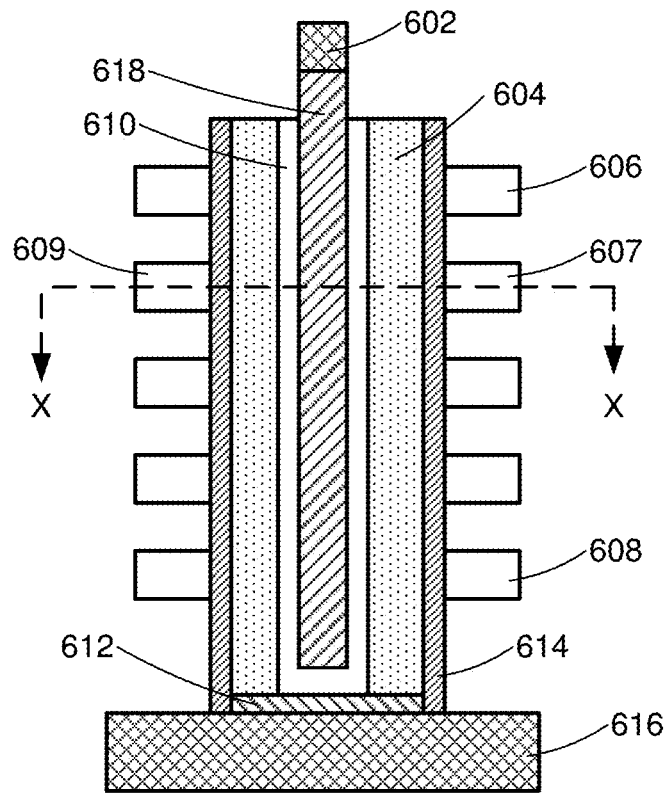

FIG. 6D depicts one embodiment of an adjustable resistance bit line structure using a cross-sectional view in the global bit line direction. The adjustable resistance bit line structure depicted in FIG. 6D is one example of an implementation of the adjustable resistance bit line structure depicted in FIG. 6A. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise intrinsic or undoped polysilicon. In some cases, the adjustable resistance local bit line 604 may comprise lightly doped N− polysilicon. In other cases, the adjustable resistance local bit line 604 may comprise undoped silicon germanium. The dielectric layer 610 may comprise an oxide layer. The select gate 618 may comprise TiN or polysilicon. An SG line 602 connects to the select gate 618. The SG line 602 may comprise TiN, polysilicon, or tungsten. In some cases, the SG line 602 may extend in the word line direction (e.g., into the page). In other cases, the SG line 602 may extend in the global bit line direction (e.g., horizontally from left to right on the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via an N+ polysilicon layer 612. The global bit line 616 may comprise TiN or tungsten. In one embodiment, FIG. 6D may depict a cross-sectional view taken along line Z-Z of FIG. 6E.

Figure 6E:
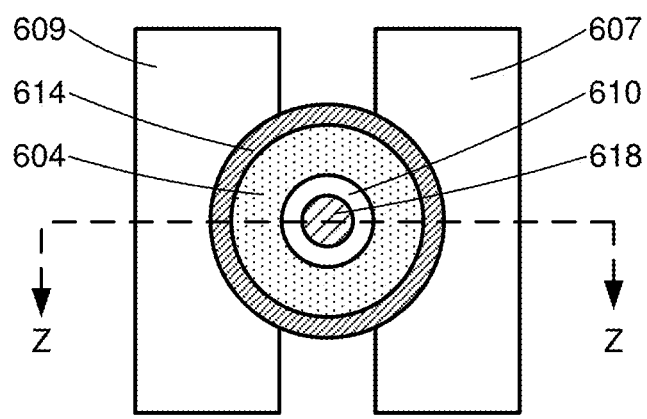

FIG. 6E depicts one embodiment of a cross-sectional view taken along line X-X of FIG. 6D. In one example, the cross-sectional view taken along line X-X of FIG. 6D may comprise a horizontal slice taken through a word line layer that includes word lines 607 and 609.

Figure 6F:
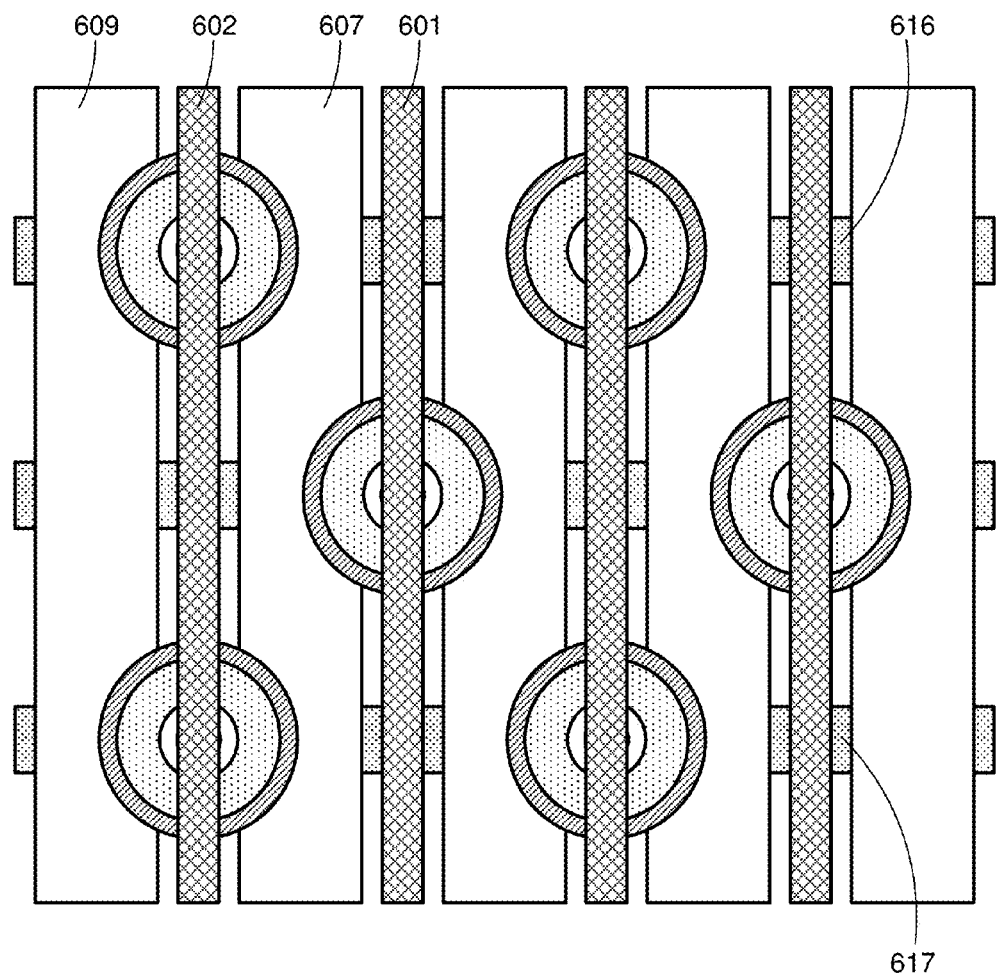

FIG. 6F depicts one embodiment of a top plan view of a portion of a memory array that includes adjustable resistance bit line structures. In some cases, the adjustable resistance bit line structures may be arranged in groups of hexagonally close-packed rows. As depicted, the word lines 607 and 609 are arranged in a first direction (e.g., extending from top to bottom of the page) and the global bit lines 616 and 617 are arranged in a second direction orthogonal to the first direction (e.g., extending from left to right on the page). The SG lines 602 and 601 are arranged in the first direction (i.e., in the word line direction). In one example, if word line 607 comprises a selected word line, then only SG line 602 may be selected, only SG line 601 may be selected, or both SG lines 602 and 601 may be selected at the same time. All other SG lines within the memory array may be deselected in order to set the adjustable resistance bit line structures not connected to the selected word line into a non-conducting state, thereby reducing leakage currents through unselected memory cells within the memory array.

In one embodiment, only one SG line within a memory array may be selected during a memory operation and the other SG lines that are not selected within the memory array may be deselected during the memory operation. In another embodiment, two or more SG lines within the memory array may be selected during a memory operation and the other SG lines that are not selected within the memory array may be deselected during the memory operation. Selecting more than one SG line at a time may relieve SG line driver pitch constraints; however, selecting a larger number of SG lines within a memory array at the same time may cause an increase in leakage currents during a memory operation.

Figure 6G:
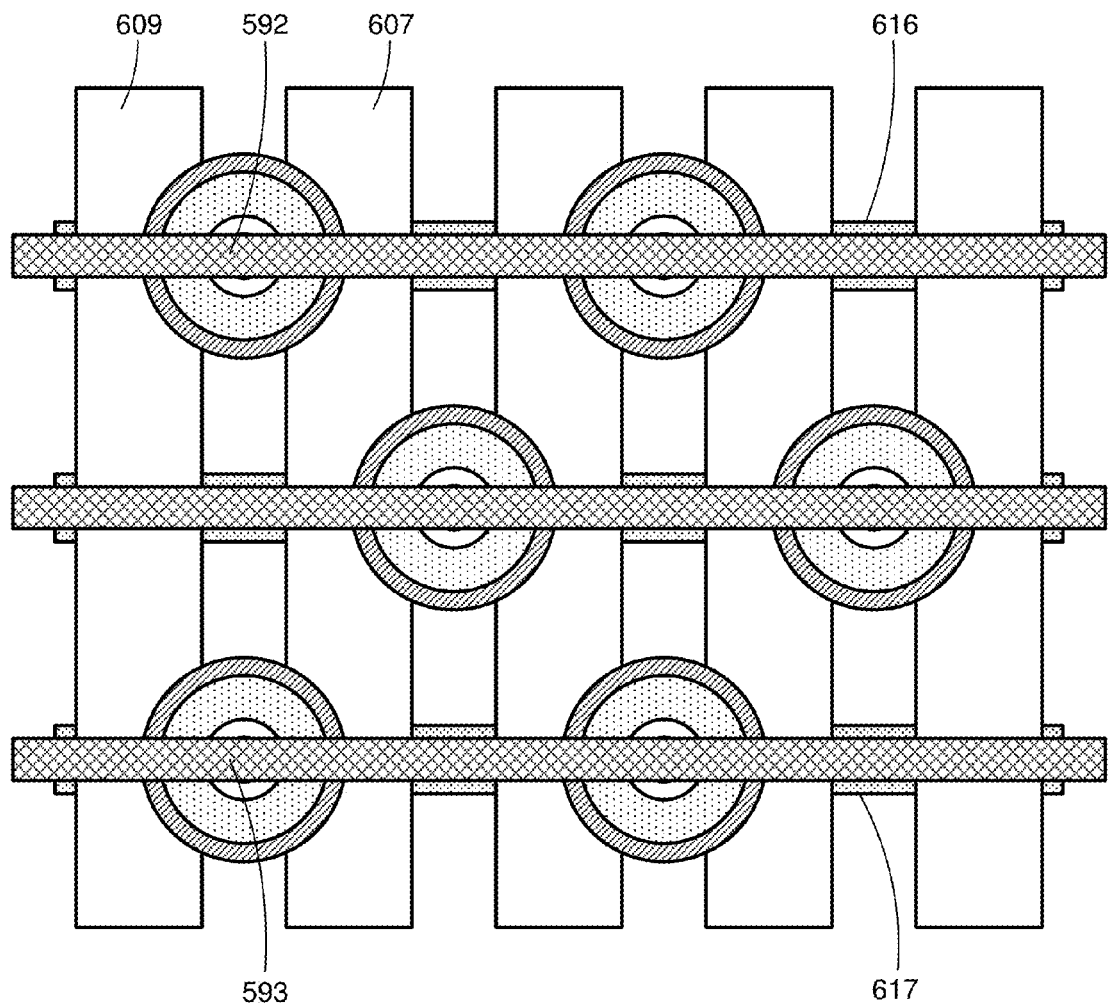

FIG. 6G depicts another embodiment of a top plan view of a portion of a memory array that includes adjustable resistance bit line structures. As depicted, the word lines 607 and 609 are arranged in a first direction (e.g., extending from top to bottom of the page) and the global bit lines 616 and 617 are arranged in a second direction orthogonal to the first direction (e.g., extending from left to right on the page). The SG lines 592 and 593 are arranged in the second direction (i.e., in the global bit line direction). In some cases, during a memory operation on the memory array (e.g., a programming operation), only a fraction of the global bit lines may be selected. In one example, during a programming operation, only 8 or 16 global bit lines out of 1024 global bit lines may be selected. In this case, only the SG lines corresponding with the selected global bit lines may be selected while all other SG lines within the memory array may be deselected. In some cases, H-cell leakage currents may be substantially reduced or eliminated by setting adjustable resistance bit line structures connected to selected word lines and unselected global bit lines into non-conducting states.

In some embodiments, the SG lines within a memory array may be arranged such that they extend in the word line direction, in the global bit line direction, or at an angle relative to the word line direction (e.g., diagonal SG lines that are at a 45 degree angle from the word line direction or at a 25 degree angle from the word line direction).

Figure 6H:
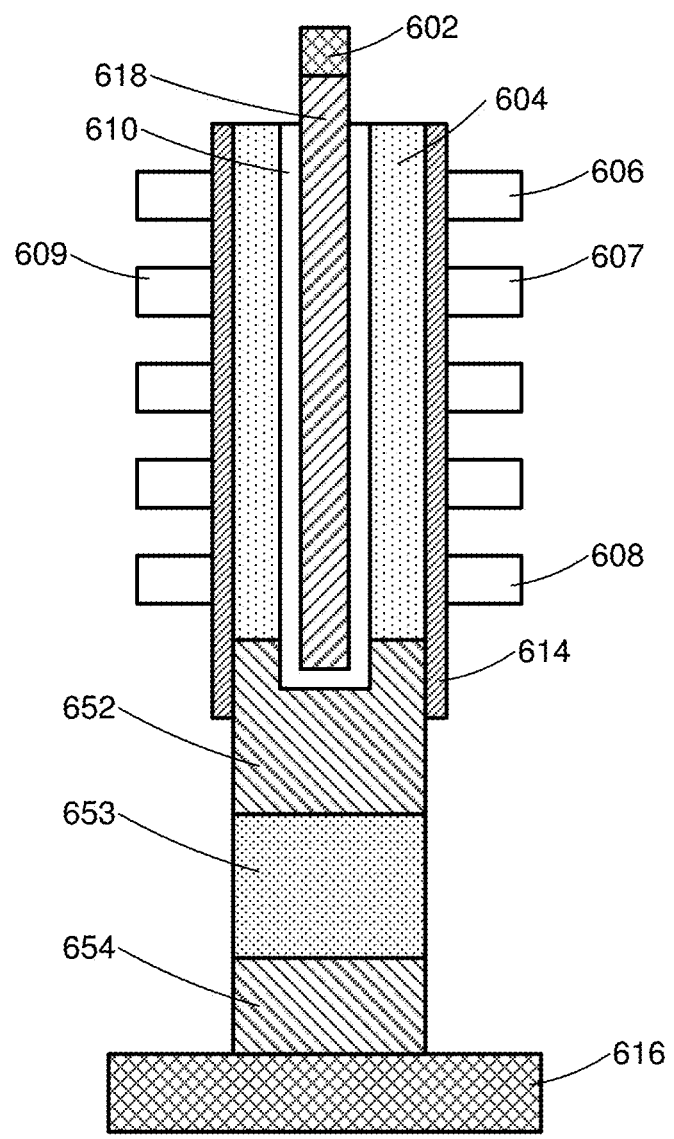

FIG. 6H depicts one embodiment of an adjustable resistance bit line structure with an integrated bottom resistor. The integrated bottom resistor may improve memory cell reliability, reduce the etch depth for the memory hole in which the adjustable resistance bit line structure may be formed, and reduce the aspect ratio for the memory hole. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise intrinsic or undoped polysilicon. In some cases, the adjustable resistance local bit line 604 may comprise lightly doped N− polysilicon. The dielectric layer 610 may comprise an oxide layer. The select gate 618 may comprise TiN or polysilicon. An SG line 602 connects to the select gate 618. The SG line 602 may comprise TiN, polysilicon, or tungsten. In some cases, the SG line 602 may extend in the word line direction (e.g., into the page). In other cases, the SG line 602 may extend in the global bit line direction (e.g., horizontally from left to right on the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via an integrated bottom resistor comprising an N+ polysilicon layer 652, an N− polysilicon layer 653, and an N+ polysilicon layer 654. The N− polysilicon layer 653 may comprise lightly doped polysilicon (e.g., with a carrier concentration of about 10^18 carriers/cm^3 at 25 C or room temperature). The global bit line 616 may comprise TiN or tungsten. In one embodiment, the spacing between word lines (e.g., the spacing between word lines 606 and 607) may comprise 20 nm and the spacing between the top of the global bit line 616 and the top of the N+ polysilicon layer 652 may comprise 150 nm or 200 nm. One benefit of using the adjustable resistance bit line structure depicted in FIG. 6H is that the etch depth for etching memory holes may be reduced. Another benefit of using the adjustable resistance bit line structure depicted in FIG. 6H is that memory cell reliability may be improved as the integrated resistor may reduce voltage stress across memory cells connected to the adjustable resistance local bit line.

Figure 6I:
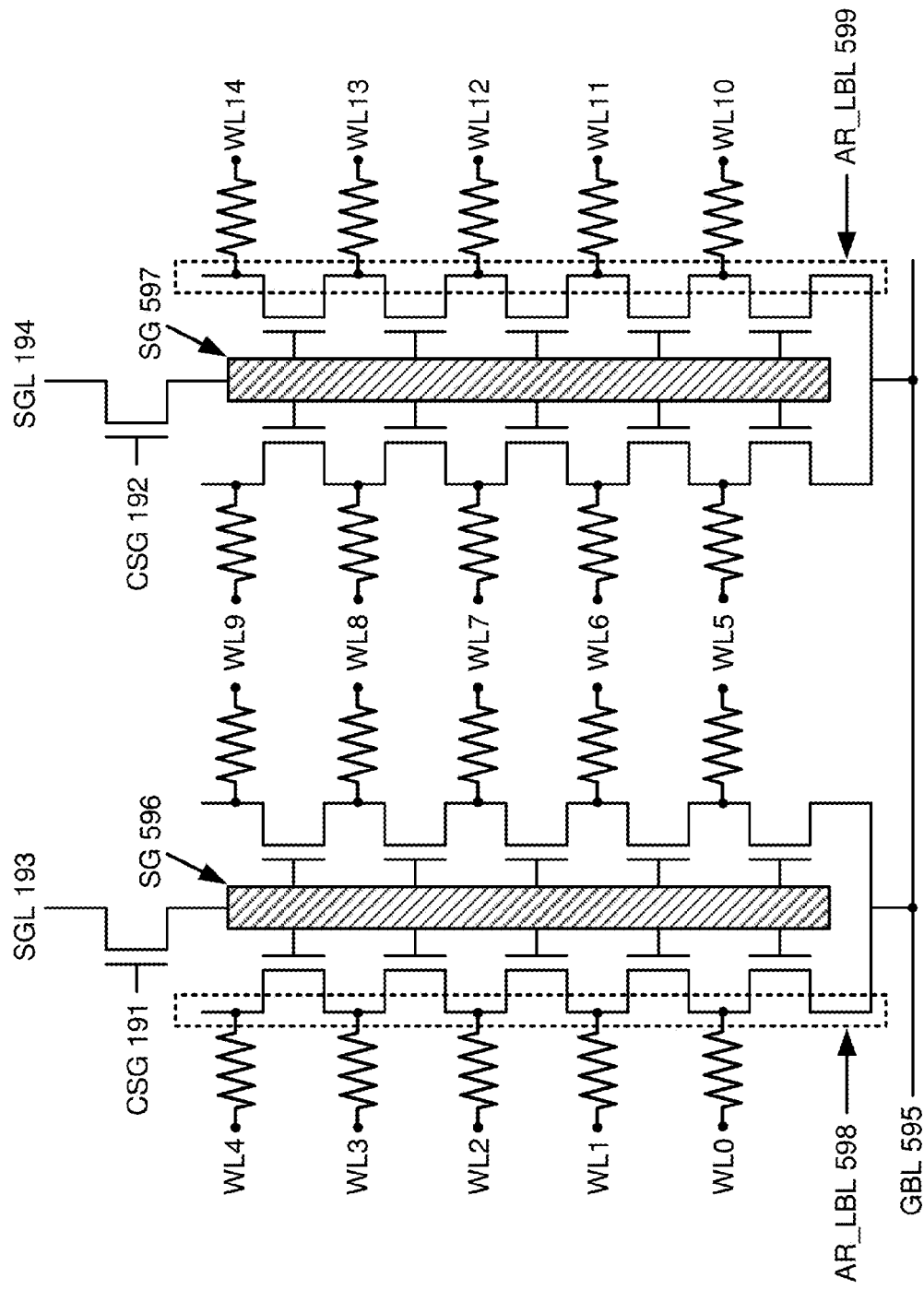

FIG. 6I depicts an alternative embodiment of a first adjustable resistance bit line structure and a second adjustable resistance bit line structure. The first adjustable resistance bit line structure includes a select gate SG 596 and an adjustable resistance local bit line AR_LBL 598. The second adjustable resistance bit line structure includes a select gate SG 597 and an adjustable resistance local bit line AR_LBL 599. The adjustable resistance local bit line AR_LBL 598 and the adjustable resistance local bit line AR_LBL 599 are connected to the global bit line GBL 595 (e.g., via an N+ polysilicon layer). The select gate SG 596 connects to a select gate line SGL 193 via a vertical TFT that is controlled by CSG 191. The select gate SG 597 connects to a select gate line SGL 194 via a vertical TFT that is controlled by CSG 192.

In some embodiments, the first adjustable resistance bit line structure may comprise a first distributed NMOS FET structure and the second adjustable resistance bit line structure may comprise a second distributed NMOS FET structure. The first adjustable resistance bit line structure may be set into a conducting state by applying a first voltage to the select gate SG 596 and the second adjustable resistance bit line structure may be set into a non-conducting state by applying a second voltage different from the first voltage to the select gate SG 597. In one example, the first voltage may be applied to the select gate SG 596 by enabling the vertical TFT controlled by CSG 191 to electrically connect the select gate line SGL 193 to the select gate SG 596. The second voltage may be applied to the select gate SG 597 by enabling the vertical TFT controlled by CSG 192 to electrically connect the select gate line SGL 194 to the select gate SG 597. In some cases, a transistor (e.g., an NMOS device, a PMOS device, or a JFET device) may be used to selectively connect a select gate line, such as select gate line SGL 194, to a select gate, such as select gate SG 597. In some cases, the select gate line SGL 194 may set the select gate SG 597 to ground or a negative voltage prior to the first voltage being applied to the select gate SG 596.

In some embodiments, the select gate SG 597 may be precharged to ground prior applying a selected select gate voltage (e.g., 4V) to the select gate SG 596. In some embodiments, all select gates within a memory array may be set to ground (i.e., 0V) prior to applying a selected select gate voltage (e.g., 4V) to the select gate SG 596. In some embodiments, select gates associated with a plurality of adjustable resistance bit line structures (e.g., adjustable resistance bit line structures to be set into a non-conducting state) that each connect to a particular word line (e.g., a word line to be selected) may be precharged to 0V prior to setting a select gate associated with an adjustable resistance bit line structure (e.g., an adjustable resistance bit line structure to be set into a conducting state) that connects to the particular word line to a selected select gate voltage (e.g., 5V). In this case, as the plurality of adjustable resistance bit line structures that each connect to the particular word line (e.g., a selected word line) have been set into non-conducting states, H-cell leakage currents from the particular word line when the particular word line is selected may be significantly reduced or eliminated.

In one embodiment, the adjustable resistance local bit line AR_LBL 598 may be connected to a first set of memory cells that includes memory elements that are connected to word lines WL0-WL4 and the adjustable resistance local bit line AR_LBL 599 may be connected to a second set of memory cells that includes memory elements that are connected to word lines WL10-WL14. During a memory operation (e.g., a read operation, a programming operation, an erase operation, a program verify operation, or an erase verify operation), the adjustable resistance local bit line AR_LBL 598 may be set into a conducting state such that a conducting path exists between the memory elements that are connected to word lines WL0-WL4 and the global bit line GBL 595 and the adjustable resistance local bit line AR_LBL 599 may be set into a non-conducting state such that a conducting path does not exist between the memory elements that are connected to word lines WL10-WL14 and the global bit line GBL 595. In this case, the memory elements that are connected to word lines WL10-WL14 are electrically disconnected from the global bit line GBL 595. The adjustable resistance local bit line AR_LBL 599 may be set into a non-conducting state by precharging the select gate SG 597 to 0V prior to setting the adjustable resistance local bit line AR_LBL 598 into a conducting state.

Figure 6J:
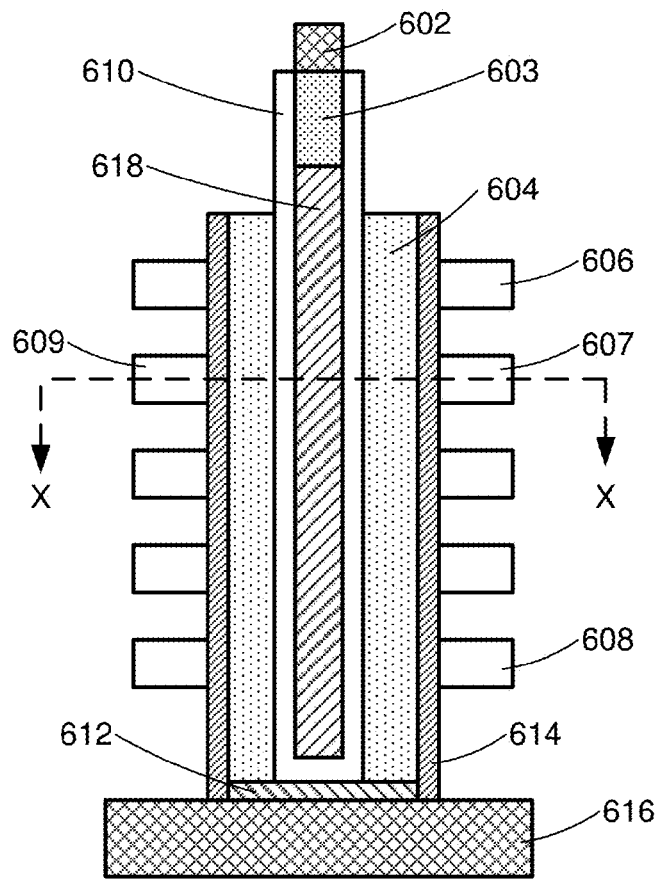

FIG. 6J depicts one embodiment of an adjustable resistance bit line structure using a cross-sectional view in the global bit line direction. The adjustable resistance bit line structure depicted in FIG. 6J is one example of an implementation of the adjustable resistance bit line structure depicted in FIG. 6A. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise intrinsic or undoped polysilicon. In some cases, the adjustable resistance local bit line 604 may comprise lightly doped N– polysilicon. The dielectric layer 610 may comprise an oxide layer. The select gate 618 may comprise TiN or polysilicon. An SG line 602 connects to a drain of a vertical TFT formed using P– polysilicon layer 603. The source of the vertical TFT is connected to the select gate 618. The vertical TFT may comprise an NMOS transistor. In some cases, the vertical TFT formed using P– polysilicon layer 603 may use a thinner dielectric layer than the dielectric layer 610 (e.g., a gate oxide for the vertical TFT may be thinner than the dielectric layer 610). The SG line 602 may comprise TiN, polysilicon, or tungsten. In some cases, the SG line 602 may extend in the word line direction (e.g., into the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via an N+ polysilicon layer 612. The global bit line 616 may comprise TiN or tungsten. In one embodiment, FIG. 6J may depict a cross-sectional view taken along line Z-Z of FIG. 6K.

Figure 6K:
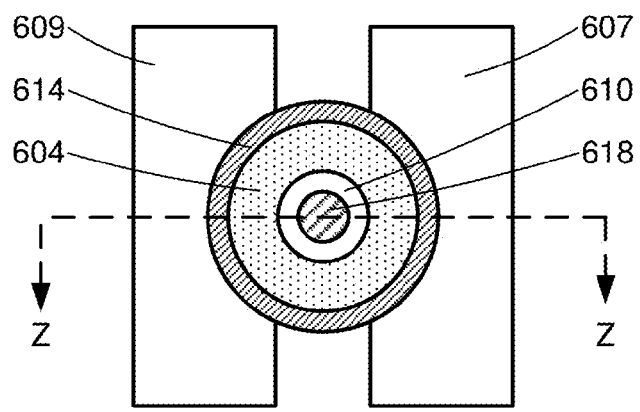

FIG. 6K depicts one embodiment of a cross-sectional view taken along line X-X of FIG. 6J. In one example, the cross-sectional view taken along line X-X of FIG. 6J may comprise a horizontal slice taken through a word line layer that includes word lines 607 and 609.

Figure 6L:
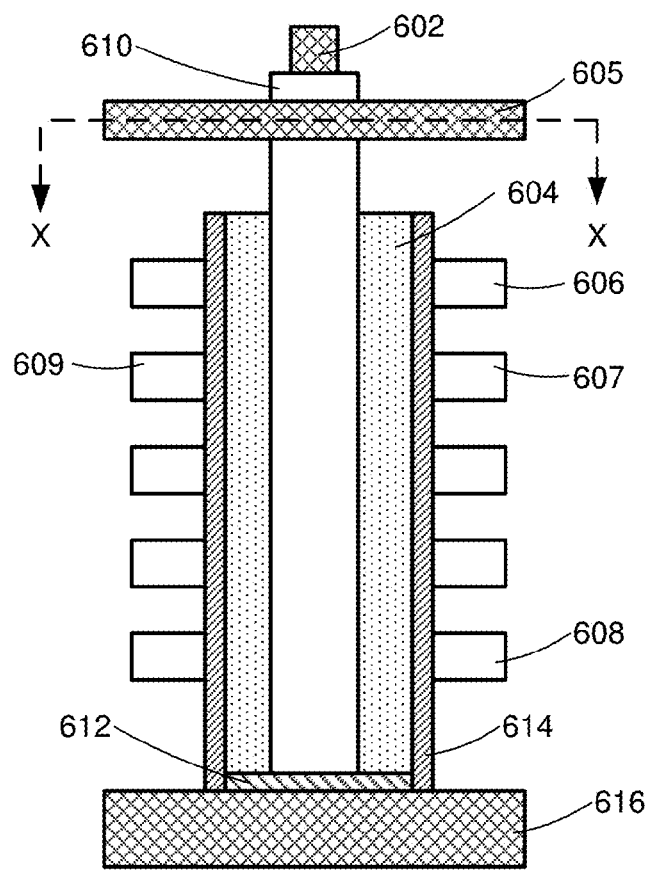

FIG. 6L depicts one embodiment of a side view of the adjustable resistance bit line structure depicted in FIG. 6J. As depicted, a gate control line 605 for controlling the gate of the vertical TFT formed using P– polysilicon layer 603 extends in the global bit line direction. The gate control line 605 may comprise TiN or tungsten. The vertical TFT may comprise an NMOS device. In some cases, the vertical TFT may comprise a JFET. In one example, the dielectric layer 610 may comprise an oxide layer that is used as the gate oxide for the vertical TFT. In another example, the gate dielectric for the vertical TFT may be thinner than the dielectric layer 610 used as the gate dielectric for the vertical select gate.

Figure 6M:
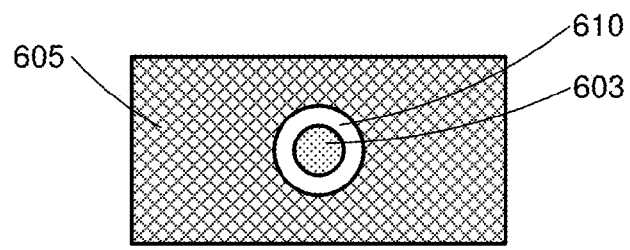

FIG. 6M depicts one embodiment of a cross-sectional view taken along line X-X of FIG. 6L. In one example, the cross-sectional view taken along line X-X of FIG. 6L may comprise a horizontal slice taken through the vertical TFT at the gate control line layer. In some cases, each vertical TFT positioned above each select gate may include a wrap-around gate. The wrap-around gates for each vertical TFT may be separated from each other using a dielectric layer or an oxide layer.

Figure 6N:
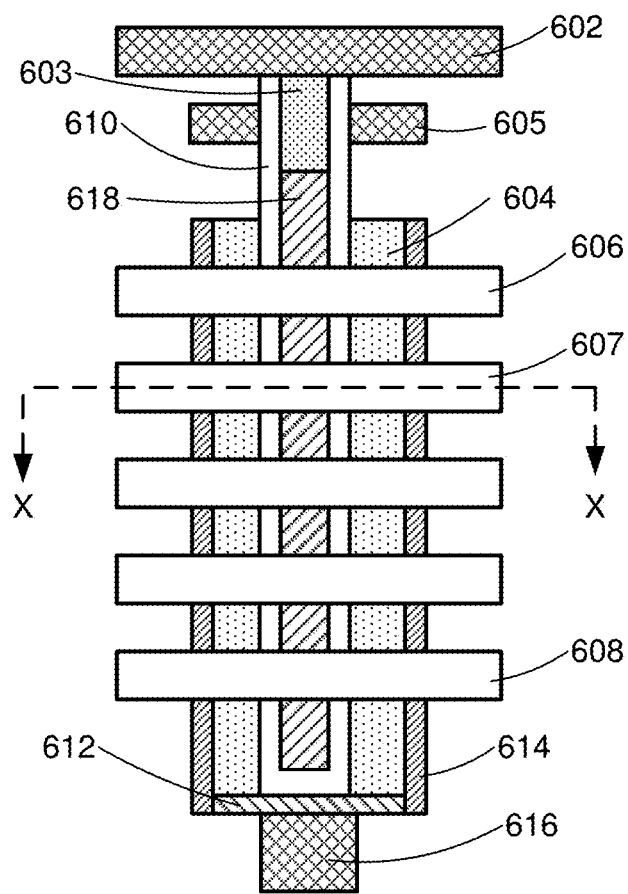

FIG. 6N depicts one embodiment of the adjustable resistance bit line structure depicted in FIG. 6J using a cross-sectional view in the word line direction. The adjustable resistance bit line structure depicted in FIG. 6N is one example of an implementation of the adjustable resistance bit line structure depicted in FIG. 6A. As depicted, the SG line 602 extends in the word line direction along with word lines 606, 607, and 608. The global bit line 616 extends in the global bit line direction (e.g., into the page). The gate control line 605 for controlling the gate of the vertical TFT may also extend in the global bit line direction.

Figure 6O:
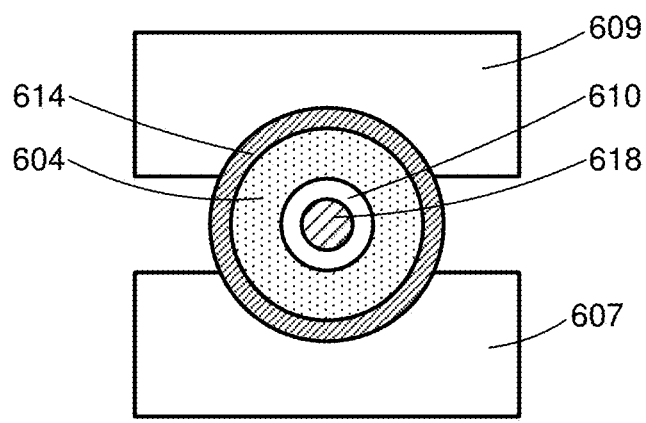

FIG. 6O depicts one embodiment of a cross-sectional view taken along line X-X of FIG. 6N. In one example, the cross-sectional view taken along line X-X of FIG. 6N may comprise a horizontal slice taken through a word line layer that includes word line 607 and word line 609. Word line 609 may comprise a word line that is in the same word line layer as word line 607 and adjacent to word line 607.

Figure 6P:
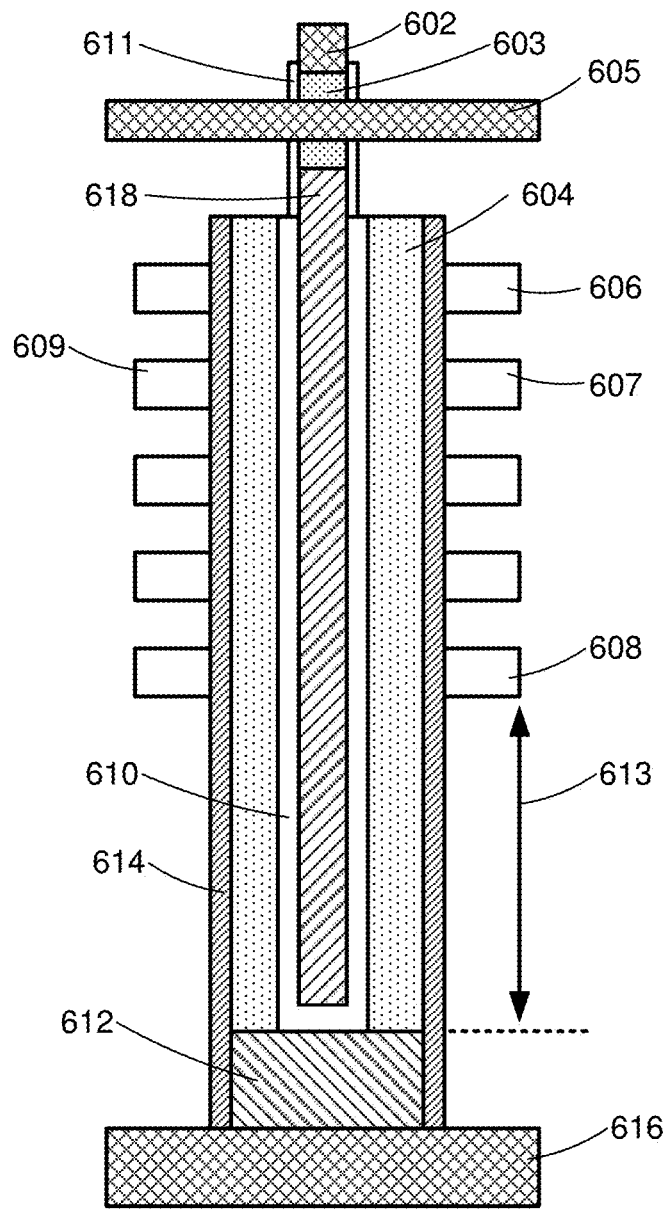

FIG. 6P depicts one embodiment of an adjustable resistance bit line structure. The adjustable resistance bit line structure depicted in FIG. 6P is one example of an implementation of the adjustable resistance bit line structure depicted in FIG. 6A. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise intrinsic or undoped polysilicon. In some cases, the adjustable resistance local bit line 604 may comprise lightly doped N– polysilicon. The dielectric layer 610 may comprise an oxide layer. The select gate 618 may comprise TiN or polysilicon. An SG line 602 connects to a drain of a vertical TFT formed using P– polysilicon layer 603 and dielectric layer 611. Dielectric layer 611 may be thinner than dielectric layer 610. Dielectric layer 611 may comprise an oxide layer. The source of the vertical TFT is connected to the select gate 618. The vertical TFT may comprise an NMOS transistor. In some cases, the vertical TFT may comprise a JFET. The gate of the vertical TFT may be controlled by gate control line 605 that extends in the global bit line direction. The gate control line 605 may comprise TiN or tungsten.

The SG line 602 may comprise TiN, polysilicon, or tungsten. In some cases, the SG line 602 may extend in the word line direction (e.g., into the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via N+ polysilicon layer 612. The global bit line 616 may comprise TiN or tungsten. In one embodiment, the spacing between word line layers (e.g., the spacing between word lines 606 and 607) may comprise 20 nm and the spacing between the top of the global bit line 616 and the bottom of the word line layer that includes word line 608 may comprise 150 nm or 200 nm.

In some embodiments, the distance 613 between the lowest word line layer and the top of the N+ polysilicon layer 612 may be set in order to provide a particular resistance value or to provide a particular voltage drop during a memory operation (e.g., during a programming operation such as a SET or RESET operation). In some cases, the lowest word line layer that includes word line 608 may comprise a dummy word line layer. In some cases, the distance 613 between the lowest word line layer and the top of the N+ polysilicon layer 612 may be more than ten times the spacing between word line layers (e.g., the spacing between the word line layer that includes word line 606 and the word line layer that includes word line 607).

Figure 6Q:
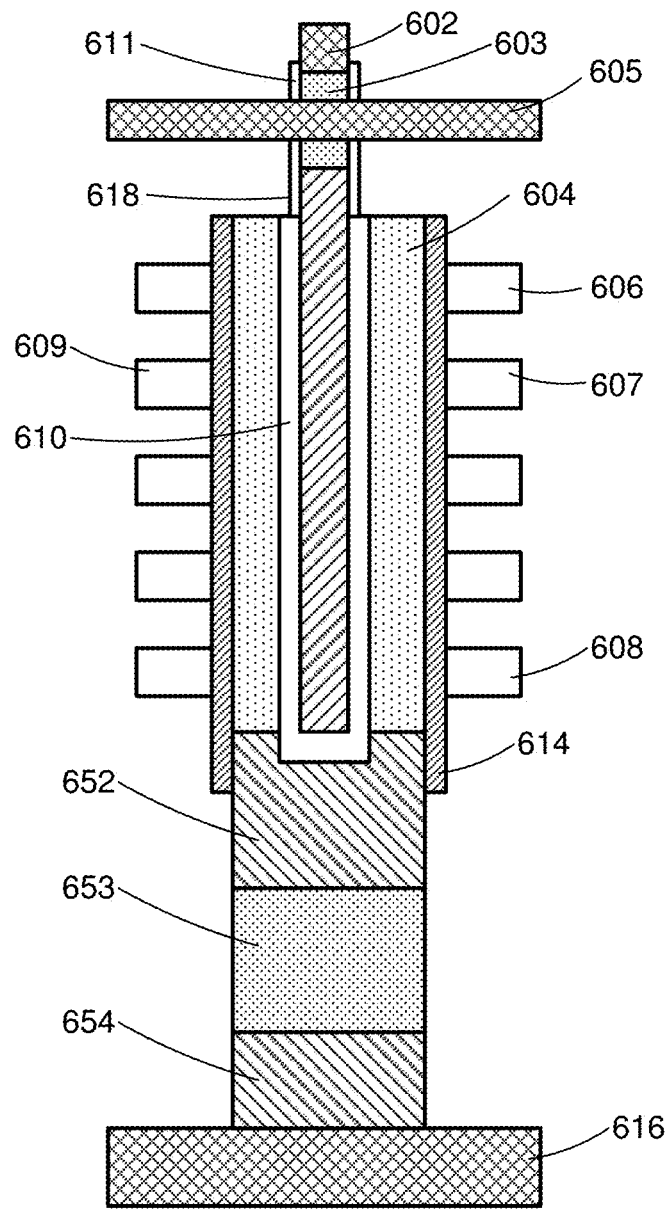

FIG. 6Q depicts one embodiment of an adjustable resistance bit line structure. The adjustable resistance bit line structure may connect to a global bit line, such as global bit line 616, at the bottom of the adjustable resistance bit line structure. As depicted, the adjustable resistance bit line structure includes a select gate 618 and a dielectric layer 610 arranged between the select gate 618 and an adjustable resistance local bit line 604. The adjustable resistance local bit line 604 may comprise intrinsic or undoped polysilicon. In some cases, the adjustable resistance local bit line 604 may comprise lightly doped N– polysilicon. The dielectric layer 610 may comprise an oxide layer. The select gate 618 may comprise TiN or polysilicon. An SG line 602 connects to a drain of a vertical TFT formed using P– polysilicon layer 603. The source of the vertical TFT is connected to the select gate 618. The vertical TFT may comprise an NMOS transistor. In some cases, the vertical TFT may comprise a JFET. The SG line 602 may comprise TiN, polysilicon, or tungsten. In some cases, the SG line 602 may extend in the word line direction (e.g., into the page). A ReRAM layer 614 is arranged between the word lines 606-609 and the adjustable resistance local bit line 604. The ReRAM layer 614 may comprise a phase change material, a ferroelectric material, or a metal oxide such as nickel oxide or hafnium oxide. The adjustable resistance local bit line 604 may connect to a global bit line 616 via an integrated bottom resistor comprising an N+ polysilicon layer 652, an N– polysilicon layer 653, and an N+ polysilicon layer 654. The global bit line 616 may comprise TiN or tungsten. In one embodiment, the spacing between word lines (e.g., the spacing between word lines 606 and 607) may comprise 20 nm and the spacing between the top of the global bit line 616 and the top of the N+ polysilicon layer 652 may comprise 150 nm, 200 nm, or 300 nm.

As depicted in FIG. 6Q, the ReRAM layer 614 does not extend to the global bit line 616. Instead, an oxide layer not depicted may exist between the ReRAM layer 614 and the global bit line 616. One benefit of using the adjustable resistance bit line structure depicted in FIG. 6Q is that the etch depth for etching a memory hole in which the adjustable resistance bit line structure may be formed may be reduced. Another benefit of using the adjustable resistance bit line structure depicted in FIG. 6Q is that memory cell reliability may be improved as the integrated resistor may reduce voltage stress across memory cells connected to the adjustable resistance local bit line.

In one embodiment, the height (or the thickness) of the N– polysilicon layer 653 may be adjusted or set in order to provide a particular resistance value or to provide a particular voltage drop across the integrated resistor during a memory operation (e.g., during a programming operation). The lowest word line layer that includes word line 608 may comprise a dummy word line layer.

Figure 6R:
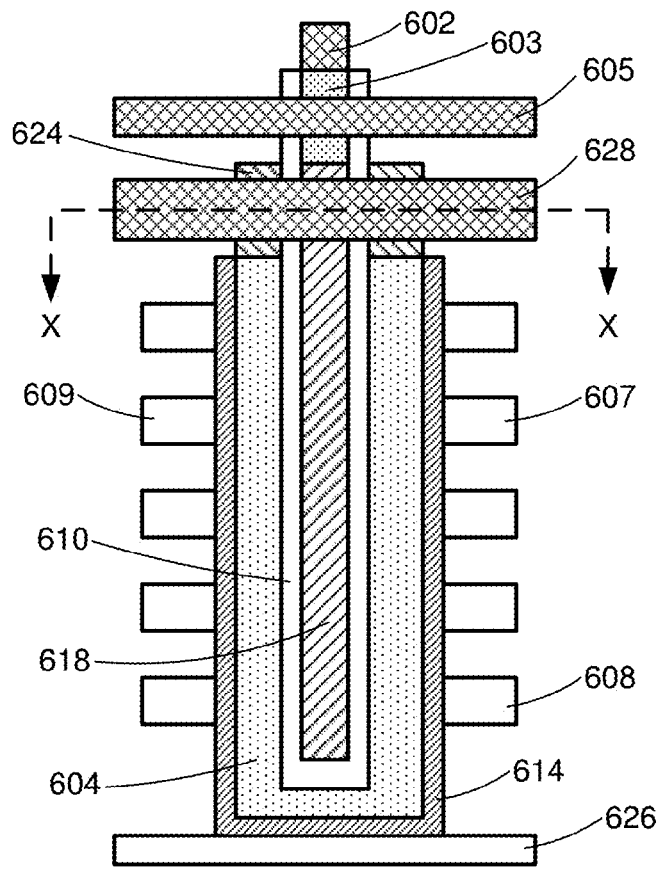

FIG. 6R depicts one embodiment of an adjustable resistance bit line structure. The adjustable resistance bit line structure may connect to a global bit line, such as global bit line 628, near the top of the adjustable resistance bit line structure or above the highest word line layer. One benefit of making the connection to the global bit line near the top of the adjustable resistance bit line structure is that the ReRAM layer 614 may not need to be etched and the adjustable resistance bit line structure may be formed using a more reliable ReRAM material.

As depicted, the adjustable resistance bit line structure includes a select gate 618 and a dielectric layer 610 arranged between the select gate 618 and an adjustable resistance local bit line 604. The adjustable resistance local bit line 604 may comprise intrinsic or undoped polysilicon. In some cases, the adjustable resistance local bit line 604 may comprise lightly doped N– polysilicon. The dielectric layer 610 may comprise an oxide layer. The select gate 618 may comprise TiN or polysilicon. An SG line 602 connects to a drain of a vertical TFT formed using P– polysilicon layer 603 and dielectric layer 610. The source of the vertical TFT is connected to the select gate 618. The vertical TFT may comprise an NMOS transistor. In some cases, the vertical TFT formed using P– polysilicon layer 603 may use a thinner dielectric layer than the dielectric layer 610 (e.g., a gate oxide for the vertical TFT may be thinner than the dielectric layer 610). The gate of the vertical TFT may be controlled by gate control line 605 that extends in the global bit line direction. The gate control line 605 may comprise TiN or tungsten. A ReRAM layer 614 is arranged between the word lines 607-609 and the adjustable resistance local bit line 604. The ReRAM layer 614 may comprise a phase change material, a ferroelectric material, or a metal oxide such as nickel oxide or hafnium oxide. The base layer 626 may comprise a portion of a silicon substrate, a layer of polysilicon, or an oxide layer.

The adjustable resistance local bit line 604 may connect to the global bit line 628 via an N+ polysilicon layer 624. The N+ polysilicon layer 624 may be formed on top of the adjustable resistance local bit line 604 or positioned above the highest word line layer. The global bit line 628 may comprise TiN or tungsten. Thus, an adjustable resistance local bit line (e.g., a vertical bit line that comprises undoped polysilicon) may connect to a global bit line that is positioned below the adjustable resistance local bit line or may connect to a global bit line that is positioned above the adjustable resistance local bit line.

Figure 6S:
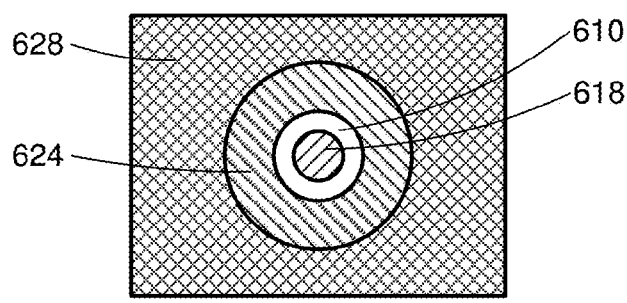

FIG. 6S depicts one embodiment of a cross-sectional view taken along line X-X of FIG. 6R. In one example, the cross-sectional view taken along line X-X of FIG. 6R may comprise a horizontal slice taken through a global bit line layer that includes global bit line 628.

Figure 6T:
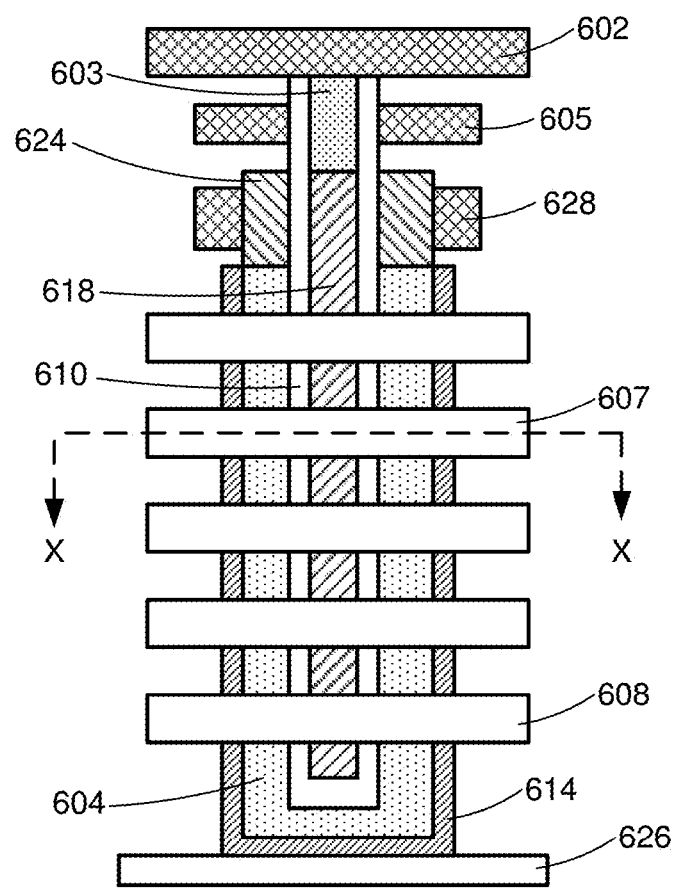

FIG. 6T depicts one embodiment of the adjustable resistance bit line structure depicted in FIG. 6R using a cross-sectional view in the word line direction. As depicted, the SG line 602 extends in the word line direction along with word lines 607 and 608. The global bit line 628 extends in the global bit line direction (e.g., into the page). The gate control line 605 for controlling the gate of the vertical TFT may also extend in the global bit line direction.

Figure 6U:
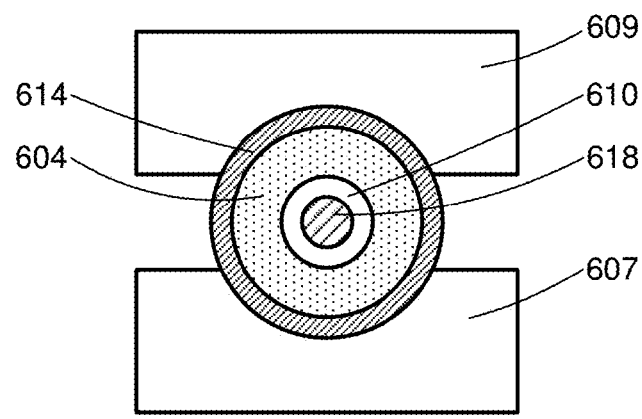

FIG. 6U depicts one embodiment of a cross-sectional view taken along line X-X of FIG. 6T. In one example, the cross-sectional view taken along line X-X of FIG. 6T may comprise a horizontal slice taken through a word line layer that includes word line 607 and word line 609. Word line 609 may comprise a word line that is in the same word line layer as word line 607 and adjacent to word line 607.

Figure 6V:
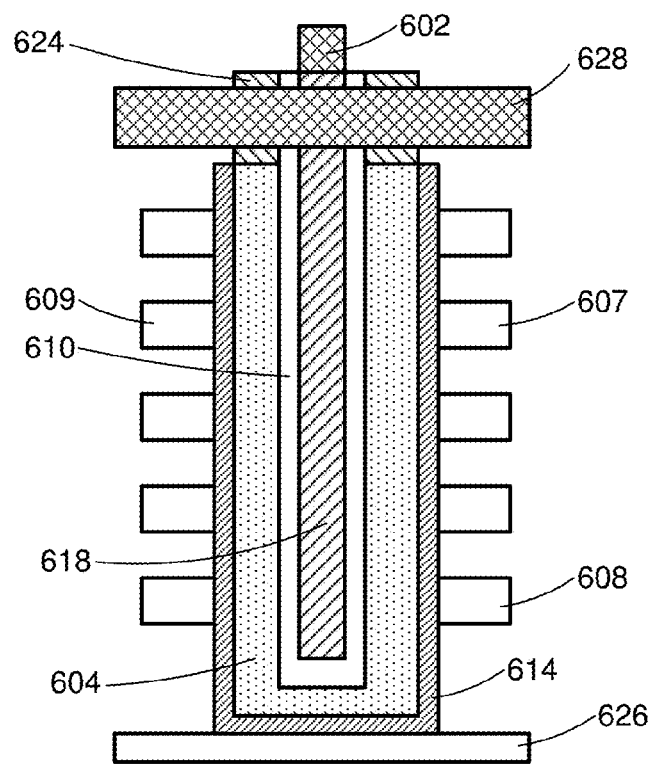

FIG. 6V depicts one embodiment of an adjustable resistance bit line structure. The adjustable resistance bit line structure may connect to a global bit line, such as global bit line 628, near the top of the adjustable resistance bit line structure or above the highest word line layer. One benefit of making the connection to the global bit line near the top of the adjustable resistance bit line structure is that the ReRAM layer 614 may not need to be etched at the bottom of the adjustable resistance bit line structure (e.g., in order to connect an adjustable resistance local bit line to a global bit line located at the bottom of the adjustable resistance local bit line). As depicted, the SG line 602 directly connects to the select gate 618. Thus, in some cases, an SG line may directly connect to or abut a select gate. In other cases, an SG line may selectively connect to the select gate via a vertical TFT or other transistor. One benefit of not using a vertical TFT to selectively connect the SG line to the select gate is that process complexity and manufacturing costs may be reduced.

Figure 6W:
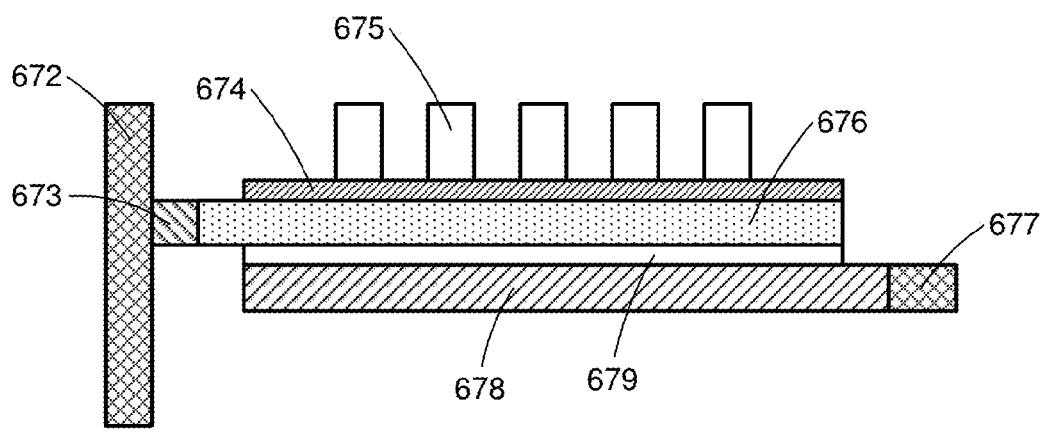

FIG. 6W depicts one embodiment of an adjustable resistance bit line structure in which the adjustable resistance bit line structure is arranged in a horizontal orientation (e.g., positioned above a substrate and in a plane that is parallel to the substrate). The adjustable resistance bit line structure may connect to a global bit line, such as global bit line 672, at a first side of the adjustable resistance bit line structure. As depicted, the adjustable resistance bit line structure includes a select gate 678 and a dielectric layer 679 arranged between the select gate 678 and an adjustable resistance local bit line 676. The adjustable resistance local bit line 676 may comprise intrinsic or undoped polysilicon. In some cases, the adjustable resistance local bit line 676 may comprise lightly doped N− polysilicon. The dielectric layer 679 may comprise an oxide layer. The select gate 678 may comprise TiN or polysilicon. An SG line 677 connects to the select gate 678 on a second side of the adjustable resistance bit line structure. The SG line 677 may comprise TiN, polysilicon, or tungsten. A ReRAM layer 674 is arranged between the word lines including word line 675 and the adjustable resistance local bit line 676. The word lines including word line 675 may comprise TiN, polysilicon, or tungsten (W). The ReRAM layer 674 may comprise a phase change material, a ferroelectric material, or a metal oxide such as nickel oxide or hafnium oxide. The adjustable resistance local bit line 676 may connect to the global bit line 672 via an N+ polysilicon region 673. The global bit line 672 may comprise TiN or tungsten. In some cases, a vertical global bit line, such as global bit line 672, may connect to a plurality of adjustable resistance local bit lines that are arranged in a plurality of horizontal planes located above a substrate. In some cases, a vertical SG line may connect to a plurality of select gates that are arranged in a plurality of horizontal planes located above a substrate. In other cases, a horizontal SG line may connect to a plurality of select gates that are arranged within a horizontal plane located above a substrate.

Figure 7A:
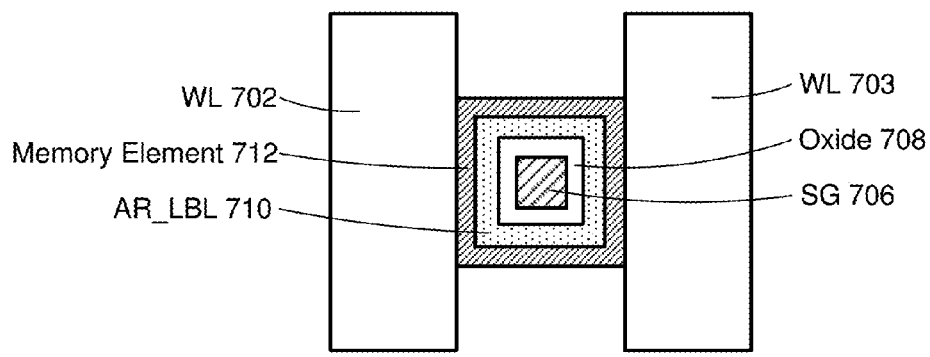
FIGS. 7A-7J depict various embodiments of adjustable resistance bit line structures within a memory array.

FIG. 7A depicts one embodiment of a top plan view of an adjustable resistance bit line structure. The adjustable resistance bit line structure may be formed using a vertical pillar that includes a select gate SG 706 that is surrounded by an oxide layer Oxide 708 that is surrounded by an adjustable resistance local bit line AR_LBL 710 that is surrounded by a memory element layer 712. A first side of the vertical pillar may contact a first word line WL 702 and a second side of the vertical pillar may contact a second word line WL 703. In some cases, the word line spacing between word line WL 702 and word line WL 703 may comprise 48 nm or 24 nm.

Figure 7B:
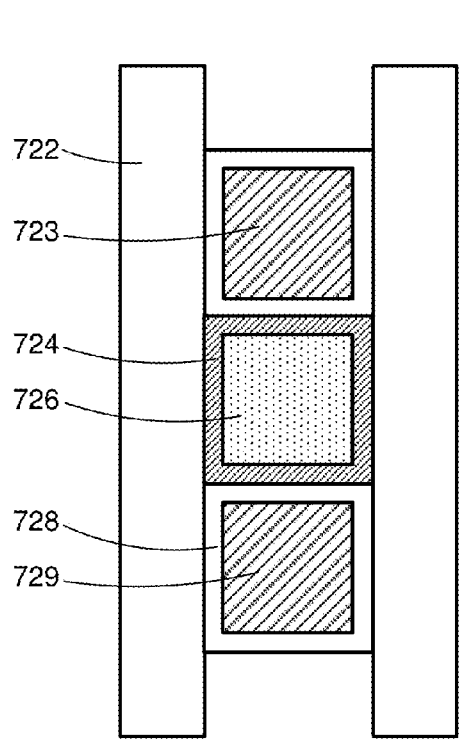

FIG. 7B depicts another embodiment of a top plan view of an adjustable resistance bit line structure. The adjustable resistance bit line structure may be formed using a pair of vertical pillars. The first vertical pillar of the pair of vertical pillars includes a select gate 729 surrounded by an oxide layer 728 and the second vertical pillar of the pair of vertical pillars includes an adjustable resistance local bit line 726 surrounded by a memory element layer 724. The select gate 729 may comprise TiN or polysilicon. The oxide layer 728 may comprise silicon dioxide. The adjustable resistance local bit line 726 may comprise undoped polysilicon or lightly doped N− polysilicon. The memory element layer 724 may comprise a phase change material, a ferroelectric material, or a metal oxide such as nickel oxide or hafnium oxide. A first side of the second vertical pillar contacts a word line 722. As depicted, a third vertical pillar that includes select gate 723 may be positioned such that the third vertical pillar and the first vertical pillar abut the second vertical pillar. In this case, the resistance or the conductivity of the adjustable resistance local bit line 726 may be adjusted via an application of a voltage to select gate 729, select gate 723, or both select gates 729 and 723 at the same time. In one example, the adjustable resistance local bit line 726 may be set into either a conducting state or a non-conducting state based on the voltages applied to select gates 729 and 723.

Figure 7C:
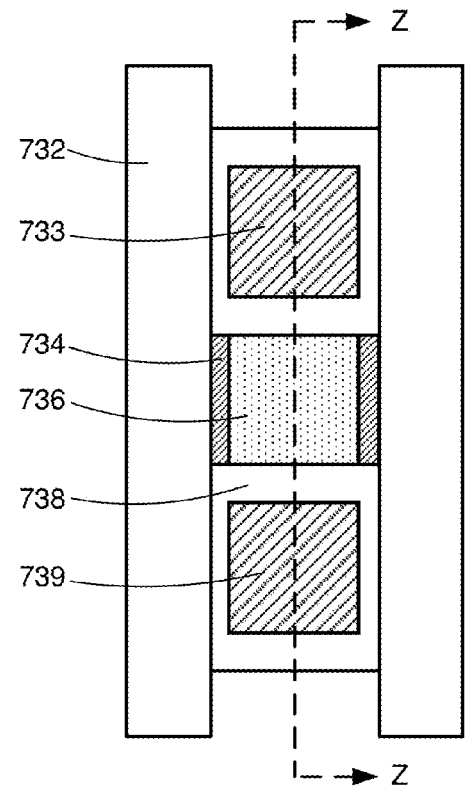

FIG. 7C depicts another embodiment of a top plan view of an adjustable resistance bit line structure. The adjustable resistance bit line structure may be formed using a pair of vertical pillars. The first vertical pillar of the pair of vertical pillars includes a select gate pillar 739 and the second vertical pillar of the pair of vertical pillars includes an adjustable resistance local bit line pillar 736. The select gate pillar 739 and the adjustable resistance local bit line pillar 736 are separated by a dielectric layer 738. As depicted, another select gate pillar 733 may be positioned such that the adjustable resistance local bit line pillar 736 is located between the select gate pillar 733 and the select gate pillar 739. The select gate pillar 739 may comprise TiN or polysilicon. The dielectric layer 738 may comprise silicon dioxide. The adjustable resistance local bit line pillar 736 may comprise undoped polysilicon or lightly doped N− polysilicon. The memory element layer 734 may comprise a phase change material, a ferroelectric material, or a metal oxide such as nickel oxide or hafnium oxide. The memory element layer 734 may be positioned between the adjustable resistance local bit line pillar 736 and the word line 732. In some cases, the resistance or the conductivity of at least a portion of the adjustable resistance local bit line pillar 736 may be adjusted via an application of a voltage to the select gate pillar 739, the select gate pillar 733, or both select gate pillars 739 and 733 at the same time. In one embodiment, the adjustable resistance local bit line pillar 736 may be set into either a conducting state or a non-conducting state based on the voltages applied to select gate pillars 739 and 733.

Figure 7D:
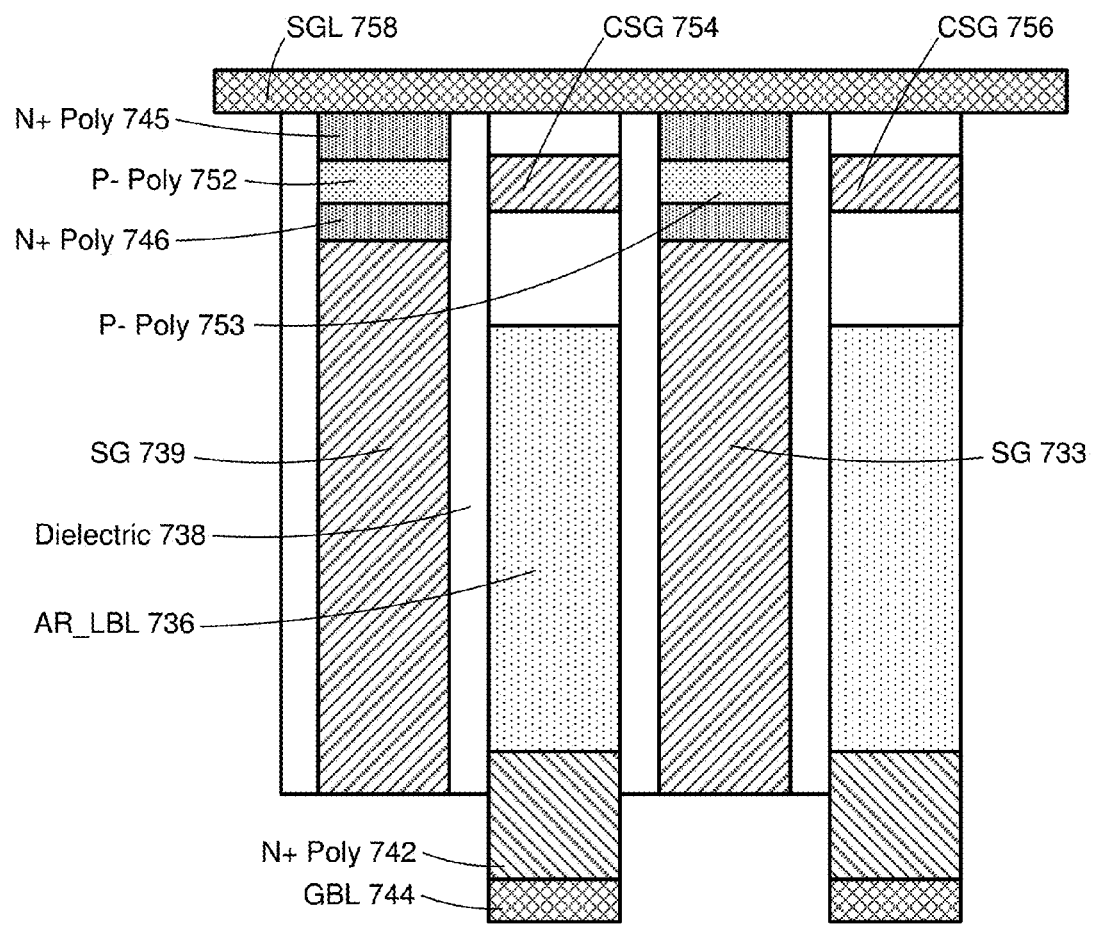

FIG. 7D depicts one embodiment of a cross-sectional view taken along line Z-Z of FIG. 7C. As depicted, the adjustable resistance local bit line pillar 736 connects to a global bit line GBL 744 via N+ polysilicon layer 742 and the select gate pillar 739 connects to a source of a vertical TFT that is formed using P− polysilicon layer 752. The source and drain junctions of the vertical TFT comprise N+ polysilicon layer 745 and N+ polysilicon layer 746. The drain of the vertical TFT that includes P− polysilicon layer 752 connects to the SG line SGL 758 that runs in the word line direction. The vertical TFT may comprise an NMOS transistor. In some cases, the vertical TFT formed using P− polysilicon layer 752 may use a thinner dielectric layer than the dielectric layer 738 (e.g., a gate oxide for the vertical TFT may be thinner than the dielectric layer 738 arranged between the select gate pillar SG 739 and the adjustable resistance local bit line pillar AR_LBL 736). The adjustable resistance local bit line pillar 739 may comprise lightly doped N− polysilicon. The SG line SGL 758 may comprise TiN, polysilicon, or tungsten. The gate of the vertical TFT that includes P− polysilicon layer 752 may be controlled by control line CSG 754. The control line CSG 754 may comprise TiN, polysilicon, or tungsten. As depicted, the select gate pillar 733 connects to a source of a vertical TFT that is formed using P− polysilicon layer 753. The drain of the vertical TFT that includes P− polysilicon layer 753 connects to the SG line SGL 758. Both the control line CSG 754 and the control line CSG 756 may be arranged in the global bit line direction that is orthogonal to the word line direction. As P− polysilicon layer 753 is arranged between the control line CSG 754 and the control line CSG 756, the voltages applied to the control line CSG 754 and the control line CSG 756 may be used to set the vertical TFT that includes P− polysilicon layer 753 into a conducting state or a non-conducting state. In some cases, a voltage applied to the control line CSG 754 may be used to set both the vertical TFT that includes P− polysilicon layer 752 and the vertical TFT that includes P− polysilicon layer 753 into conducting or non-conducting states.

In one embodiment, an integrated bottom resistor, such as the integrated bottom resistor depicted in FIG. 6H, may be placed in series between the adjustable resistance local bit line pillar 736 and the global bit line GBL 744.

Figure 7E:
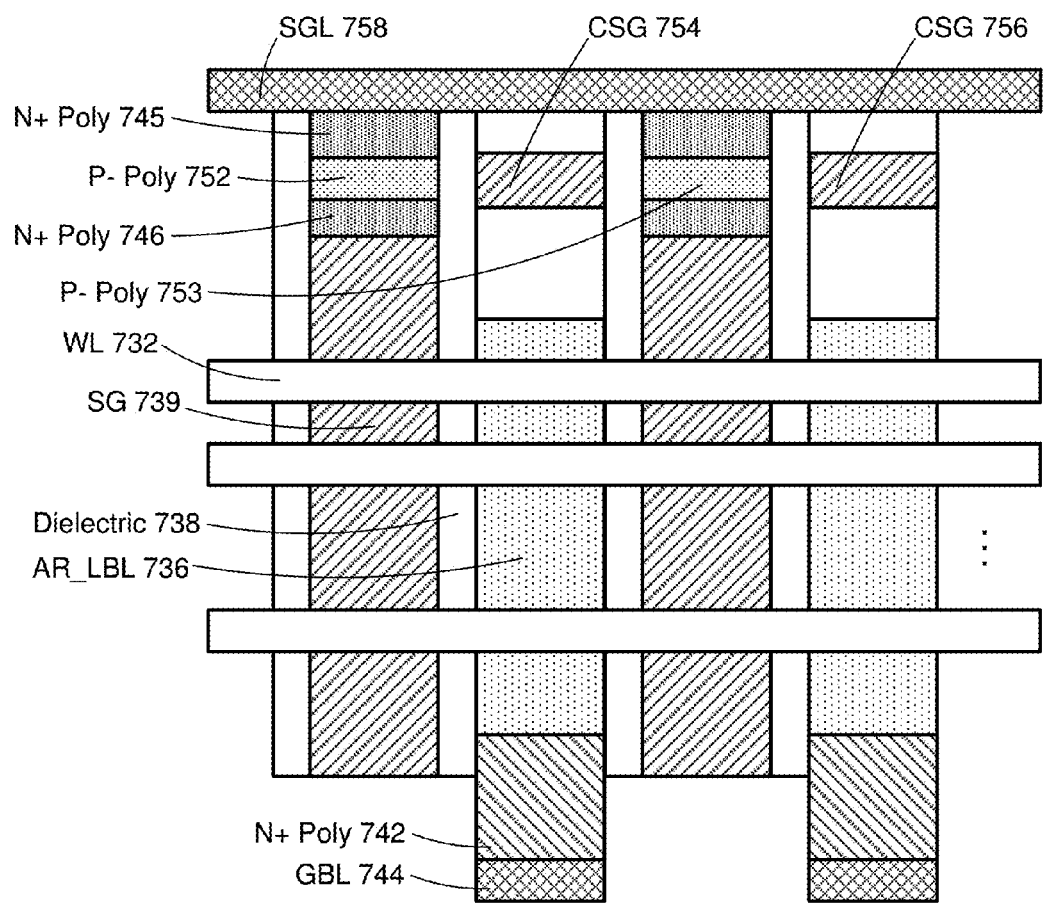

FIG. 7E depicts one embodiment of a side view of the adjustable resistance bit line structure depicted in FIG. 7C. As depicted, the SG line SGL 758 extends in the word line direction along with word lines that include word line WL 732. The global bit line GBL 744 extends in the global bit line direction (e.g., into the page). The control lines CSG 754 and 756 for controlling the gates of vertical TFTs may also extend in the global bit line direction.

Figure 7F:
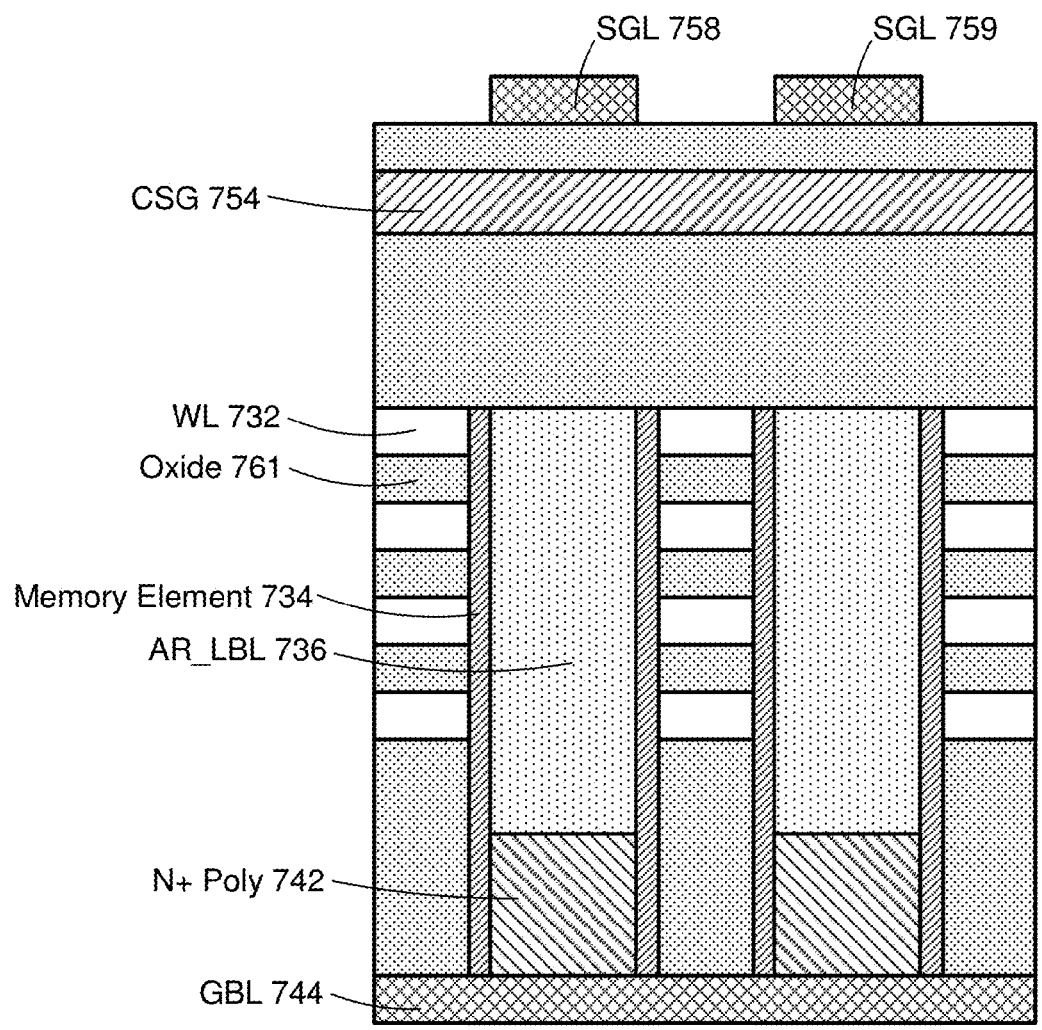

FIG. 7F depicts one embodiment of the adjustable resistance bit line structure depicted in FIG. 7E using a cross-sectional view in the global bit line direction. As depicted, the SG line SGL 758 extends in the word line direction (e.g., into the page) along with word line 732. The word line layers may be separated from each other using an oxide layer, such as oxide layer 761. An SG line SGL 759 may comprise an SG line that is in the same SG line layer as SG line SGL 758 and adjacent to SG line SGL 758. The control line CSG 754 for controlling the gates of vertical TFTs and the global bit line GBL 744 extend in the global bit line direction (e.g., horizontally from left to right).

Figure 7G:
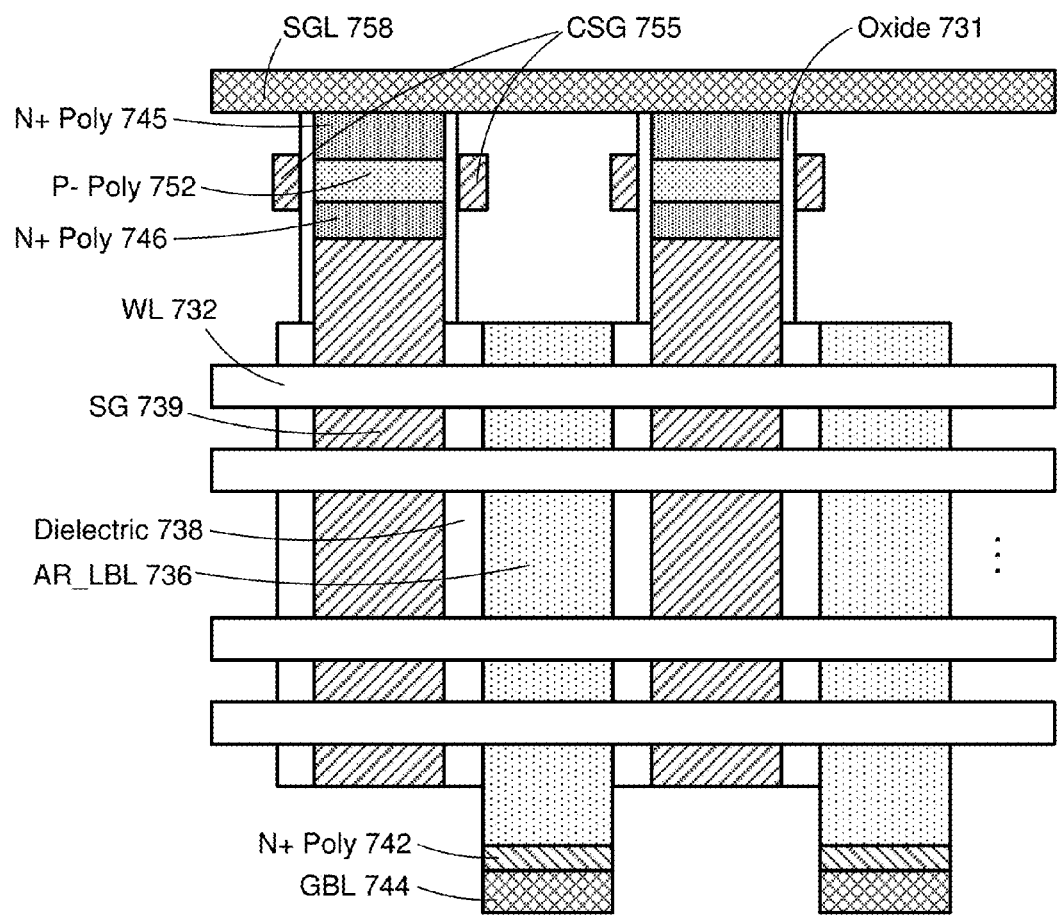

FIG. 7G depicts one embodiment of a side view of the adjustable resistance bit line structure depicted in FIG. 7C. As depicted, the SG line SGL 758 extends in the word line direction along with word lines that include word line WL 732. The global bit line GBL 744 extends in the global bit line direction (e.g., into the page). The control line CSG 755 for controlling a gate of a vertical TFT formed using P− polysilicon layer 752 may also extend in the global bit line direction. The control line CSG 755 may comprise TiN, polysilicon, or tungsten. In this case, the control line CSG 755 may control the gate of the vertical TFT connecting the SG line SGL 758 to the select gate pillar SG 739. Each vertical TFT positioned above each select gate may include a wrap-around gate. The wrap-around gates for each vertical TFT may be separated from each other using a dielectric layer or an oxide layer not depicted. As depicted, the source and drain junctions of the vertical TFT formed using P− polysilicon layer 752 correspond with N+ polysilicon layer 745 and N+ polysilicon layer 746. The drain of the vertical TFT that includes P− polysilicon layer 752 connects to the SG line SGL 758 that runs in the word line direction. The vertical TFT may comprise an NMOS transistor. In some cases, the vertical TFT formed using P− polysilicon layer 752 may use a thinner dielectric layer than the dielectric layer 738. For example, the gate oxide 731 for the vertical TFT may be thinner than the dielectric layer 738 arranged between the select gate pillar SG 739 and the adjustable resistance local bit line pillar AR_LBL 736.

Figure 7H:
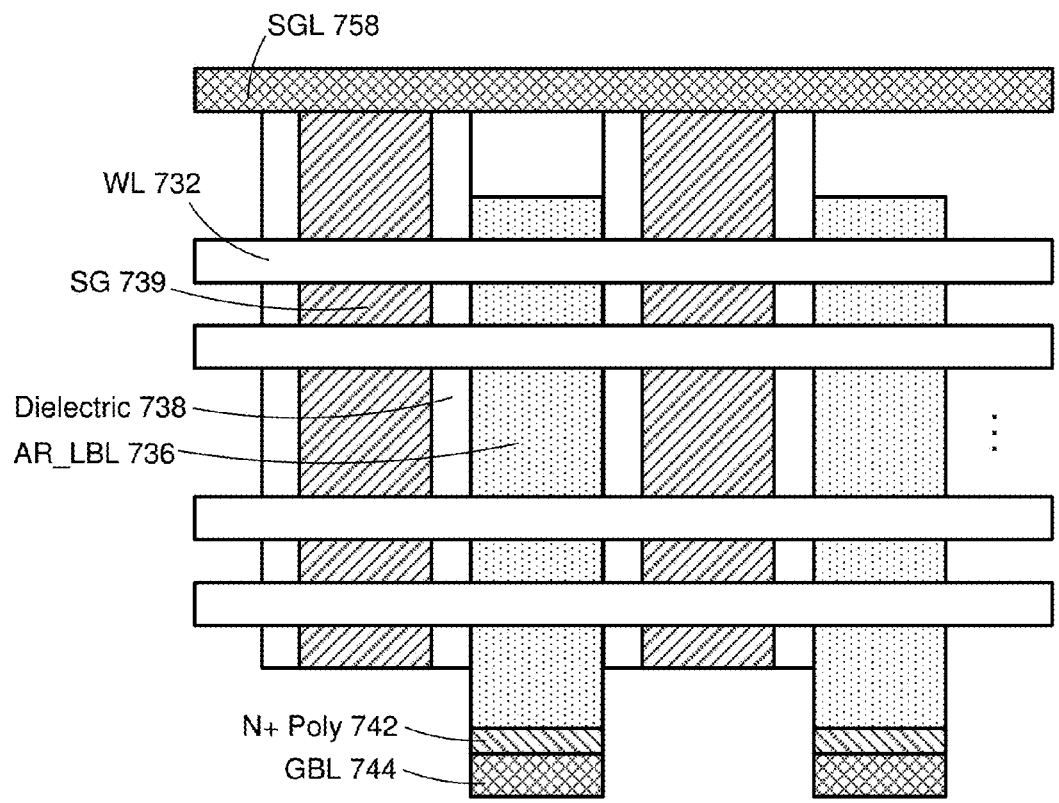

FIG. 7H depicts one embodiment of a side view of the adjustable resistance bit line structure depicted in FIG. 7C. As depicted, the SG line SGL 758 extends in the word line direction along with word lines that include word line WL 732. The global bit line GBL 744 extends in the global bit line direction (e.g., into the page). The SG line SGL 758 directly connects to the select gate pillar SG 739 (i.e., no vertical TFT is used to selectively connect the SG line SGL 758 to the select gate pillar SG 739). Thus, in some cases, an SG line may directly connect to or abut a select gate. In other cases, an SG line may selectively connect to a select gate via a vertical TFT or other transistor. One benefit of not using a vertical TFT to selectively connect the SG line to a select gate is that process complexity and manufacturing costs may be reduced.

Figure 7I:
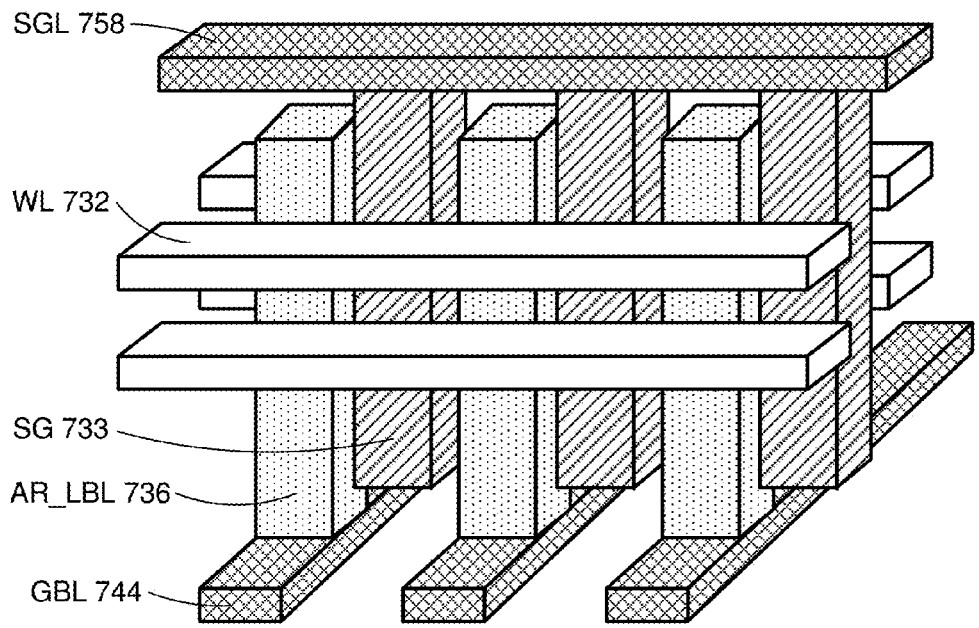

FIG. 7I depicts one embodiment of a perspective view of a portion of the adjustable resistance bit line structure depicted in FIG. 7C. As depicted, the select gate SG 733 and the adjustable resistance local bit line AR_LBL 736 comprise vertical pillar structures. The SG line SGL 758 extends in the word line direction along with word line WL 732. The SG line SGL 758 may contact the select gate SG 733 directly or connect to the select gate SG 733 via an N+ polysilicon layer not depicted. In some embodiments, the SG line SGL 758 may selectively connect to the select gate SG 733 via a vertical TFT. The adjustable resistance local bit line AR_LBL 736 may connect to the global bit line GBL 744 via an N+ polysilicon layer not depicted. In some embodiments, the adjustable resistance local bit line AR_LBL 736 may selectively connect to the global bit line GBL 744 via a vertical TFT.

Figure 7J:
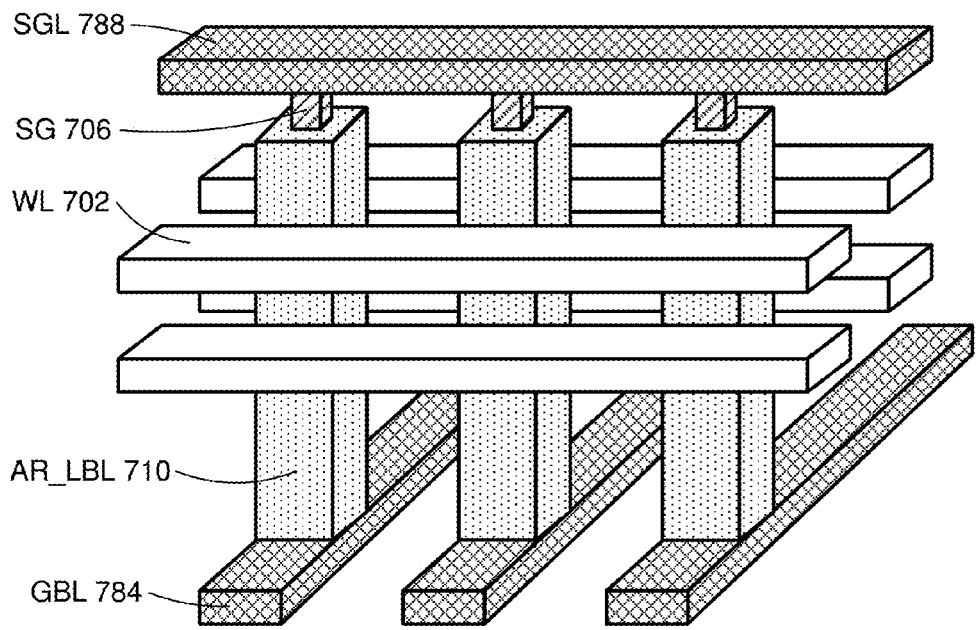

FIG. 7J depicts one embodiment of a perspective view of a portion of the adjustable resistance bit line structure depicted in FIG. 7A. As depicted, a single vertical pillar structure may include the select gate SG 706 and the adjustable resistance local bit line AR_LBL 710 surrounding the select gate SG 706. The select gate SG 706 may extend through the center of the vertical pillar and may be isolated from or separated from the adjustable resistance local bit line AR_LBL 710 by an oxide layer or a dielectric layer not depicted. The SG line SGL 788 extends in the word line direction along with word line WL 702. The SG line SGL 788 may contact the select gate SG 706 directly or connect to the select gate SG 706 via an N+ polysilicon layer not depicted. In some embodiments, the SG line SGL 788 may selectively connect to the select gate SG 706 via a vertical TFT. The adjustable resistance local bit line AR_LBL 710 may connect to the global bit line GBL 784 via an N+ polysilicon layer not depicted. In some embodiments, the adjustable resistance local bit line AR_LBL 710 may selectively connect to the global bit line GBL 784 via a vertical TFT.

Figure 8A:
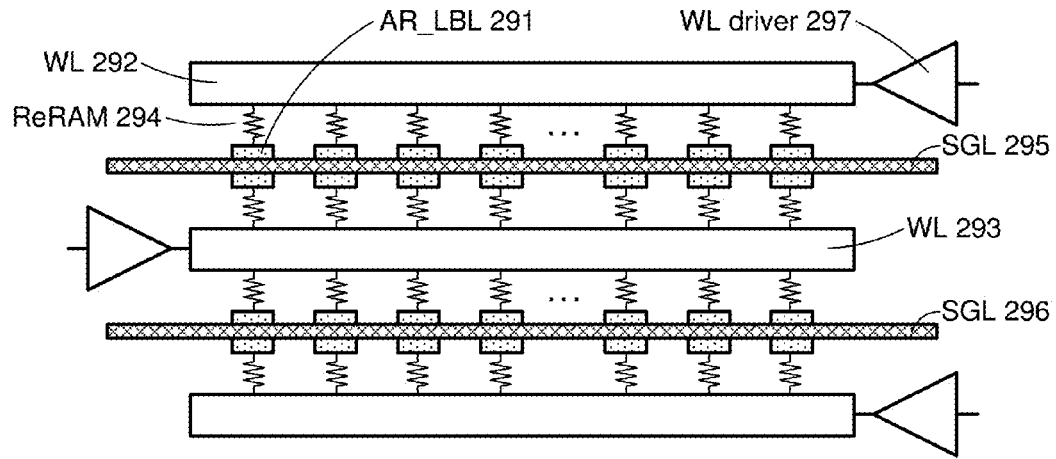
FIGS. 8A-8C depict various embodiments of memory arrays that include select gate lines for controlling adjustable resistance bit line structures.

FIG. 8A depicts one embodiment of a top plan view of a portion of a memory array that includes select gate lines for controlling adjustable resistance bit line structures. As depicted, the portion of the memory array includes word lines, such as word line WL 292 and word line WL 293, adjustable resistance local bit lines, such as adjustable resistance local bit line AR_LBL 291, and SG lines for controlling the adjustable resistance local bit lines, such as SG lines SGL 295 and SGL 296. Outside the memory array, word line drivers, such as word line driver WL driver 297, may connect to and drive the word lines of the memory array. In some cases, the word line drivers may be arranged such that odd numbered word lines are driven from one side of the memory array and even numbered word lines are driven from the other side of the memory array. In one embodiment, if a memory cell corresponding with ReRAM 294 comprises a selected memory cell during a memory operation, then the word line WL 292 connected to the memory cell may be set to a selected word line voltage during the memory operation and the adjustable resistance local bit line AR_LBL 291 connected to the memory cell may be set into a conducting state during the memory operation. The adjustable resistance local bit line AR_LBL 291 connected to the memory cell may be set into the conducting state by applying a selected gate line voltage to the SG line SGL 295 during the memory operation. The adjustable resistance local bit lines connected to the SG line SGL 296 may be set into non-conducting states during the memory operation by applying an unselected gate line voltage to the SG line SLG 296 during the memory operation. The memory operation may comprise, for example, a read operation, a write operation, a programming operation, a program verify operation, or an erase verify operation.

Figure 8B:
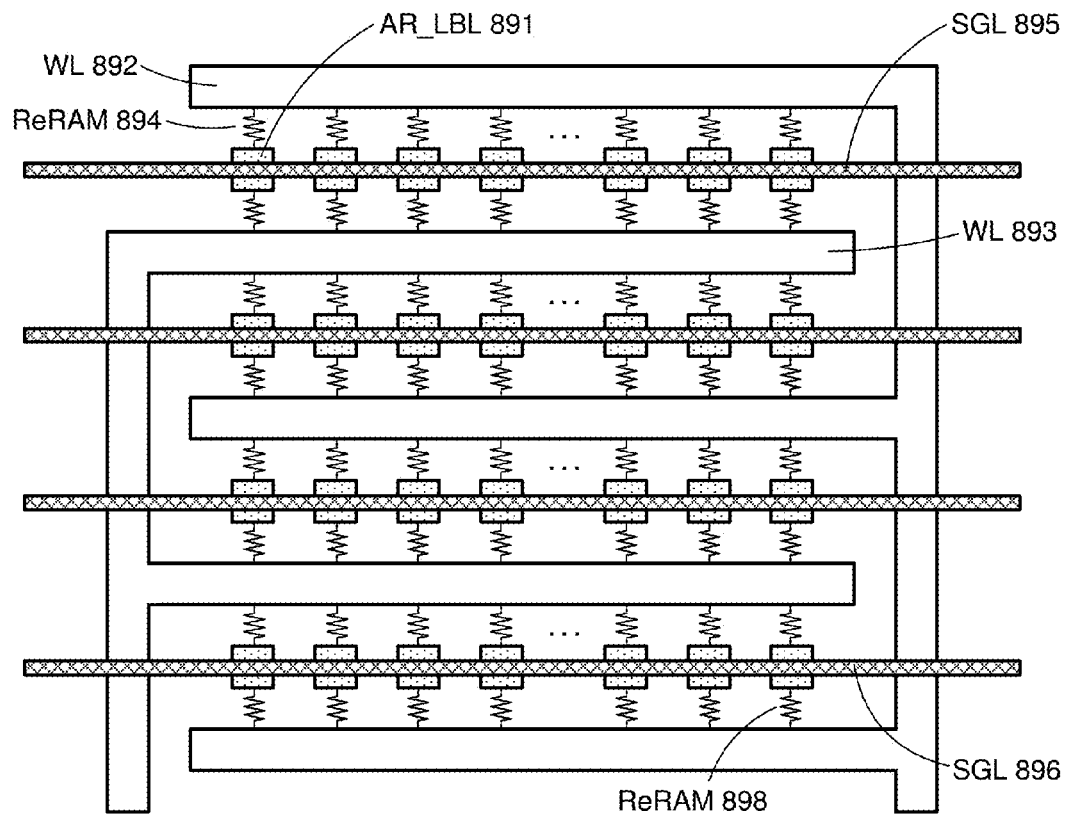

FIG. 8B depicts an alternative embodiment of a top plan view of a portion of a memory array that includes select gate lines for controlling adjustable resistance bit line structures. As depicted, the portion of the memory array includes word lines, such as word line WL 892 and word line WL 893, adjustable resistance local bit lines, such as adjustable resistance local bit line AR_LBL 891, and SG lines for controlling the adjustable resistance local bit lines, such as SG lines SGL 895 and SGL 896. The word line 892 and the word line 893 may comprise word line comb structures. A word line comb structure may comprise a plurality of word line segments (or fingers) within a word line layer that are shorted together. For example, a first word line segment of word line WL 892 connects to a first memory cell corresponding with ReRAM 894 and a second word line segment of word line WL 892 connects to a second memory cell corresponding with ReRAM 898. In another example, a word line comb structure may include a plurality of fingers (e.g., 16 fingers or 32 fingers) that are shorted together within a single word line layer (e.g., one of 16 word line layers formed above a substrate). In some cases, a first word line comb structure within a first word line layer may be positioned above a second word line comb structure within a second word line layer positioned above the first word line layer.

As depicted in FIG. 8B, the word line comb associated with word line WL 892 may be interdigitated with the word line comb associated with word line WL 893. One benefit of using word line comb structures is that the area constraints and/or pitch constraints for implementing word line drivers for driving the word line comb structures may be reduced. For example, in FIG. 8A, word line drivers on one side of the memory array may have to drive word lines every two word line pitches (e.g., all even word lines are driven from one side of the memory array). In contrast, a single word line driver may drive the word line comb structure associated with word line WL 892. In one embodiment, a word line comb structure may comprise two or more word line segments within a word line layer that are shorted together. The two or more word line segments may span a memory array and be shorted together within the word line layer at an end of the memory array. The word line comb structure may be arranged in a horizontal plane above a substrate. In another embodiment, a word line comb structure may comprise two or more word line segments within a word line layer that span at least a portion of a memory array and that are shorted together within the word line layer at an end of the memory array.

In one embodiment, a first word line comb may include a plurality of word line segments. The plurality of word line segments may include a first word line segment and a second word line segment. The first word line segment may connect to a first memory cell and the second word line segment may connect to a second memory cell. The first memory cell may connect to a first adjustable resistance bit line structure and the second memory cell may connect to a second adjustable resistance bit line structure. A first SG line may control a select gate of the first adjustable resistance bit line structure and a second SG line may control a select gate of the second adjustable resistance bit line structure. In one example, the first adjustable resistance bit line structure may be set into a conducting state and the second adjustable resistance bit line structure may be set into a non-conducting state during a memory operation. In another example, the first adjustable resistance bit line structure may be set into a non-conducting state and the second adjustable resistance bit line structure may be set into a conducting state during a memory operation. Thus, although both the first word line segment and the second word line segment may be set to a selected word line voltage during a memory operation, the first adjustable resistance bit line structure and the second adjustable resistance bit line structure may be set into different conducting states. For example, the adjustable resistance local bit line AR_LBL 891 in FIG. 8B connected to the memory cell corresponding with ReRAM 894 may be set into a conducting state via application of a selected SG line voltage to SG line SGL 895 and the adjustable resistance local bit line connected to the memory cell corresponding with ReRAM 898 may be set into a non-conducting state via application of an unselected SG line voltage to SG line SGL 896.

The ability to selectively set adjustable resistance bit line structures within a memory array connected to memory cells that are connected to a selected word line comb into conducting states or non-conducting states may allow large word line comb structures to be utilized, which may improve memory array efficiency and reduce overall memory chip area. Furthermore, the ability to set non-selected adjustable resistance bit line structures that are connected to a selected word line comb into non-conducting states allows for word line combs with an increased number of fingers and eliminates the need for vertical TFTs for selectively connecting global bit lines to the adjustable resistance bit line structures. In one example, a vertical TFT arranged between a global bit line and an adjustable resistance bit line structure may be unnecessary for selectivity reasons because the adjustable resistance bit line structure may be set into a non-conducting state via application of an unselected select gate voltage to a select gate of the adjustable resistance bit line structure.

Figure 8C:
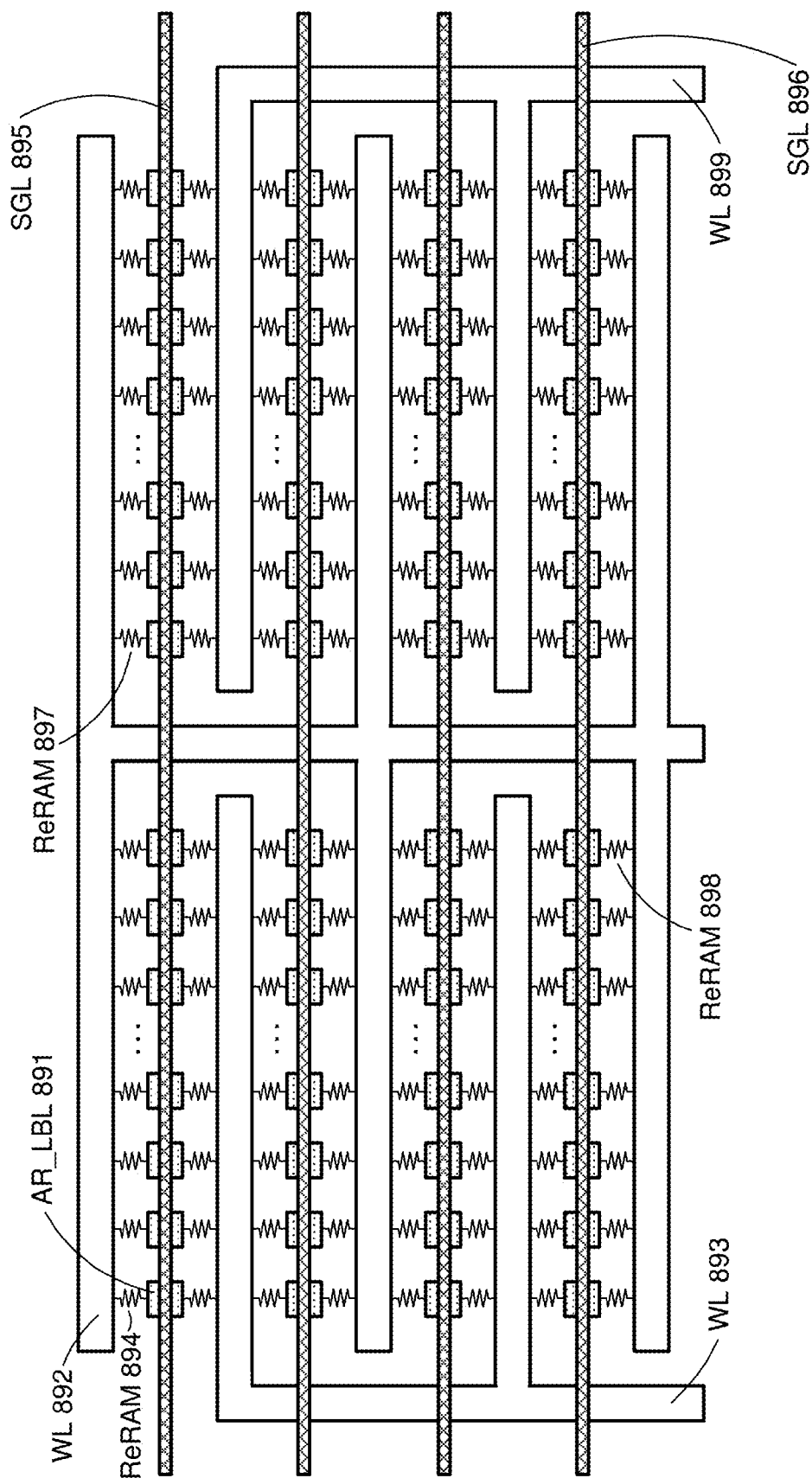

FIG. 8C depicts one embodiment of a top plan view of portions of two memory arrays in which a plurality of select gate lines for controlling adjustable resistance bit line structures within the two memory arrays span both memory arrays. As depicted, a first memory array of the two memory arrays includes portions of word line WL 892 and word line WL 893, adjustable resistance local bit line AR_LBL 891, and memory cells corresponding with ReRAM 894 and ReRAM 898. The second memory array of the two memory arrays includes portions of word line WL 892 and word line WL 899 and a memory cell corresponding with ReRAM 897. In this case, the SG lines SGL 895 and SGL 896 span both memory arrays. This allows the SG line drivers to be arranged at the ends or sides of both memory arrays rather than being arranged in the middle of or between the two memory arrays. In one example, a first set of SG line drivers may be arranged on a first side of the memory arrays and drive even numbered SG lines and a second set of SG line drivers may be arranged on a second side of the memory arrays and drive odd numbered SG lines.

In some embodiments, the SG lines may span a plurality of memory arrays. In one example, the SG lines, such as SG line SGL 895 and SGL 896 may span 128 memory arrays or 512 memory arrays. In some embodiments, the SG lines may span a plurality of word line combs. In one example, the SG lines, such as SG line SGL 895 and SGL 896 may span 128 word line combs or 512 word line combs.

In one embodiment, a plurality of SG lines may span a plurality of memory arrays. During a memory operation, a first SG line of the plurality of SG lines may be selected causing the adjustable resistance local bit lines across all of the plurality of memory arrays connected to the first SG line to be set into a conducting state. The other SG lines of the plurality of SG lines may be unselected causing the adjustable resistance local bit lines across all of the plurality of memory arrays connected to the other SG lines to be set into a non-conducting state. In some cases, a subset of the plurality of SG lines may be selected (e.g., two of the SG lines) while the other SG lines of the plurality of SG lines may be unselected. In some cases, SG line comb structures may be used in which a plurality of SG line segments within an SG line layer are shorted together. For example, a first SG line segment and a second SG line segment may be shorted together at the ends of a plurality of memory arrays which are spanned by the first SG line segment and the second SG line segment. The memory operation may comprise, for example, a read operation, a write operation, a programming operation, a program verify operation, or an erase verify operation. During the memory operation, memory cells within one or more of the plurality of memory arrays may be read or programmed at the same time.

Figure 8D:
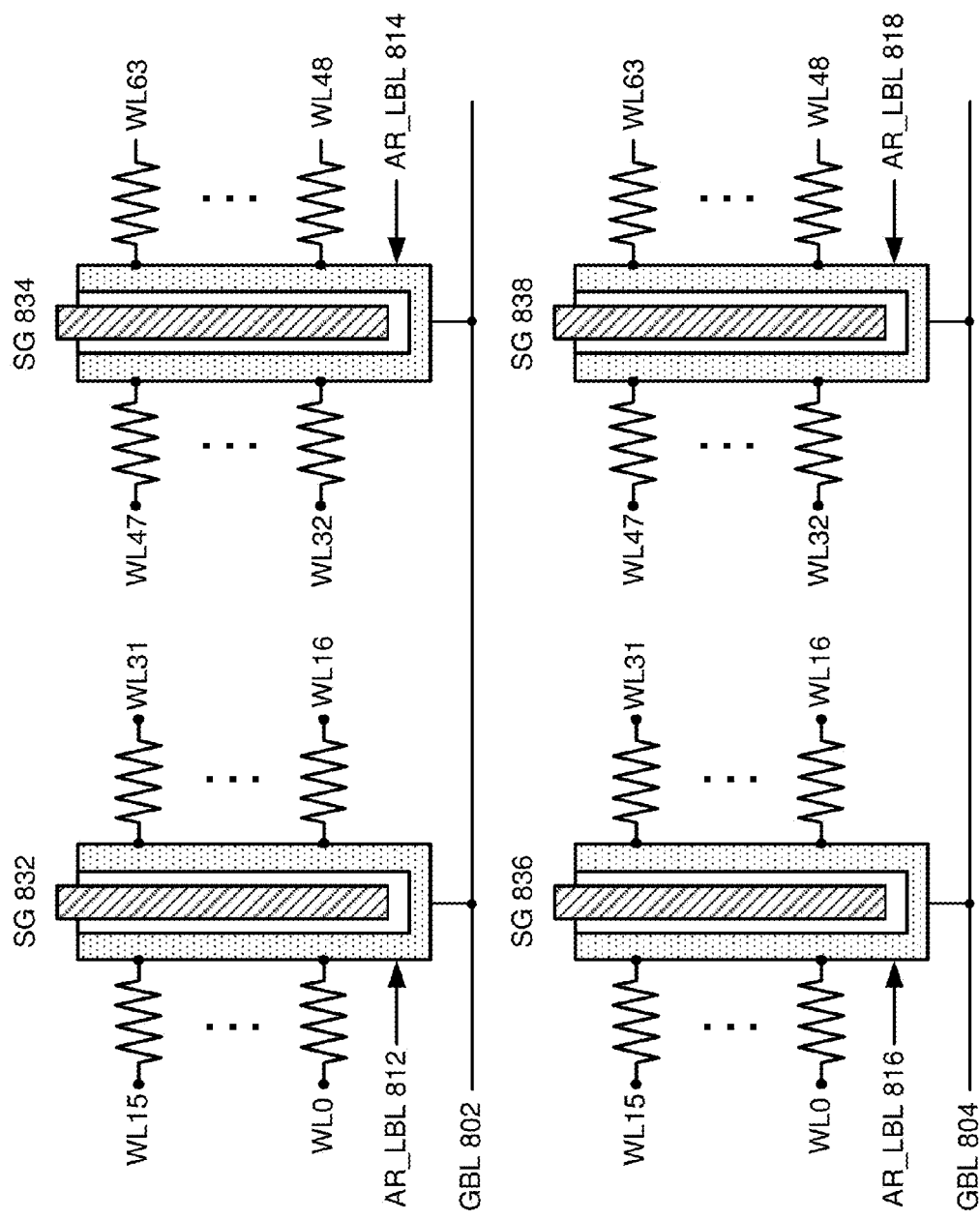

FIG. 8D depicts one embodiment of a portion of a memory array. As depicted, the memory array includes word lines WL0-WL63 and four adjustable resistance bit line structures corresponding with select gates SG 832, SG 834, SG 836, and SG 838. The adjustable resistance bit line structure corresponding with select gate SG 832 includes an adjustable resistance local bit line AR_LBL 812. The adjustable resistance bit line structure corresponding with select gate SG 834 includes an adjustable resistance local bit line AR_LBL 814. The adjustable resistance bit line structure corresponding with select gate SG 836 includes an adjustable resistance local bit line AR_LBL 816. The adjustable resistance bit line structure corresponding with select gate SG 838 includes an adjustable resistance local bit line AR_LBL 818. A first global bit line GBL 802 connects to the adjustable resistance local bit lines AR_LBL 812 and AR_LBL 814. A second global bit line GBL 804 connects to the adjustable resistance local bit lines AR_LBL 816 and AR_LBL 818. In some cases, the global bit lines GBL 802 and GBL 804 may connect to the adjustable resistance local bit lines at the bottom of the adjustable resistance bit line structures. In other cases, the global bit lines GBL 802 and GBL 804 may connect to the adjustable resistance local bit lines at the top of the adjustable resistance bit line structures. As depicted, the word lines WL0-WL31 connect to the adjustable resistance bit line structure corresponding with select gate SG 832 and the adjustable resistance bit line structure corresponding with select gate SG 836. The word lines WL32-WL63 connect to the adjustable resistance bit line structure corresponding with select gate SG 834 and the adjustable resistance bit line structure corresponding with select gate SG 838.

In one embodiment, the select gates SG 832, SG 834, SG 836, and SG 838 may be set to the same voltage or to different voltages. In one example, select gate SG 832 may be set to a first voltage, select gate SG 834 may be set to a second voltage, select gate SG 836 may be set to a third voltage, and select gate SG 838 may be set to a fourth voltage. In another embodiment, each of the select gates SG 832, SG 834, SG 836, and SG 838 may be set to a selected select gate voltage (e.g., 4V) or to an unselected select gate voltage (e.g., 0V) independent of the biasing conditions applied to the other select gates. In one example, the adjustable resistance bit line structure corresponding with select gate SG 836 may be set into a conducting state while the adjustable resistance bit line structures corresponding with select gates SG 832, SG 834, and SG 838 are set into non-conducting states.

In another embodiment, select gates SG 832 and SG 836 may be set to a first voltage and select gates SG 834 and SG 838 may be set to a second voltage different from the first voltage. In this case, the select gates SG 832 and SG 836 may be connected to a first SG line and the select gates SG 834 and SG 838 may be connected to a second SG line. In one example, the adjustable resistance bit line structures corresponding with select gates SG 832 and SG 836 may be set into conducting states while the adjustable resistance bit line structures corresponding with select gates SG 834 and SG 838 may be set into non-conducting states. In another embodiment, select gates SG 832 and SG 834 may be set to a first voltage and select gates SG 836 and SG 838 may be set to a second voltage different from the first voltage. In this case, the select gates SG 832 and SG 834 may be connected to a first SG line and the select gates SG 836 and SG 838 may be connected to a second SG line. In one example, the adjustable resistance bit line structures corresponding with select gates SG 832 and SG 834 may be set into conducting states while the adjustable resistance bit line structures corresponding with select gates SG 836 and SG 838 may be set into non-conducting states.

Figure 8E:
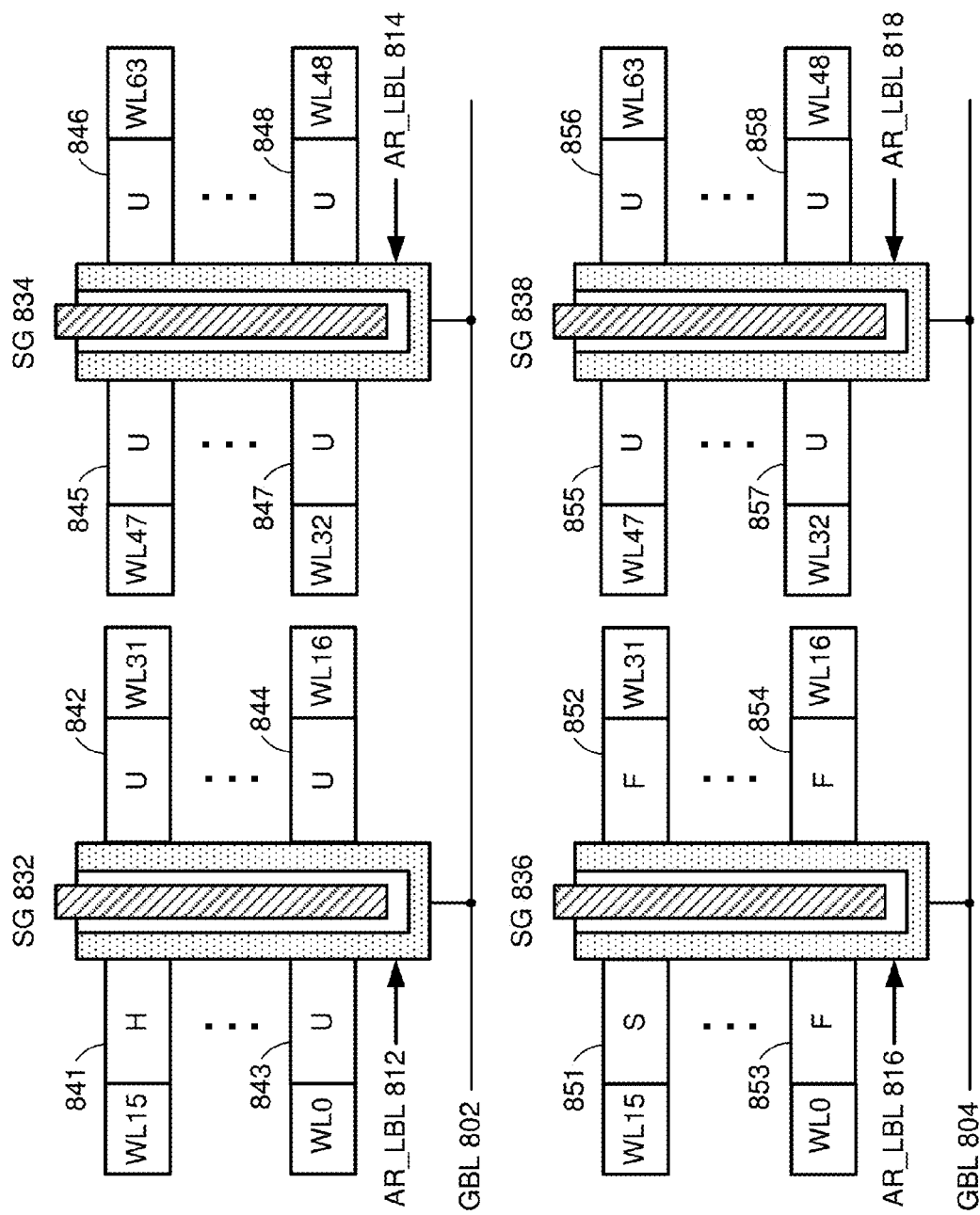

FIG. 8E depicts one embodiment of the portion of a memory array depicted in FIG. 8D during a memory operation. As depicted, the memory array includes word lines WL0-WL63 and four adjustable resistance bit line structures corresponding with select gates SG 832, SG 834, SG 836, and SG 838. During the memory operation, the adjustable resistance bit line structures corresponding with select gates SG 832 and SG 836 have been set into conducting states while the adjustable resistance bit line structures corresponding with select gates SG 834 and SG 838 have been set into non-conducting states. In some cases, a first SG line not depicted may directly connect to both the select gate 832 and the select gate 836 (e.g., the first SG line may extend in the word line direction). Selected word line WL15 has been set to a selected word line voltage and the selected global bit line GBL 804 has been set to a selected global bit line voltage. Unselected word lines WL0-14 and WL16-63 have been set to unselected word line voltages and unselected global bit line GBL 802 has been set to an unselected global bit line voltage. Under these biasing conditions, the memory cell 851 connected to word line WL15 and the adjustable resistance local bit line AR_LBL 816 may comprise an S cell, the memory cells 852-854 connected to the adjustable resistance local bit line AR_LBL 816 may comprise F cells, the memory cell 841 connected to word line WL15 and the adjustable resistance local bit line AR_LBL 812 may comprise an H cell, the memory cells 842-844 connected to the adjustable resistance local bit line AR_LBL 812 may comprise U cells, the memory cells 855-858 connected to the adjustable resistance local bit line AR_LBL 818 may comprise U cells, and the memory cells 845-848 connected to the adjustable resistance local bit line AR_LBL 814 may comprise U cells.

In one embodiment, during a read operation, the selected word line voltage may be 0V, the selected global bit line voltage may be 3V, the unselected word line voltage may be 3V, and the unselected global bit line voltage may be 0V. In one embodiment, during a RESET operation, the selected word line voltage may be 0V, the selected global bit line voltage may be 5V, the unselected word line voltage may be 3V, and the unselected global bit line voltage may be 0V. In one embodiment, during a SET operation, the selected word line voltage may be 5V, the selected global bit line voltage may be 0V, the unselected word line voltage may be 0V, and the unselected global bit line voltage may be 5V.

In some cases, the select gates SG 832 and SG 836 may be set to a selected select gate voltage during the memory operation and the select gates SG 834 and SG 838 may be set to an unselected select gate voltage. In one example, during a read operation, the selected select gate voltage may be 5V and the unselected select gate voltage may be 0V. In another example, during a RESET operation, the selected select gate voltage may be 7V and the unselected select gate voltage may be 0V. In another example, during a SET operation, the selected select gate voltage may be 5V and the unselected select gate voltage may be 0V. The selected select gate voltage used during a RESET operation may be different from the selected select gate voltage used during a SET operation. The selected select gate voltage used during a RESET operation may be greater than the selected select gate voltage used during a SET operation.

In some embodiments, the selected select gate voltage applied to a select gate during a programming operation may be determined based on a maximum current limit through a selected memory cell. The maximum current limit through the selected memory cell may depend on whether the programming operation comprises a SET operation (e.g., a maximum current limit of 10 µA or a maximum current limit of 50 µA) or a RESET operation (e.g., a maximum current limit of 50 µA or a maximum current limit of 150 µA). In one example, the selected select gate voltage may be used to provide current limiting in order to prevent over-programming of the selected memory cell during the programming operation. In some cases, a memory array may include a first select gate line connected to a first select gate of a first adjustable resistance bit line structure and a second select gate line connected to a second select gate of a second adjustable resistance bit line structure. In another example, during a memory operation, the first select gate line may be set to an unselected select gate voltage (e.g., 0V) and the second select gate line may be set to a current limiting voltage (e.g., 4V) in order to limit the maximum current through a selected memory cell connected to the second adjustable resistance bit line structure (e.g., to limit the current through the selected memory cell to be at most 10 µA). In another example, during a memory operation, the first select gate line may be set to a first current limiting voltage (e.g., 3.5V) in order to limit the maximum current through a selected memory cell connected to the first adjustable resistance bit line structure (e.g., to limit the current through the selected memory cell to be at most 5 µA) and the second select gate line may be set to an unselected select gate voltage (e.g., 0V).

FIG. 8F depicts one embodiment of the portion of the memory array depicted in FIG. 8D during a memory operation. As depicted, the memory array includes word lines WL0-WL15 and two adjustable resistance bit line structures corresponding with select gates SG 832 and SG 836. The select gates SG 832 and SG 836 are shorted together via a select gate line SGL 803. During the memory operation, the select gate line SGL 803 is biased to 7V, the selected word line WL15 is biased to 0V, the unselected word line WL0 is biased to 1.33V, the selected global bit line GBL 804 is biased to 2V, and the unselected global bit line GBL 802 is biased to 0.66V. In this case, the voltage across the S cell is 2.0V (i.e., 2.0V-0V), the voltage across the F cell is 0.66V (i.e., 2V-1.33V), the voltage across the U cell is 0.66V (i.e., 1.33V-0.66V), and the voltage across the H cell is 0.66V (i.e., 0.66V-0V). Thus, the voltage stress across the F cell, the U cell, and the H cell may be the same or substantially the same. In one example, the voltage stress across the F cell, the U cell, and the H cell may be set to one third of the voltage across the S cell (e.g., if 2V is applied across an S cell, then one third of the 2V across the S cell is roughly 0.66V). In some cases, the memory operation may comprise a read operation or a RESET operation.

In some embodiments, a selected global bit line may be set to a voltage that is greater than the voltage applied at the channel location associated with the lowest F cell (e.g., the channel location associated with WL0 in FIG. 8F) or set to a voltage that is greater than the voltage applied to a channel location associated with the F cell closest to the selected global bit line. In one example, the selected global bit line may be biased to 4V and the channel location associated with the F cell closest to the selected global bit line may be biased to 2V due to IR drop between the selected global bit line and the channel location associated with the lowest F cell.

In one embodiment, during a read operation, the voltage difference across F cells may be minimized or set to 0V in order to minimize the impact of leakage currents from affecting the sensing of a selected memory cell. In one example, the voltages applied to unselected word lines, such as unselected word line WL0, may be determined based on voltage drops occurring along an adjustable resistance local bit line.

FIG. 8G depicts another embodiment of the portion of the memory array depicted in FIG. 8D during a memory operation. As depicted, the memory array includes word lines WL0-WL15 and two adjustable resistance bit line structures corresponding with select gates SG 832 and SG 836. The select gates SG 832 and SG 836 are shorted together via a select gate line SGL 803. During the memory operation, the select gate line SGL 803 is biased to 5V, the selected word line WL15 is biased to 2V, the unselected word line WL0 is biased to 0.66V, the selected global bit line GBL 804 is biased to 0V, and the unselected global bit line GBL 802 is biased to 1.33V. In this case, the voltage across the S cell is 2.0V (i.e., 2.0V-0V), the voltage across the F cell is 0.66V (i.e., 0.66V-0V), the voltage across the U cell is 0.66V (i.e., 1.33V-0.66V), and the voltage across the H cell is 0.66V (i.e., 2V-1.33V). Thus, the voltage stress across the F cell, the U cell, and the H cell may be the same or substantially the same. In one example, the voltage stress across the F cell, the U cell, and the H cell may be set to one third of the voltage across the S cell (e.g., if 2V is applied across an S cell, then one third of the 2V across the S cell is roughly 0.66V). In some cases, the memory operation may comprise a SET operation.

Figure 8H:
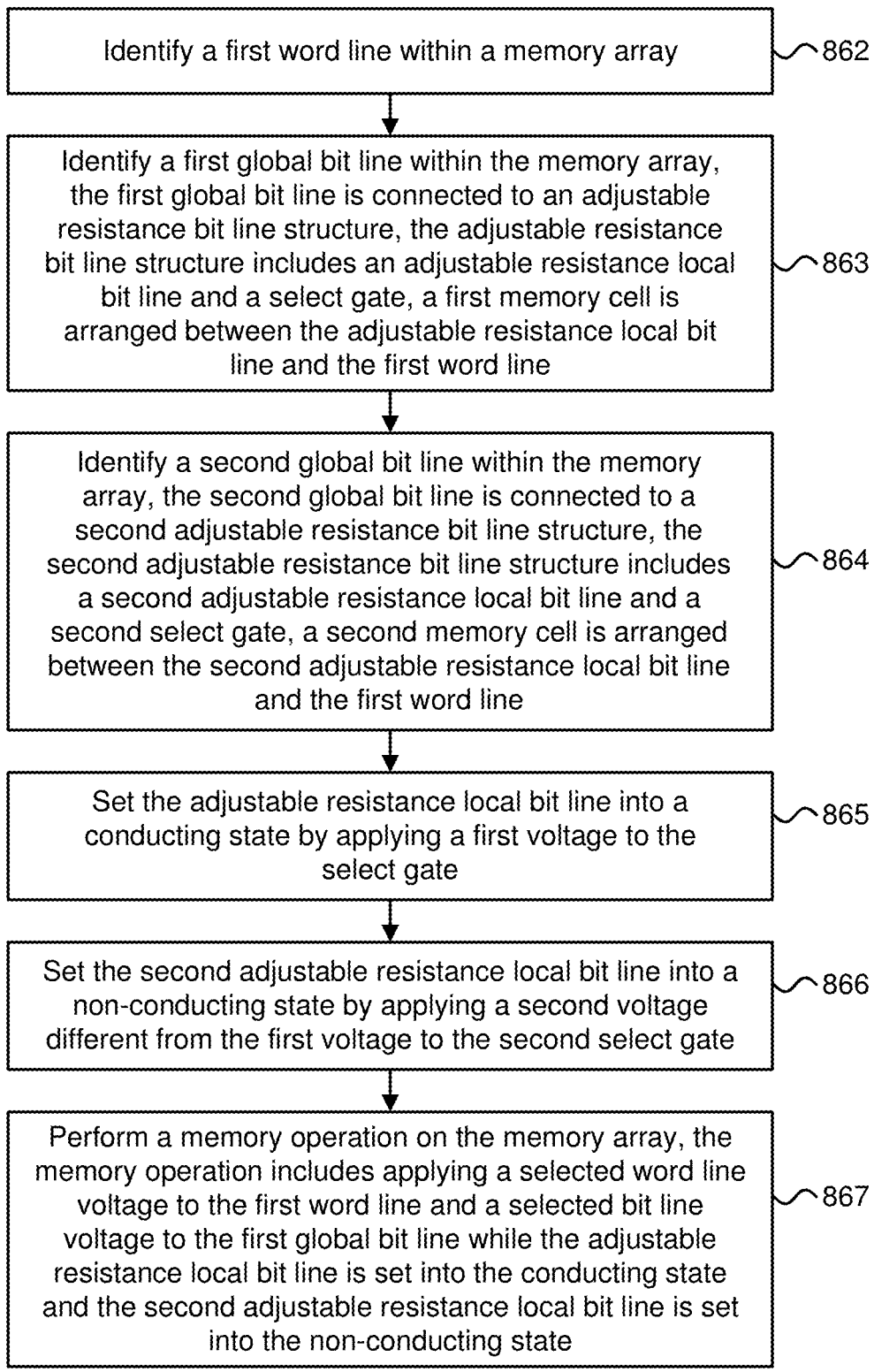
FIG. 8H depicts a flowchart describing one embodiment of a process for performing a memory operation.

FIG. 8H depicts a flowchart describing one embodiment of a process for performing a memory operation. In one embodiment, the process of FIG. 8H may be performed by a memory system, such as memory system 101 in FIG. 1A.

In step 862, a first word line within a memory array is identified. The first word line may correspond with a word line to be selected during a memory operation. In step 863, a first global bit line within the memory array is identified. The first global bit line may correspond with a global bit line to be selected during a memory operation. The first word line and the first global bit line may be identified based on a memory instruction and/or a memory address. The first global bit line may be connected to an adjustable resistance bit line structure. The adjustable resistance bit line structure may include an adjustable resistance local bit line and a select gate. A first memory cell may be arranged between the adjustable resistance local bit line and the first word line. In step 864, a second global bit line within the memory array is identified. The second global bit line may be connected to a second adjustable resistance bit line structure different from the first adjustable resistance bit line structure. The second adjustable resistance bit line structure may include a second adjustable resistance local bit line and a second select gate. A second memory cell may be arranged between the second adjustable resistance local bit line and the first word line.

In step 865, the adjustable resistance local bit line is set into a conducting state by applying a first voltage to the select gate. In one example, the first voltage may comprise 5V or 7V. In step 866, the second adjustable resistance local bit line is set into a non-conducting state by applying a second voltage different from the first voltage to the second select gate. In one example, the second voltage may comprise 0V. In some cases, the second adjustable resistance local bit line may be set into a highly resistive state (e.g., more than 1 Gohm or more than 10 Gohm) by applying 0V to the second select gate. In some embodiments, the setting of the second adjustable resistance local bit line into the non-conducting state may be performed prior to the setting of the adjustable resistance local bit line into the conducting state. In some embodiments, a plurality of adjustable resistance local bit lines may be set into non-conducting states prior to setting one or more adjustable resistance local bit lines of the plurality of adjustable resistance local bit lines into conducting states. The one or more adjustable resistance local bit lines may correspond with adjustable resistance local bit lines that are connected to a word line to be selected during the memory operation. In step 867, a memory operation is performed on the memory array. The memory operation may include applying a selected word line voltage to the first word line and a selected bit line voltage to the first global bit line while the adjustable resistance local bit line is set into a conducting state and the second adjustable resistance local bit line a set into the non-conducting state. The memory operation may comprise a read operation, a write operation, a programming operation, a SET operation, a RESET operation, an erase operation, a program verify operation, or an erase verify operation.

In some embodiments, the setting the second adjustable resistance local bit line into the non-conducting state may comprise precharging the second select gate to the second voltage prior to setting the adjustable resistance local bit line into the conducting state by applying the first voltage to the select gate. In one example, a first vertical TFT may selectively connect the select gate to a select gate line and a second vertical TFT may selectively connect the second select gate to the select gate line. In this case, the second select gate may be precharged to the second voltage by setting the second vertical TFT into a conducting state while driving the select gate line to the second voltage. After the second select gate has been precharged to the second voltage, then the select gate may be biased to the first voltage by setting the second vertical TFT into a non-conducting state and the first vertical TFT into a conducting state while driving the select gate line to the first voltage.

In some embodiments, a select gate line may directly connect to the select gate and the second select gate (e.g., a thin-film transistor may not be positioned between the select gate line and the second select gate). In this case, during the memory operation, both the adjustable resistance local bit line and the second adjustable resistance local bit line may be set into conducting states. The memory array may include a third adjustable resistance bit line structure connected to the second global bit line. The third adjustable resistance bit line structure may include a third adjustable resistance local bit line and a third select gate. A third memory cell may be arranged between the third adjustable resistance local bit line and a second word line of the memory array (e.g., an unselected word line). In this case, while both the adjustable resistance local bit line and the second adjustable resistance local bit line are set into a conducting state, the third adjustable resistance local bit line may be set into a non-conducting state (e.g., by applying 0V to the third select gate).

In one embodiment, the first global bit line may be connected to a fourth adjustable resistance bit line structure. The fourth adjustable resistance bit line structure may include a fourth adjustable resistance local bit line and a fourth select gate. A fourth memory cell may be arranged between the fourth adjustable resistance local bit line and a second word line (e.g., an unselected word line). In this case, while both the adjustable resistance local bit line and the second adjustable resistance local bit line are set into a conducting state, the fourth adjustable resistance local bit line may be set into a non-conducting state (e.g., by applying 0V to the fourth select gate).

Figure 8I:
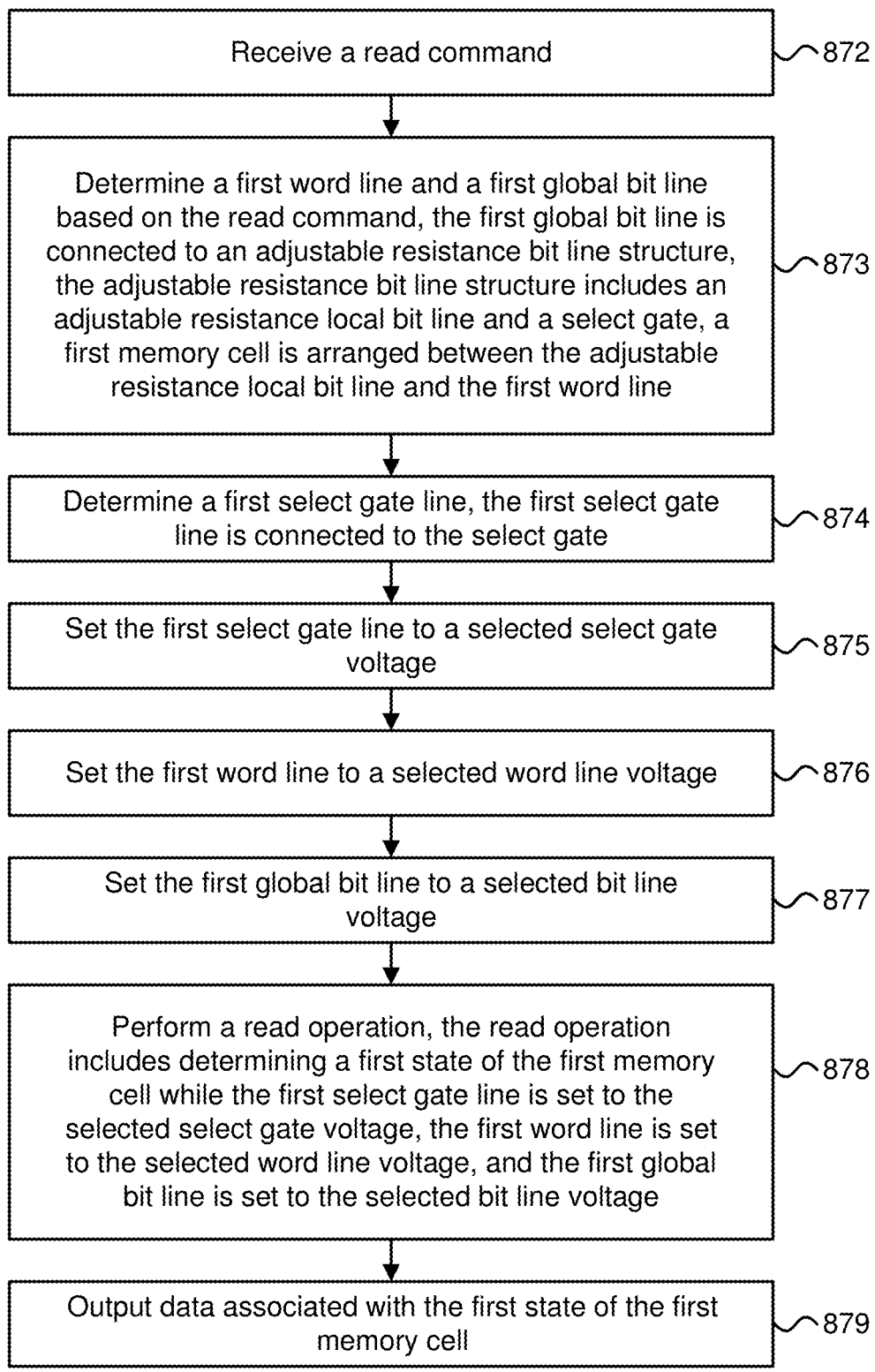
FIG. 8I depicts a flowchart describing one embodiment of a process for performing a read operation.

FIG. 8I depicts a flowchart describing one embodiment of a process for performing a read operation. In one embodiment, the process of FIG. 8I may be performed by a memory system, such as memory system 101 in FIG. 1A.

In step 872, a read command is received. In step 873, a first word line and a first global bit line are determined based on the read command. The first global bit line may be connected to an adjustable resistance bit line structure. The adjustable resistance bit line structure may include an adjustable resistance local bit line and a select gate. A first memory cell may be arranged between the adjustable resistance local bit line and the first word line. In step 874, a first select gate line is determined. The first select gate line may be connected to the select gate. In step 875, the first select gate line is set to a selected select gate voltage (e.g., 4V). In step 876, the first word line is set to a selected word line voltage (e.g., 0V). In step 877, the first global bit line is set to a selected bit line voltage (e.g., 3V). In step 878, a read operation is performed in response to receiving the read command. The read operation may include determining a first state of the first memory cell while the first select gate line is set to the selected select gate voltage, the first word line is set to the selected word line voltage, and the first global bit line is set to the selected bit line voltage. In this case, setting the first select gate line connected to the select gate to the selected select gate voltage may cause the adjustable resistance local bit line to be set into a conducting state during the read operation. In one example, the first state of the first memory cell may be determined using sensing circuitry (e.g., a sense amplifier) or a current comparison circuit that compares the current through the first memory cell with a reference current. In step 879, data associated with the first state of the first memory cell is outputted.

Figure 8J:
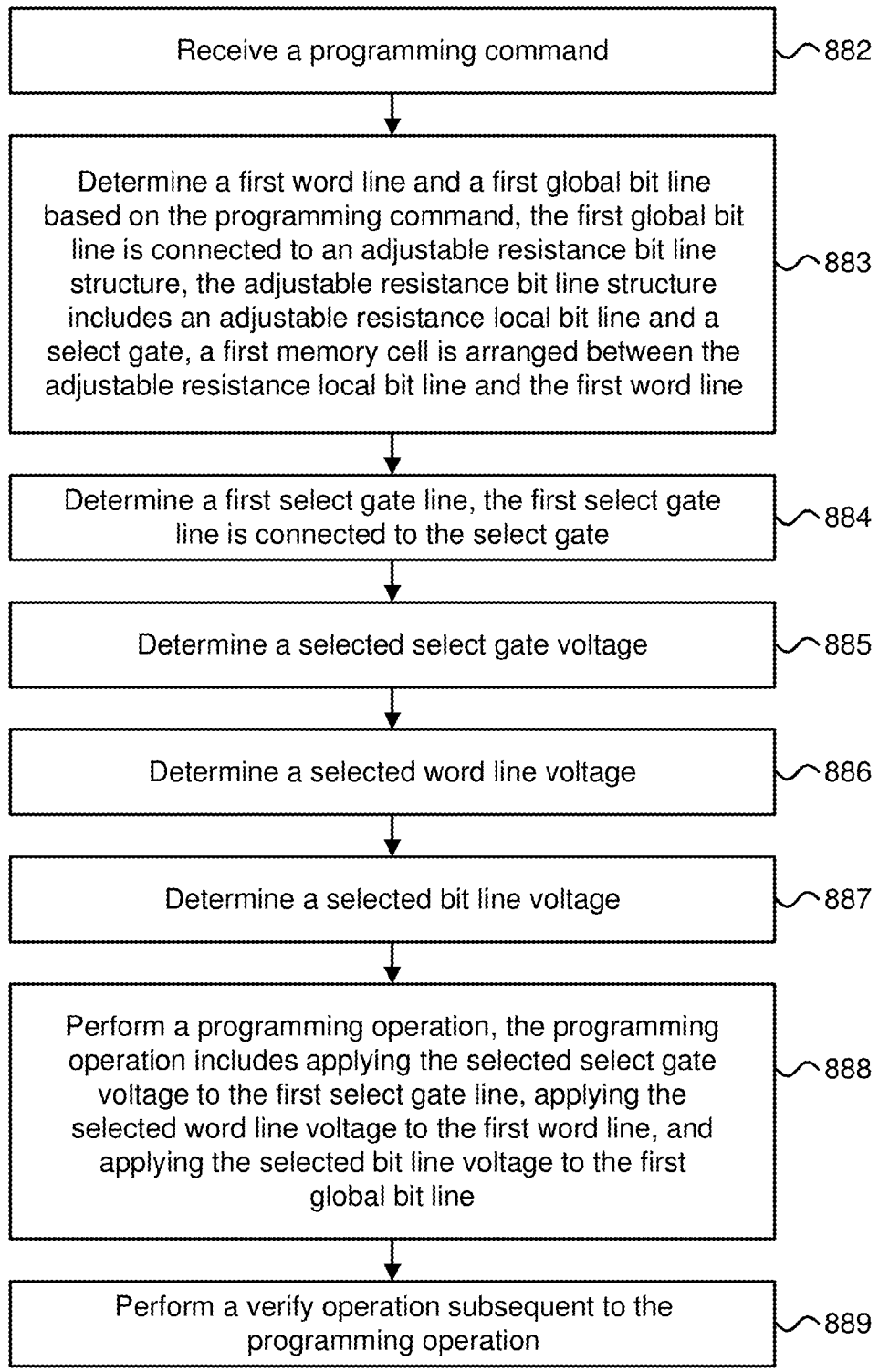
FIG. 8J depicts a flowchart describing one embodiment of a process for performing a programming operation.

FIG. 8J depicts a flowchart describing one embodiment of a process for performing a programming operation. In one embodiment, the process of FIG. 8J may be performed by a memory system, such as memory system 101 in FIG. 1A.

In step 882, a programming command is received. In step 883, a first word line and a first global bit line are determined based on the programming command. The first global bit line may be connected to an adjustable resistance bit line structure. The adjustable resistance bit line structure may include an adjustable resistance local bit line and a select gate. A first memory cell may be arranged between (or disposed between) the adjustable resistance local bit line and the first word line. In step 884, a first select gate line is determined. The first select gate line may be connected to the select gate. In step 885, a selected select gate voltage is determined. The selected select gate voltage may be determined based on whether a SET or RESET operation is to be performed. If a SET operation is to be performed, then the selected select gate voltage may be set to 5V. If a RESET operation is to be performed, then the selected select gate voltage may be set to 7V. In step 886, a selected word line voltage is determined. The selected word line voltage may be determined based on whether a SET or RESET operation is to be performed. In step 897, a selected bit line voltage is determined. The selected bit line voltage may be determined based on whether a SET or RESET operation is to be performed. In step 888, a programming operation is performed in response to receiving the programming command. The programming operation may include applying the selected select gate voltage to the first select gate line, applying the selected word line voltage to the first word line, and applying the selected bit line voltage to the first global bit line. In this case, setting the first select gate line connected to the select gate to the selected select gate voltage may cause the adjustable resistance local bit line to be set into a conducting state during the programming operation. In step 889, a verify operation is performed subsequent to the programming operation to verify that the first memory cell was programmed into the correct programming state.

In one embodiment, the programming operation may comprise a RESET operation. In another embodiment, the programming operation may comprise a SET operation. In some cases, the selected select gate voltage applied to the first select gate line during the programming operation may be set in order to limit the maximum current through the first memory cell being programmed during the programming operation. The selected select gate voltage may be determined based on the type of programming operation to be performed. For example, if a RESET operation is to be performed, then the selected select gate voltage may comprise a first voltage associated with a first current limiting value (e.g., 20 µA). If a SET operation is to be performed, then the selected select gate voltage may comprise a second voltage less than the first voltage associated with a second current limiting value (e.g., 10 µA).

Figure 8K:
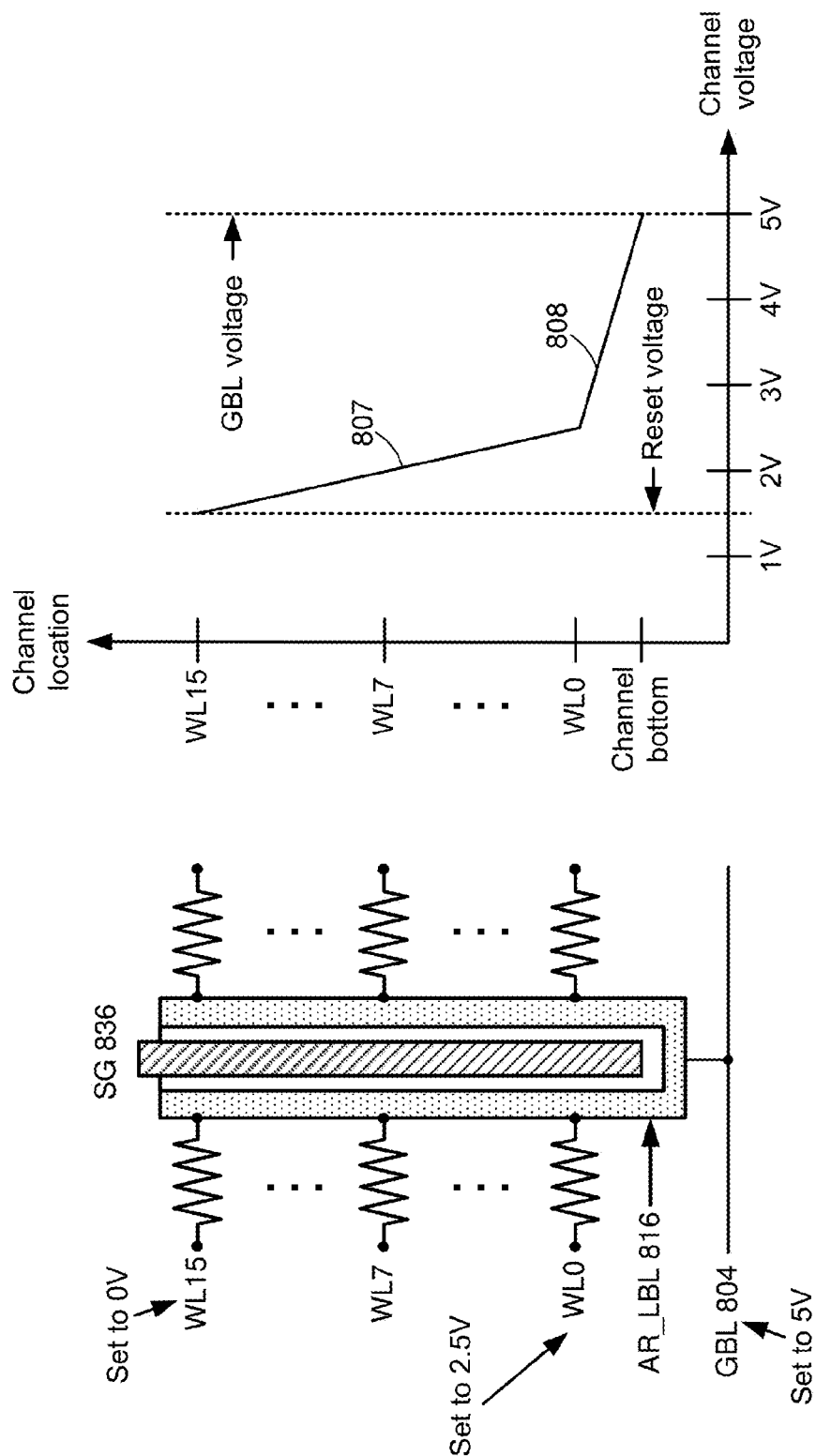

FIG. 8K depicts one embodiment of an adjustable resistance bit line structure during a RESET operation. As depicted, the selected word line WL15 has been set to a selected word line voltage (e.g., 0V) and the selected global bit line GBL 804 has been set to a selected bit line voltage (e.g., 5V). The select gate SG 836 may be set to a selected select gate voltage such that the adjustable resistance local bit line AR_LBL 816 is set into a conducting state. However, although the adjustable resistance local bit line AR_LBL 816 is set into the conducting state, a channel resistance of a channel of the adjustable resistance local bit line AR_LBL 816 may cause voltage drops to occur along the channel. As depicted, the channel voltage at the bottom of the channel is 5V, the channel voltage at a channel location corresponding with word line WL0 is 2.5V, and the channel voltage at a channel location corresponding with word line WL15 is 1.5V. The voltage across the selected memory cell may comprise the difference between the selected word line voltage and the channel voltage at the channel location corresponding with word line WL15 (i.e., 1.5V). The slope 808 of the channel voltage between the bottom of the channel and the channel location corresponding with the bottommost word line may be set based on an unselected word line voltage applied to the word line WL0. In one example, if the unselected word line voltage applied to the word line WL0 is 2.5V, then the channel voltage at the channel location corresponding with word line WL0 may be set to 2.5V or a voltage close to 2.5V. In some cases, the voltage applied to the word line WL0 may be set in order to set the channel voltage at the channel location corresponding with word line WL0 to a particular channel voltage (e.g., in order to set the channel voltage at the channel location corresponding with word line WL0 to 2V or to 3V). The slope 807 of the channel voltage between the channel location corresponding with word line WL15 and the channel location corresponding with word line WL0 may also be set based on the unselected word line voltage applied to the word line WL0 and the conductivity of the channel. The slope 807 may also be determined based on the selected select gate voltage applied to the select gate SG 836. The slope 807 may also be determined based a temperature of a memory array or a memory chip. The slope 807 may also be determined based on the current through the selected memory cell or the maximum current allowed through the selected memory cell (e.g., 100 nA, 2 µA, or 50 µA).

In one embodiment, the voltage applied to the word line closest to the global bit line connection made at the bottom of the adjustable resistance bit line structure may be used to set or adjust the slope 807 of the channel voltage between the channel location corresponding with the selected word line (e.g., WL15 in FIG. 8K) and the channel location corresponding with the bottommost word line (e.g., WL0 in FIG. 8K). The memory cell connected to the word line closest to the global bit line may be left unformed or comprise a dummy memory cell. One benefit of setting the voltage applied to the word line closest to the global bit line connection to a voltage less than the selected bit line voltage is that the voltage stress applied to unselected memory cells (e.g., F cells) may be reduced.

In some embodiments, the adjustable resistance bit line structure and the voltages applied to the word lines WL0-WL15 and the global bit line GBL 804 depicted in FIG. 8K may be used during a read operation in which a state of a selected memory cell connected to word line WL15 may be determined. In other embodiments, during a read operation, a selected word line may be set to 0V, a selected global bit line may be set to 3V, the word line closest to the bottom of the adjustable resistance bit line structure may be set to 2V, and the other unselected word lines may be set to 0.5V.

In some embodiments, the selected select gate voltage that is applied to the select gate SG 836 may be determined based on the voltage applied to the word line closest to the global bit line, the temperature of a memory array or a memory chip (e.g., sensed using a temperature sensor located on a memory chip), the maximum current limit setting for the current allowed through the selected memory cell, and/or the type of memory operation to be performed (e.g., a read operation, a SET operation, a RESET operation, or an erase operation).

Figure 8L:
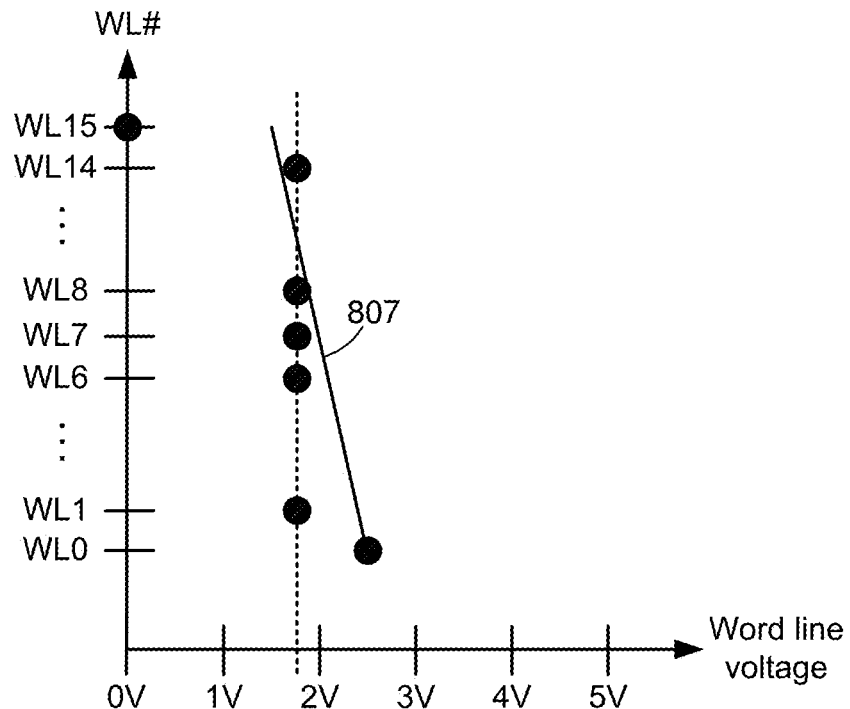

FIG. 8L depicts one embodiment of word line voltage settings that may be used during the RESET operation depicted in FIG. 8K. As depicted, the selected word line WL15 has been set to 0V, the unselected word line WL0 has been set to 2.5V in order to set the channel voltage at a channel location corresponding with word line WL0 to be close to or substantially the same as 2.5V, and the other unselected word lines WL1-WL14 have been set to 1.75V. In this case, a voltage difference across the memory cell connected to word line WL1 may comprise 0.65V (i.e., 1.75V-2.4V). In some cases, this voltage difference may lead to program disturb of the memory cell connected to word line WL1.

Figure 8M:
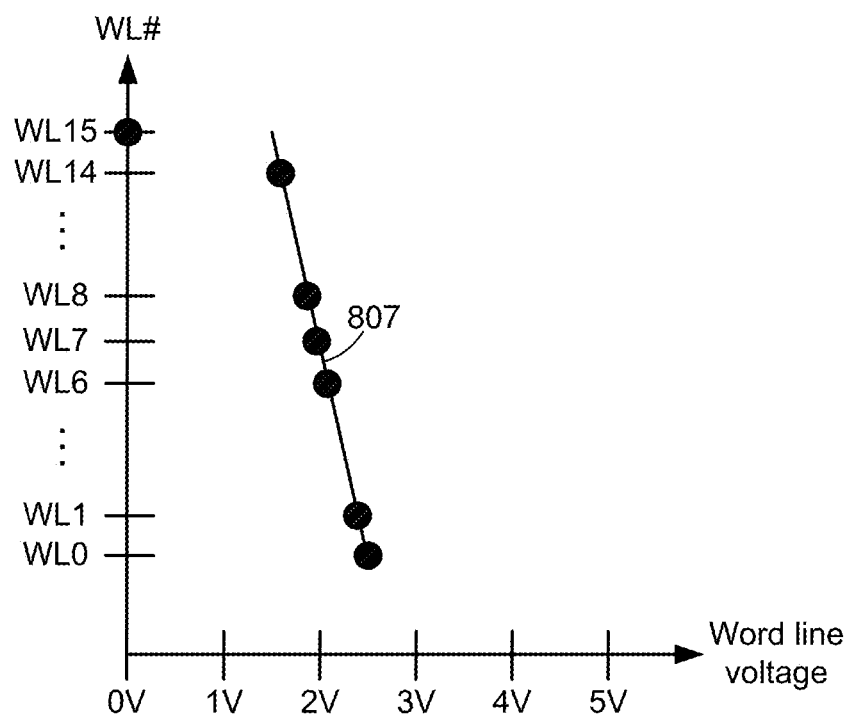

FIG. 8M depicts another embodiment of word line voltage settings that may be used during the RESET operation depicted in FIG. 8K. As depicted, the selected word line WL15 has been set to 0V, the unselected word line WL0 has been set to 2.5V in order to set the channel voltage at a channel location corresponding with word line WL0 to be close to or substantially the same as 2.5V, and the other unselected word lines WL1-WL14 have been set to voltages that correspond with the slope 807 of the channel voltage between the channel location corresponding with the topmost word line (e.g., WL15 in FIG. 8K) and the channel location corresponding with the bottommost word line (e.g., WL0 in FIG. 8K). In some cases, the voltages applied to unselected word lines WL1-WL14 may be set in order to minimize the voltage stress across each of the memory cells connected to the unselected word lines WL1-WL14. In one example, the voltages applied to the unselected word lines WL1-WL14 may be set in order to place 0V or substantially close to 0V across each of the memory cells connected to the unselected word lines WL1-WL14. Setting the unselected word lines to location-dependent voltages that minimize the voltage differences across unselected memory cells may reduce program disturb and improve memory cell reliability. As depicted, the unselected word line voltages applied to the unselected word lines between word line WL15 and word line WL0 depend on the location of the unselected word line. For example, the unselected word line voltage applied to word line WL1 may comprise 2.4V and the unselected word line voltage applied to word line WL14 may comprise 1.6V.

In some embodiments, the voltages applied to unselected word lines during a RESET operation, such as the unselected word lines WL1-WL14 in FIG. 8M, may be set in order to place at most a first voltage (e.g., at most 500 mV or at most 1V) across each of the memory cells connected to the unselected word lines. In other embodiments, the voltages applied to a first set of unselected word lines during a RESET operation may be set in order to place at most a first voltage (e.g., at most 500 mV or at most 1V) across each of the memory cells connected to the first set of unselected word lines. In one example, if a selected word line comprises word line WL7, then the first set of word lines may comprise word lines WL0-WL6.

Figure 8N:
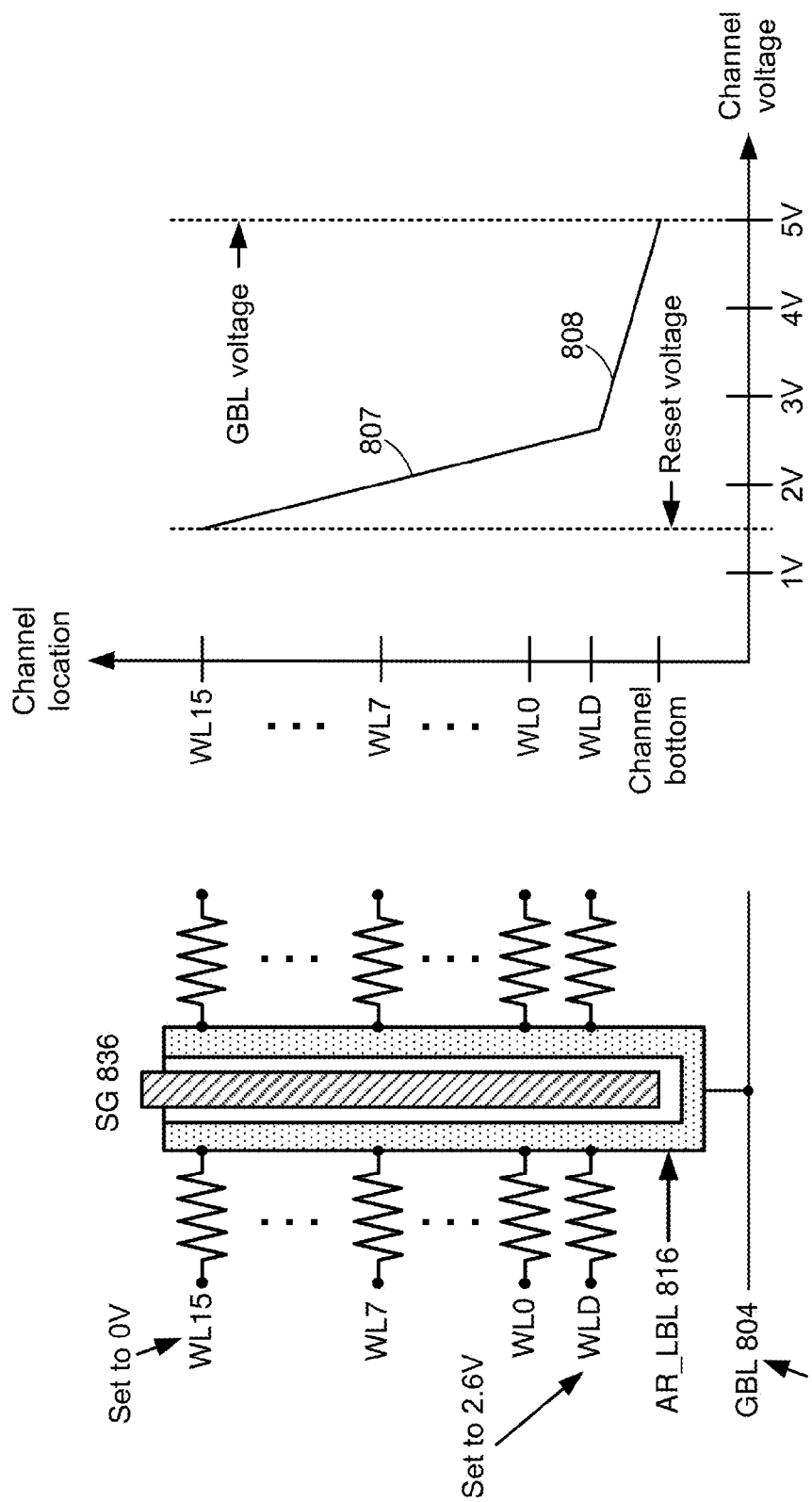
Figure 80:
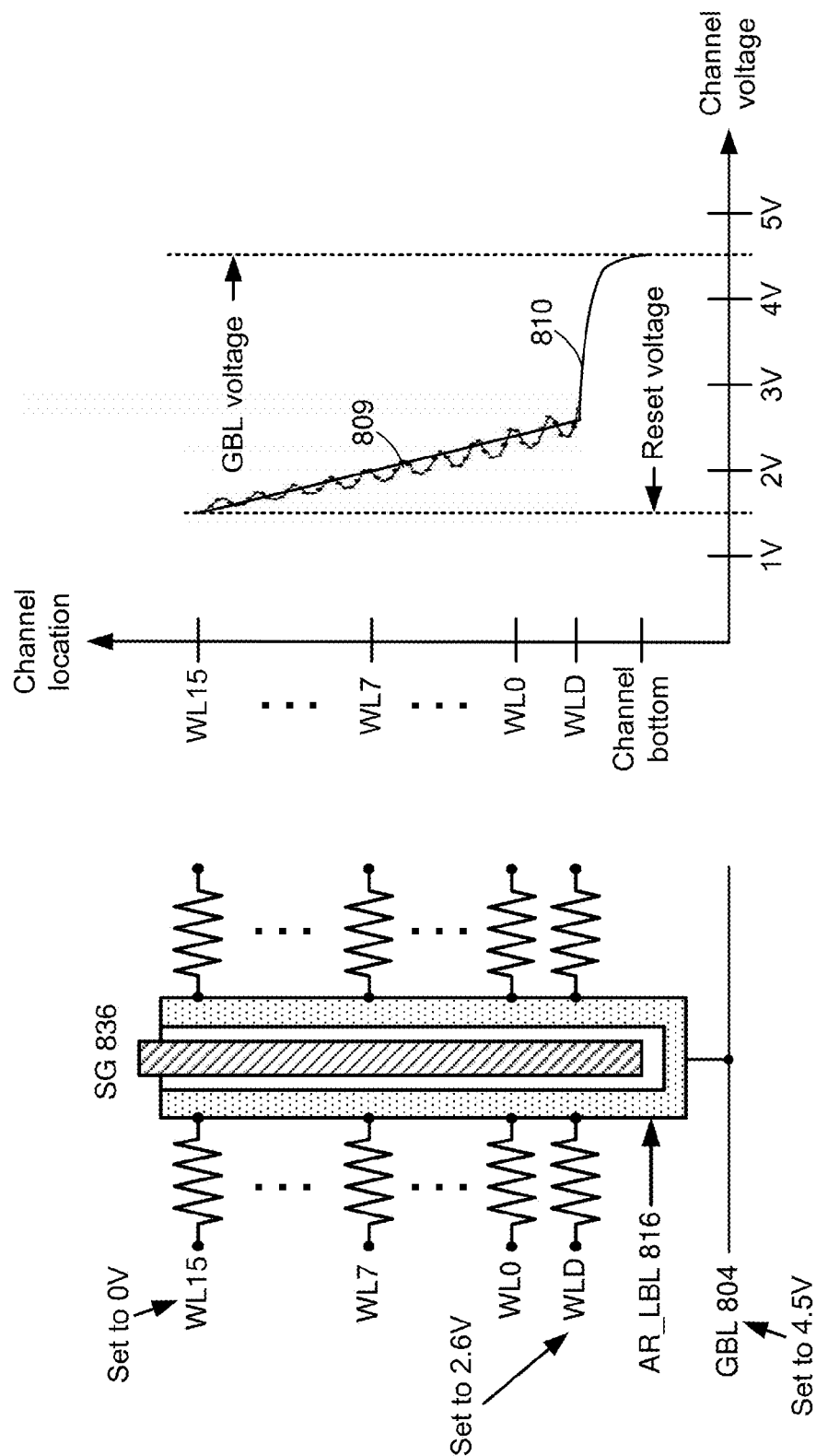

FIG. 8N depicts another embodiment of an adjustable resistance bit line structure during a RESET operation. As depicted, a dummy word line WLD positioned as the bottommost word line closest to the global bit line connection has been set to 2.6V, the selected word line WL15 has been set to a selected word line voltage (e.g., 0V), and the selected global bit line GBL 804 has been set to a selected bit line voltage (e.g., 5V). The dummy word line WLD may be set to 2.6V in order to set the channel voltage at the channel location corresponding with word line WL0 to be close to or substantially the same as 2.5V. The select gate SG 836 may be set to a selected select gate voltage such that the adjustable resistance local bit line AR_LBL 816 is set into a conducting state. However, although the adjustable resistance local bit line AR_LBL 816 is set into the conducting state, a channel resistance of a channel of the adjustable resistance local bit line AR_LBL 816 may cause voltage drops to occur along the channel. As depicted, the channel voltage at the bottom of the channel is 5V, the channel voltage at a channel location corresponding with dummy word line WLD is 2.6V, the channel voltage at a channel location corresponding with word line WL0 is 2.5V, and the channel voltage at a channel location corresponding with word line WL15 is 1.5V. The voltage across the selected memory cell may comprise the difference between the selected word line voltage and the channel voltage at the channel location corresponding with word line WL15 (i.e., 1.5V).

The slope 808 of the channel voltage between the bottom of the channel and the channel location corresponding with bottommost word line may be set based on an unselected word line voltage applied to the dummy word line WLD. In one example, if the unselected word line voltage applied to the dummy word line WLD is 2.6V, then the channel voltage at the channel location corresponding with word line WLD may be set to 2.6V or to a voltage close to 2.6V. The slope 807 of the channel voltage between the channel location corresponding with word line WL15 and the channel location corresponding with dummy word line WLD may also be set based on the unselected word line voltage applied to the dummy word line WLD and the conductivity of the channel. The slope 807 may also be determined based on the selected select gate voltage applied to the select gate SG 836. The slope 807 may also be determined based on the current through the selected memory cell (e.g., 100 nA, 2 µA, or 50 µA). In some embodiments, the slope 807 corresponding with the channel voltage along the channel between the channel location corresponding with word line WL15 and the channel location corresponding with dummy word line WLD may be adjusted based on the selected select gate voltage applied to the select gate SG 836 (e.g., the slope may be increased by applying a higher select gate voltage to the select gate SG 836; an increased slope corresponds with a smaller voltage drop across the channel of an adjustable resistance local bit line).

In one embodiment, the voltage applied to the dummy word line WLD may be used to set or adjust the slope 807 of the channel voltage between the channel location corresponding with the selected word line (e.g., word line WL15 in FIG. 8N) and the channel location corresponding with the bottommost word line (e.g., word line WLD in FIG. 8N). The memory cell connected to the dummy word line may be left unformed or set into a high resistance state. One benefit of setting the voltage applied to the dummy word line to a voltage less than the selected bit line voltage is that the voltage stress applied to unselected memory cells may be reduced.

FIG. 8O depicts another embodiment of an adjustable resistance bit line structure during a RESET operation. As depicted, a dummy word line WLD positioned as the bottommost word line closest to the global bit line connection has been set to 2.6V, the selected word line WL15 has been set to a selected word line voltage (e.g., 0V), and the selected global bit line GBL 804 has been set to a selected bit line voltage (e.g., 4.5V). The select gate SG 836 may be set to a selected select gate voltage such that the adjustable resistance local bit line AR_LBL 816 is set into a conducting state. As depicted, the channel voltage at the bottom of the channel is 4.5V, the channel voltage at a channel location corresponding with dummy word line WLD is 2.6V, the channel voltage at a channel location corresponding with word line WL0 is 2.5V, and the channel voltage at a channel location corresponding with word line WL15 is 1.5V. The slope 809 may represent an average channel voltage along the channel between the channel location corresponding with word line WL15 and the channel location corresponding with dummy word line WLD. The channel voltage 810 along the channel between the channel location corresponding with dummy word line WLD and the bottom of the channel may be set based on the unselected word line voltage applied to the dummy word line WLD and the channel resistance between the channel location corresponding with dummy word line WLD and the bottom of the channel. In some embodiments, the slope 809 corresponding with an average channel voltage along the channel between the channel location corresponding with word line WL15 and the channel location corresponding with dummy word line WLD may be adjusted based on the selected select gate voltage applied to the select gate SG 836 (e.g., the slope may be increased by applying a higher select gate voltage to the select gate SG 836; an increased slope corresponds with a smaller voltage drop across the channel of an adjustable resistance local bit line).

Figure 8P:
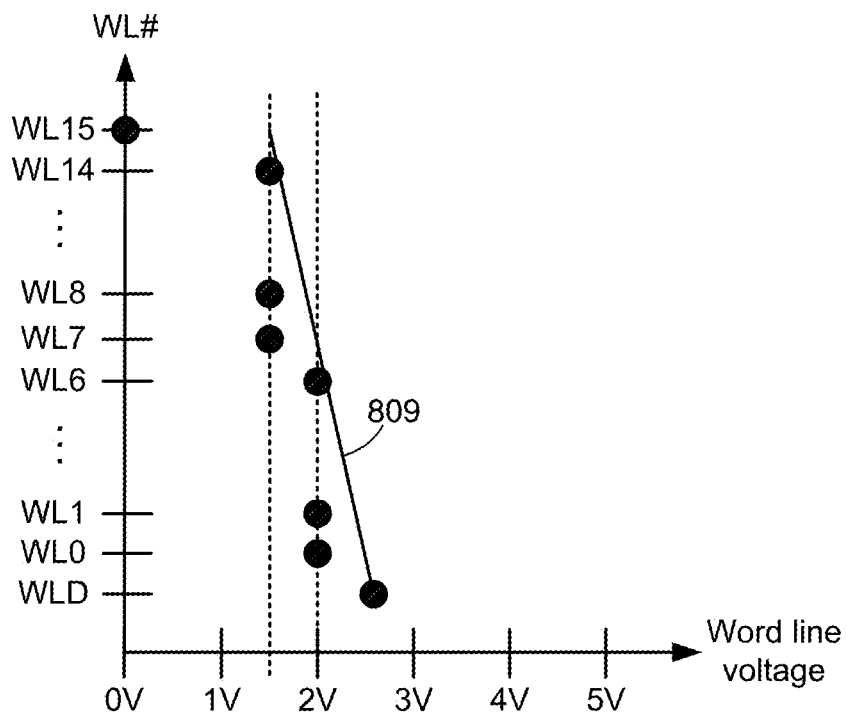

FIG. 8P depicts one embodiment of word line voltage settings that may be used during the RESET operation depicted in FIG. 8O. As depicted, the selected word line WL15 has been set to 0V, the dummy word line WLD has been set to 2.6V in order to set the channel voltage at a channel location corresponding with word line WL0 to be close to or substantially the same as 2.5V, the unselected word lines WL0-WL6 have been set to 2.0V, and the unselected word lines WL7-WL14 have been set to 1.5V. In one embodiment, a first set of unselected word lines (e.g., word lines WL0-WL6) may be set to a first unselected word line voltage and a second set of unselected word lines (e.g., word lines WL7-WL14) may be set to a second unselected word line voltage different from the first unselected word line voltage. The first set of unselected word lines may comprise word lines that are closer to the dummy word line than the second set of unselected word lines. The first unselected word line voltage may be greater than the second unselected word line voltage. In the case depicted in FIG. 8P, a voltage difference across the memory cell connected to word line WL0 may comprise 0.5V (i.e., 2.5V-2.0V) and the voltage difference across the memory cell connected to word line WL7 may comprise 0.5V (i.e., 2.0V-1.5V). Although the unselected word lines WL0-WL14 have been partitioned into two sets in FIG. 8P, in other cases, the unselected word lines WL0-WL14 may be partitioned into three or more sets of unselected word lines (e.g., WL0-WL3 may form a first set, WL4-WL7 may form a second set, WL8-WL11 may form a third set, and WL12-WL14 may form a fourth set). Each of the three or more sets of unselected word lines may be biased to a different unselected word line voltage.

Figure 8Q:
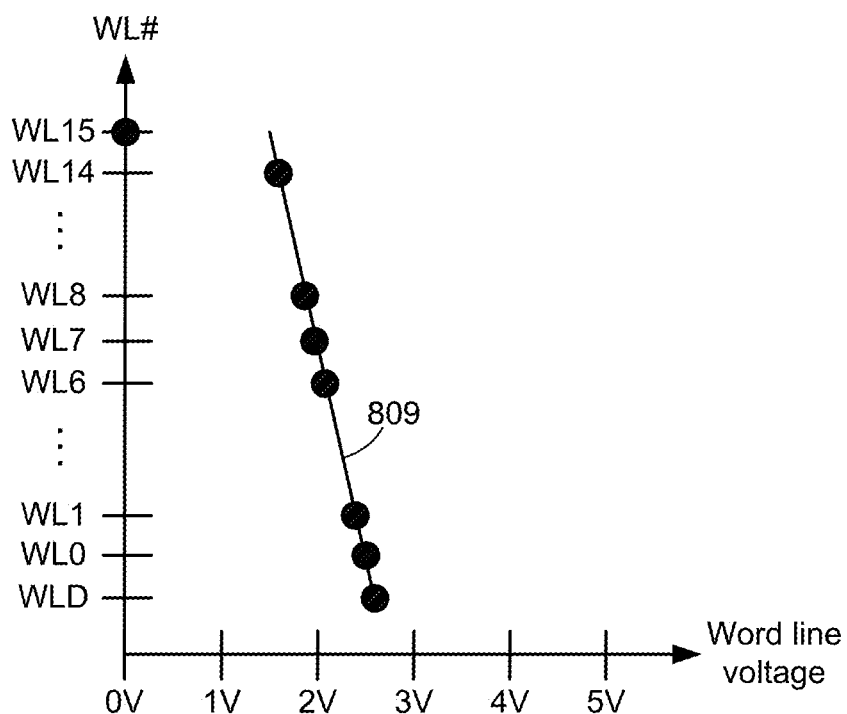

FIG. 8Q depicts another embodiment of word line voltage settings that may be used during the RESET operation depicted in FIG. 8O. As depicted, the selected word line WL15 has been set to 0V, the dummy word line WLD has been set to 2.6V in order to set the channel voltage at a channel location corresponding with word line WL0 to be close to or substantially the same as 2.5V, the unselected word line WL0 has been set to 2.5V, and the other unselected word lines WL1-WL14 have been set to voltages based on the average channel voltage along the channel between the channel location corresponding with word line WL15 and the channel location corresponding with word line WL1. In one embodiment, the unselected word lines WL0-WL14 may be assigned voltages based on the slope 809 representing an average channel voltage along the channel between the channel location corresponding with word line WL15 and the channel location corresponding with word line WLD. In some cases, the voltages applied to the unselected word lines WL0-WL14 may be set in order to minimize the voltage stress across each of the memory cells connected to the unselected word lines WL0-WL14. In one example, the voltages applied to unselected word lines may be set in order to place 0V or substantially close to 0V across each of the memory cells connected to the unselected word lines. Setting the unselected word lines to location-dependent voltages that minimize the voltage differences across unselected memory cells may reduce program disturb and improve memory cell reliability. As depicted, the unselected word line voltages applied to the unselected word lines between word line WL15 and word line WL0 depend on the location of the unselected word line. For example, the unselected word line voltage applied to word line WL1 may comprise 2.4V and the unselected word line voltage applied to word line WL14 may comprise 1.6V.

In some embodiments, the ability to minimize the voltage differences across unselected memory cells (e.g., F cells) connected to an adjustable resistance local bit line may allow higher write currents to be used during a programming operation. Using higher write currents may allow selected memory cells to be programmed in a shorter amount of time (i.e., enable faster write times). During a RESET operation, the unselected word lines may be biased at different voltages such that voltage drop across each of the unselected memory cells is minimized before the selected memory cell is actually RESET into a high resistance state.

Figure 8R:
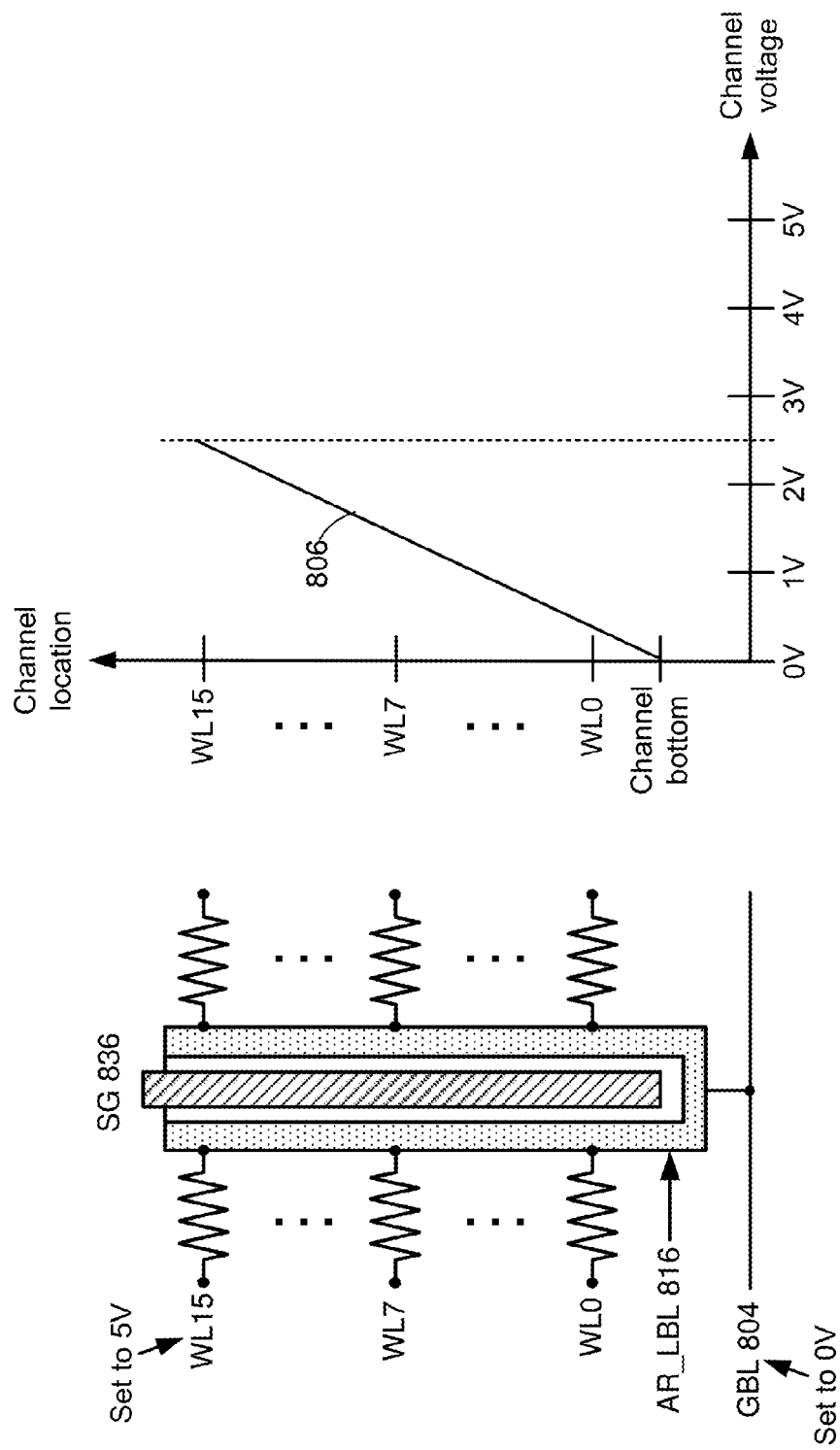
FIGS. 8R-8T depict various embodiments of adjustable resistance bit line structures during a SET operation.

FIG. 8R depicts one embodiment of an adjustable resistance bit line structure during a SET operation after a selected memory cell has been SET into a low resistance state (i.e., post-SET). As depicted, the selected word line WL15 has been set to a selected word line voltage (e.g., 5V) and the selected global bit line GBL 804 has been set to a selected bit line voltage (e.g., 0V). The select gate SG 836 may be set to a selected select gate voltage such that the adjustable resistance local bit line AR_LBL 816 is set into a conducting state. However, although the adjustable resistance local bit line AR_LBL 816 is set into the conducting state, a channel resistance of a channel of the adjustable resistance local bit line AR_LBL 816 may cause voltage drops to occur along the channel. As depicted, the channel voltage at the bottom of the channel is 0V, the channel voltage at a channel location corresponding with word line WL0 is 0.5V, and the channel voltage at a channel location corresponding with word line WL15 is 2.5V. The voltage across the selected memory cell may comprise the difference between the selected word line voltage and the channel voltage at the channel location corresponding with word line WL15 (i.e., 2.5V). The slope 806 of the channel voltage between the bottom of the channel and the channel location corresponding with the selected word line WL15 may be adjusted based on the selected select gate voltage applied to the select gate SG 836. The slope 806 may also be adjusted based on the current through the selected memory cell (e.g., 100 nA, 2 µA, or 50 µA).

Figure 8S:
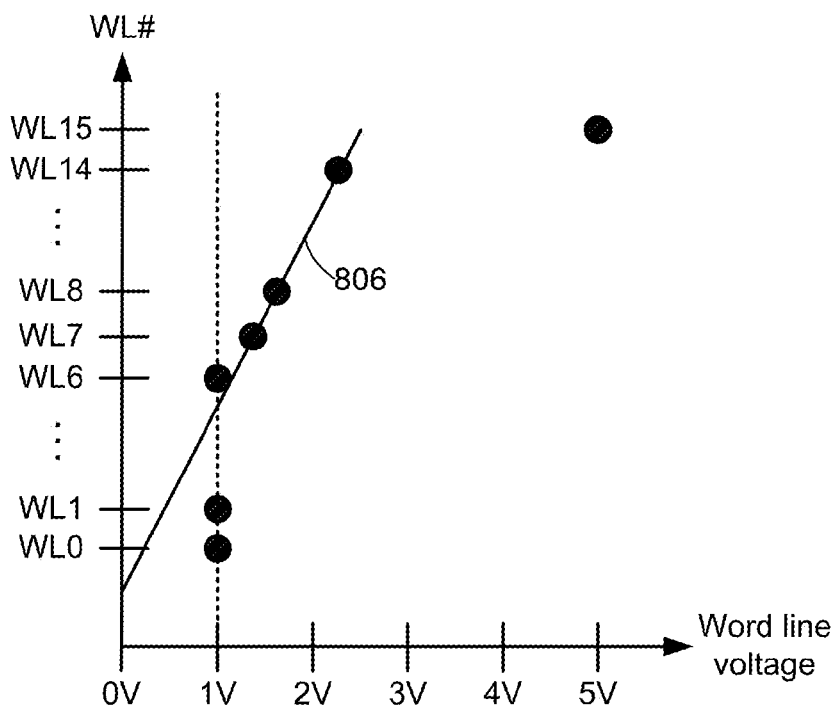

FIG. 8S depicts one embodiment of word line voltage settings that may be used during the SET operation depicted in FIG. 8R. As depicted, the selected word line WL15 has been set to 5V, the unselected word lines WL0-WL6 have been set to 1.0V, the unselected word lines WL7-WL14 have been set to voltages corresponding with the slope 806 of the channel voltage between the bottom of the channel and the channel location corresponding with the selected word line WL15. In this case, the voltage difference across the memory cell connected to word line WL1 may comprise 0.5V (i.e., 1.0V-0.5V) and the voltage difference across the memory cell connected to word line WL14 may comprise 0V (i.e., 2.25V-2.25V). In some embodiments, the voltages applied to the unselected word lines WL0-WL14 may be set in order to minimize the voltage stress across each of the memory cells connected to the unselected word lines WL0-WL14. In one example, the voltages applied to unselected word lines may be set in order to place 0V or substantially close to 0V across each of the memory cells connected to the unselected word lines. Setting the unselected word lines to location-dependent voltages that minimize the voltage differences across unselected memory cells may reduce program disturb and improve memory cell reliability.

In some embodiments, the voltages applied to unselected word lines during a SET operation may be set in order to place at most a first voltage (e.g., at most 500 mV or at most 1V) across each of the memory cells connected to the unselected word lines. In other embodiments, the voltages applied to a first set of unselected word lines during a SET operation may be set in order to place at most a first voltage (e.g., at most 500 mV or at most 1V) across each of the memory cells connected to the first set of unselected word lines. In one example, if a selected word line comprises word line WL5, then the first set of word lines may comprise word lines WL0-WL4.

Figure 8T:
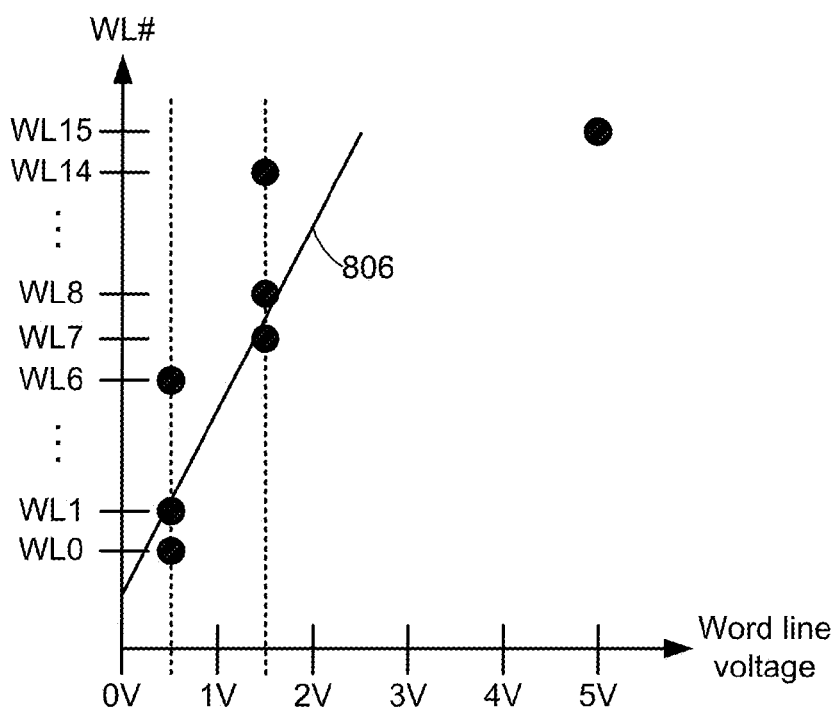

FIG. 8T depicts another embodiment of word line voltage settings that may be used during the SET operation depicted in FIG. 8R. As depicted, the selected word line WL15 has been set to 5V, the unselected word lines WL0-WL6 have been set to 0.5V, and the unselected word lines WL7-WL14 have been set to 1.5V. In one embodiment, a first set of unselected word lines may be set to a first voltage and a second set of the unselected word lines may be set to a second voltage greater than the first voltage. The first set of unselected word lines may comprise word lines that are closest to the bottom of the adjustable resistance bit line structure or closest to the global bit line located at the bottom of the adjustable resistance bit line structure.

In some embodiments, during a SET operation, the unselected word lines may be biased at different voltages such that the voltage drop across each of the unselected memory cells is minimized after the selected memory cell is actually SET into a low resistance state. In one example, the unselected word lines WL0-WL14 may be assigned voltages based on the slope 806 of the channel voltage between the bottom of the channel and the channel location corresponding with the selected word line WL15.

Figure 8U:
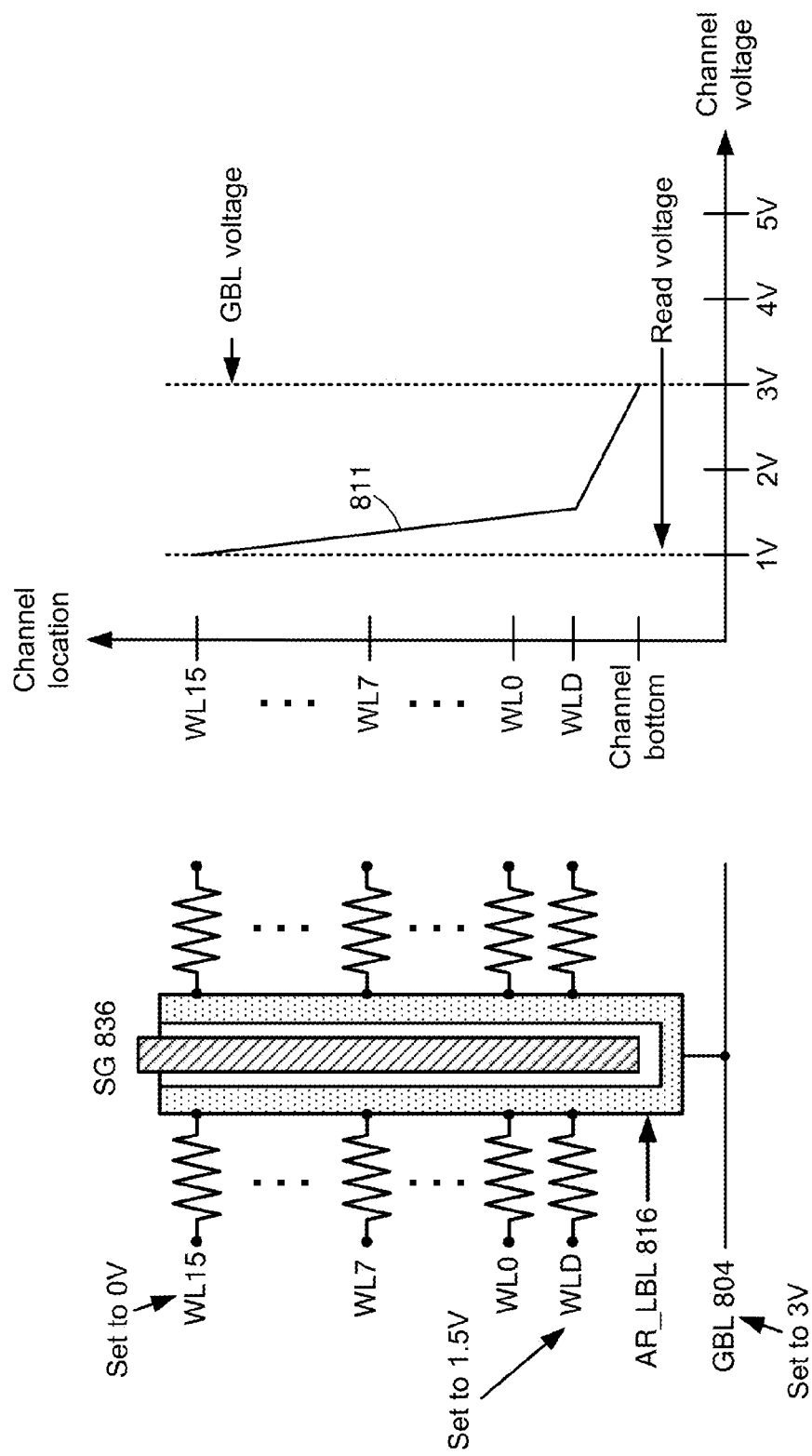
FIGS. 8U-8W depict various embodiments of adjustable resistance bit line structures during a read operation.

FIG. 8U depicts one embodiment of an adjustable resistance bit line structure during a read operation. As depicted, a dummy word line WLD positioned as the bottommost word line closest to the global bit line connection has been set to 1.5V, the selected word line WL15 has been set to a selected word line voltage for a read operation (e.g., 0V) and the selected global bit line GBL 804 has been set to a selected bit line voltage for a read operation (e.g., 3V). The dummy word line WLD may be set to 1.5V in order to set the channel voltage at the channel location corresponding with word line WL0 to be close to or substantially the same as 1.4V. The select gate SG 836 may be set to a selected select gate voltage such that the adjustable resistance local bit line AR_LBL 816 is set into a conducting state. However, although the adjustable resistance local bit line AR_LBL 816 is set into the conducting state, a channel resistance of a channel of the adjustable resistance local bit line AR_LBL 816 may cause voltage drops to occur along the channel during the read operation. As depicted, the channel voltage at the bottom of the channel is 3V, the channel voltage at a channel location corresponding with dummy word line WLD is 1.5V, the channel voltage at a channel location corresponding with word line WL0 is 1.4V, and the channel voltage at a channel location corresponding with word line WL15 is 1.0V. The voltage across the selected memory cell may comprise the difference between the selected word line voltage and the channel voltage at the channel location corresponding with word line WL15 (i.e., 1.0V).

The slope of the channel voltage between the bottom of the channel and the channel location corresponding with bottommost word line may be set based on an unselected word line voltage applied to the word line WLD. In one example, if the unselected word line voltage applied to the dummy word line WLD is 1.5V, then the channel voltage at the channel location corresponding with word line WLD may be set to 1.5V or to a voltage substantially close to 1.5V. The slope 811 of the channel voltage between the channel location corresponding with word line WL15 and the channel location corresponding with word line WLD may be set based on the unselected word line voltage applied to the word line WLD and the conductivity of the channel. The slope 811 may depend on the selected select gate voltage applied to the select gate SG 836. The slope 811 may also depend on the current through the selected memory cell being sensed during the read operation (e.g., 20 nA or 100 nA). In some embodiments, the slope 811 corresponding with the channel voltage along the channel between the channel location corresponding with word line WL15 and the channel location corresponding with dummy word line WLD may be adjusted based on the selected select gate voltage applied to the select gate SG 836 (e.g., the slope may be increased by applying a higher select gate voltage to the select gate SG 836).

Figure 8V:
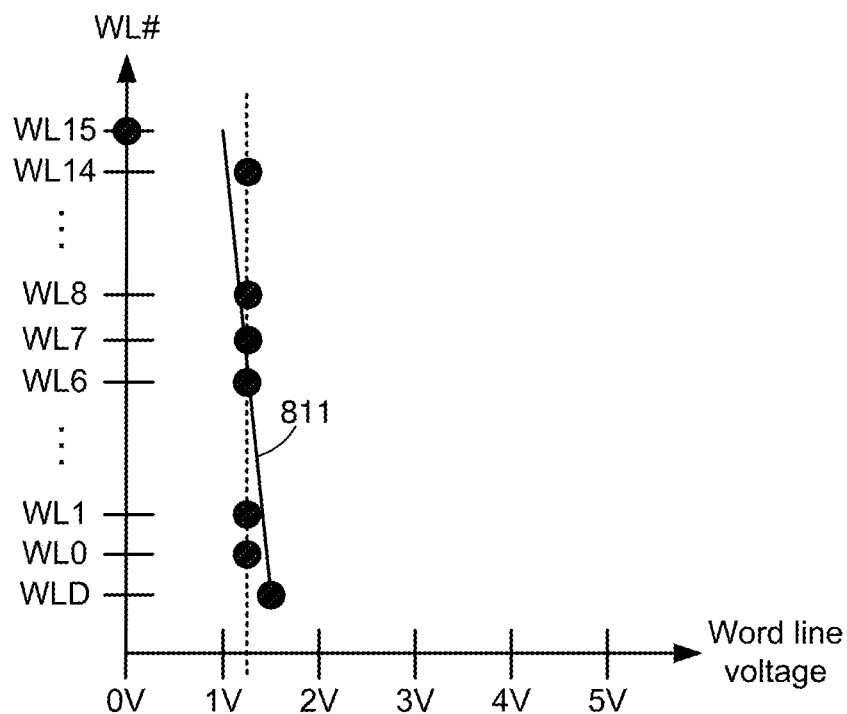

FIG. 8V depicts one embodiment of word line voltage settings that may be used during the read operation depicted in FIG. 8U. As depicted, the selected word line WL15 has been set to 0V, the dummy word line WLD has been set to 1.5V in order to set the channel voltage at a channel location corresponding with word line WL0 to be close to or substantially the same as 1.4V, and the unselected word lines WL0-WL14 have been set to 1.25V. In one embodiment, a first set of unselected word lines (e.g., word lines WL0-WL6) may be set to a first unselected word line voltage and a second set of unselected word lines (e.g., word lines WL7-WL14) may be set to a second unselected word line voltage different from the first unselected word line voltage. The first set of unselected word lines may comprise word lines that are closer to the dummy word line than the second set of unselected word lines. The first unselected word line voltage may be greater than the second unselected word line voltage. In the case depicted in FIG. 8V, a voltage difference across the memory cell connected to word line WL0 may comprise 0.15V (i.e., 1.4V-1.25V) and the voltage difference across the memory cell connected to word line WL7 may comprise 0V (i.e., 1.25V-1.25V).

Figure 8W:
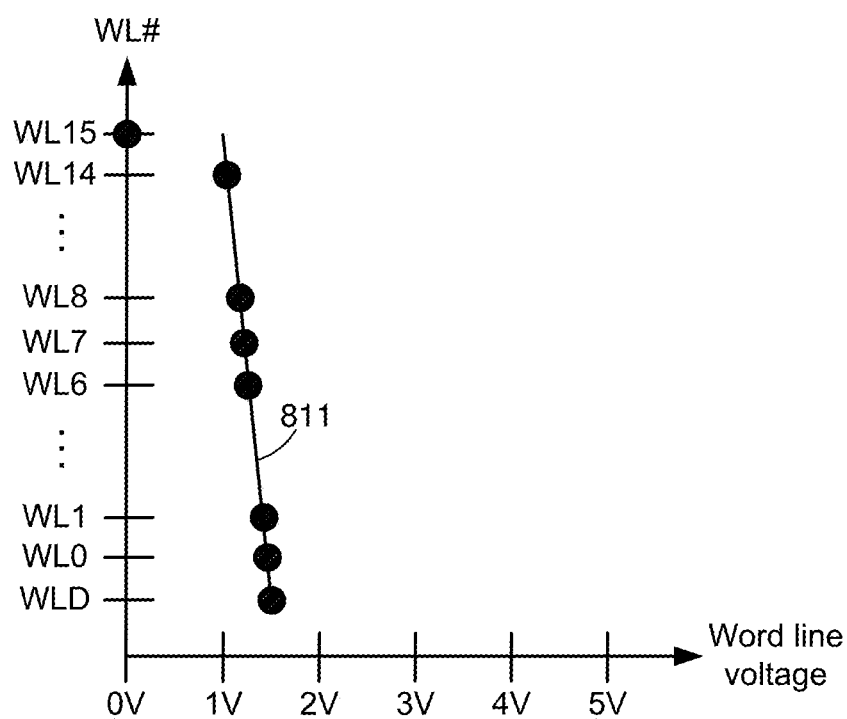

FIG. 8W depicts another embodiment of word line voltage settings that may be used during the read operation depicted in FIG. 8U. As depicted, the selected word line WL15 has been set to 0V, the dummy word line WLD has been set to 1.5V, and the unselected word lines WL0-WL14 have been set to voltages based on the average channel voltage along the channel between the channel location corresponding with word line WL15 and the channel location corresponding with dummy word line WLD. In one example, the unselected word lines WL0-WL14 may be assigned voltages based on the slope 811 representing an average channel voltage along the channel between the channel location corresponding with word line WL15 and the channel location corresponding with dummy word line WLD. In some cases, the voltages applied to the unselected word lines WL0-WL14 may set in order to minimize the voltage stress across each of the memory cells connected to the unselected word lines WL0-WL14 during a read operation. In one example, the voltages applied to the unselected word lines may be set in order to place 0V or substantially close to 0V across each of the memory cells connected to the unselected word lines. Setting the unselected word lines to location-dependent voltages that minimize the voltage differences across unselected memory cells may reduce read disturb and improve memory cell reliability. As depicted, the unselected word line voltages applied to the unselected word lines between word line WL15 and word line WL0 depend on the location of the unselected word line.

In some embodiments, the voltages applied to unselected word lines during a read operation, such as the unselected word lines WL0-WL14 in FIG. 8W, may be set in order to place at most a first voltage (e.g., at most 100 mV or at most 200 mV) across each of the memory cells connected to the unselected word lines. In other embodiments, the voltages applied to a first set of unselected word lines during a read operation may be set in order to place at most a first voltage (e.g., at most 50 mV or at most 100 mV) across each of the memory cells connected to the first set of unselected word lines. In one example, if a selected word line comprises word line WL8, then the first set of word lines may comprise word lines WL0-WL7.

In some embodiments, the ability to minimize the voltage differences across unselected memory cells (e.g., F cells) connected to an adjustable resistance local bit line may allow higher read currents to be used during a read operation. Using higher read currents may allow selected memory cells to be sensed or read in a shorter amount of time (i.e., enable faster read times).

Figure 9A:
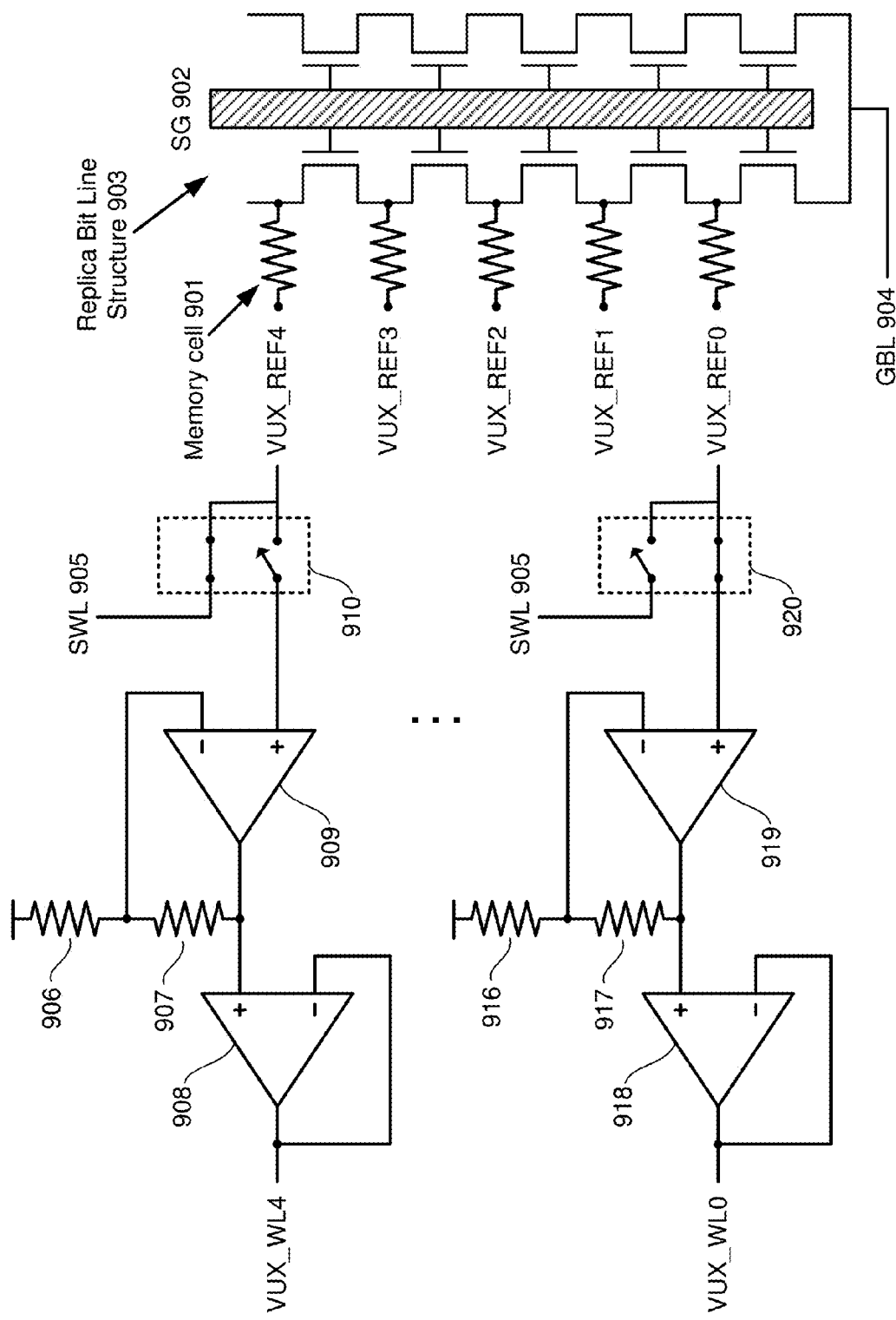
FIG. 9A depicts one embodiment of a circuit for generating unselected word line voltages.

FIG. 9A depicts one embodiment of a circuit for generating unselected word line voltages. The circuit may comprise an auto-tracking unselected word line voltage generator that generates different word line voltages based on a word line location or based on the position of a word line along an adjustable resistance local bit line. As depicted, the circuit for generating unselected word line voltages includes a replica bit line structure 903. The replica bit line structure 903 includes a select gate SG 902 for controlling an adjustable resistance local bit line. A global bit line GBL 904 connects to the adjustable resistance local bit line. The adjustable resistance local bit line connects to a plurality of memory cells, such as memory cell 901. The plurality of memory cells connect to VUX reference lines VUX_REF0-VUX_REF4. Each VUX reference line connects to a bidirectional analog mux that is connected to a non-inverting amplifier with a configurable voltage divider that is connected to a unity gain buffer stage for driving one of the unselected word line voltages generated.

In one embodiment, a replica bit line structure, such as replica bit line structure 903, may replicate an adjustable resistance bit line structure in which a global bit line connection is made at the bottom or near the bottom of the adjustable resistance bit line structure, such as the adjustable resistance bit line structure depicted in FIG. 6D. Although the global bit line GBL 904 connects to the adjustable resistance local bit line at the bottom of the replica bit line structure 903 depicted in FIG. 9A, in other embodiments, a global bit line may connect to a replicated adjustable resistance local bit line at the top or near the top of a replica bit line structure. As an example, a replica bit line structure may replicate an adjustable resistance bit line structure in which a global bit line connection is made at the top or near the top of the adjustable resistance bit line structure, such as the adjustable resistance bit line structure depicted in FIG. 6V.

As depicted in FIG. 9A, VUX reference line VUX_REF4 connects to bidirectional analog mux 910. The bidirectional analog mux 910 may include a pair of transmission gates (or T-gates) for selectively connecting the output of the bidirectional analog mux to one of the inputs of the bidirectional analog mux. The bidirectional analog mux 910 may selectively connect either a selected word line voltage SWL 905 to the VUX reference line VUX_REF4 or connect the VUX reference line VUX_REF4 to an input of amplifier 909 that is configured in a non-inverting amplifier configuration with a resistive voltage divider formed by resisters 906-907. In some cases, the non-inverting amplifier configuration may allow a voltage of the VUX reference line VUX_REF4 to be level shifted prior to being buffered by a unity gain buffer. The output of the amplifier 909 drives an input of amplifier 908 that is configured in a unity gain amplifier configuration. The output of the unity gain buffer is an unselected word line voltage VUX_WL4 for driving a word line WL4.

Also depicted, VUX reference line VUX_REF0 connects to bidirectional analog mux 920. The bidirectional analog mux 920 may selectively connect either a selected word line voltage SWL 905 to the VUX reference line VUX_REF0 or connect the VUX reference line VUX_REF0 to an input of amplifier 919 that is configured in a non-inverting amplifier configuration with a resistive voltage divider formed by resisters 916-917. The output of the amplifier 919 drives an input of amplifier 918 that is configured in a unity gain amplifier configuration. The output of the unity gain buffer is an unselected word line voltage VUX_WL0 for driving a word line WL0.

In one embodiment, the memory cells of the replica bit line structure 903 may be set into a high resistance state prior to generating the unselected word line voltages. In another embodiment, the memory cells of the replica bit line structure 903 may be set into a low resistance state less than the high resistance state prior to generating the unselected word voltages. In another embodiment, the memory cells of the replica bit line structure 903 may all be RESET prior to generating the unselected word voltages. In another embodiment, the memory cells of the replica bit line structure 903 may all be SET prior to generating the unselected word voltages.

In one embodiment, if a word line corresponding with word line WL4 comprises a selected word line, then the bidirectional analog mux 910 may be configured to connect the selected word line voltage SWL 905 to the VUX reference line VUX_REF4 and the bidirectional analog mux 920 may be configured to connect the VUX reference line VUX_REF0 to the input of amplifier 919. The bidirectional analog multiplexors connected to VUX reference lines VUX_REF1-VUX_REF3 may also be configured to connect the VUX reference lines VUX_REF1-VUX_REF3 to non-inverting amplifier configurations. In another embodiment, if a word line corresponding with word line WL3 comprises a selected word line, then a bidirectional analog mux not depicted may be configured to connect the selected word line voltage SWL 905 to the VUX reference line VUX_REF3 and the bidirectional analog mux 920 may be configured to connect the VUX reference line VUX_REF0 to the input of amplifier 919. In some cases, a bidirectional analog mux associated with a selected word line may drive the corresponding VUX reference line to the selected word line voltage SWL 905 and the other bidirectional analog multiplexors associated with unselected word lines may connect the other VUX reference lines to non-inverting amplifier configurations for generating unselected word line voltages.

In some embodiments, in order to generate unselected word line voltages for word lines WL0-WL3 during a RESET operation when a selected memory cell connected to word line WL4 is to be selected, the global bit line GBL 904 may be set to a selected bit line voltage (e.g., 5V), the VUX reference line VUX_REF4 may be set to the selected word line voltage (e.g., 0V), and the select gate SG 902 may be set to the selected select line voltage (e.g., 7V) in order to set the adjustable resistance local bit line of the replica bit line structure 903 into a conducting state. In this case, the channel voltages generated along the channel between the global bit line GBL 904 and the selected memory cell connected to the VUX reference line VUX_REF4 may be outputted and buffered using unity gain buffers. The non-inverting amplifier configurations may be used to adjust or level shift the VUX reference voltages (e.g., to decrease a VUX reference voltage based on a configuration of a resistive voltage divider) prior to being buffered by the unity gain buffers.

In some embodiments, in order to generate unselected word line voltages for word lines WL0-WL3 during a SET operation when a selected memory cell connected to word line WL4 is to be selected, the global bit line GBL 904 may be set to a selected bit line voltage (e.g., 0V), the VUX reference line VUX_REF4 may be set to the selected word line voltage (e.g., 5V), and the select gate SG 902 may be set to the selected select line voltage (e.g., 5V) in order to set the adjustable resistance local bit line of the replica bit line structure 903 into a conducting state. In this case, the channel voltages generated along the channel between the global bit line GBL 904 and the selected memory cell connected to the VUX reference line VUX_REF4 may be outputted and buffered using unity gain buffers. The non-inverting amplifier configurations may be used to adjust or level shift the VUX reference voltages associated with word lines WL0-WL3 (e.g., to decrease a VUX reference voltage associated with VUX reference line VUX_REF1 based on a configuration of a resistive voltage divider) prior to being buffered by the unity gain buffers.

In some embodiments, in order to generate unselected word line voltages during a read operation when a selected memory cell connected to word line WL4 is to be selected, the global bit line GBL 904 may be set to a selected bit line voltage (e.g., 3V), the VUX reference line VUX_REF4 may be set to the selected word line voltage (e.g., 0V), and the select gate SG 902 may be set to the selected select line voltage for read operations (e.g., 4V) in order to set the adjustable resistance local bit line of the replica bit line structure 903 into a conducting state. In this case, the channel voltages generated along the channel between the global bit line GBL 904 and the selected memory cell connected to the VUX reference line VUX_REF4 may be outputted and buffered using unity gain buffers. The non-inverting amplifier configurations may be used to adjust or level shift the VUX reference voltages associated with word lines WL0-WL3 prior to being buffered by the unity gain buffers (e.g., level shifting the VUX reference voltages by −150 mV).

Figure 9B:
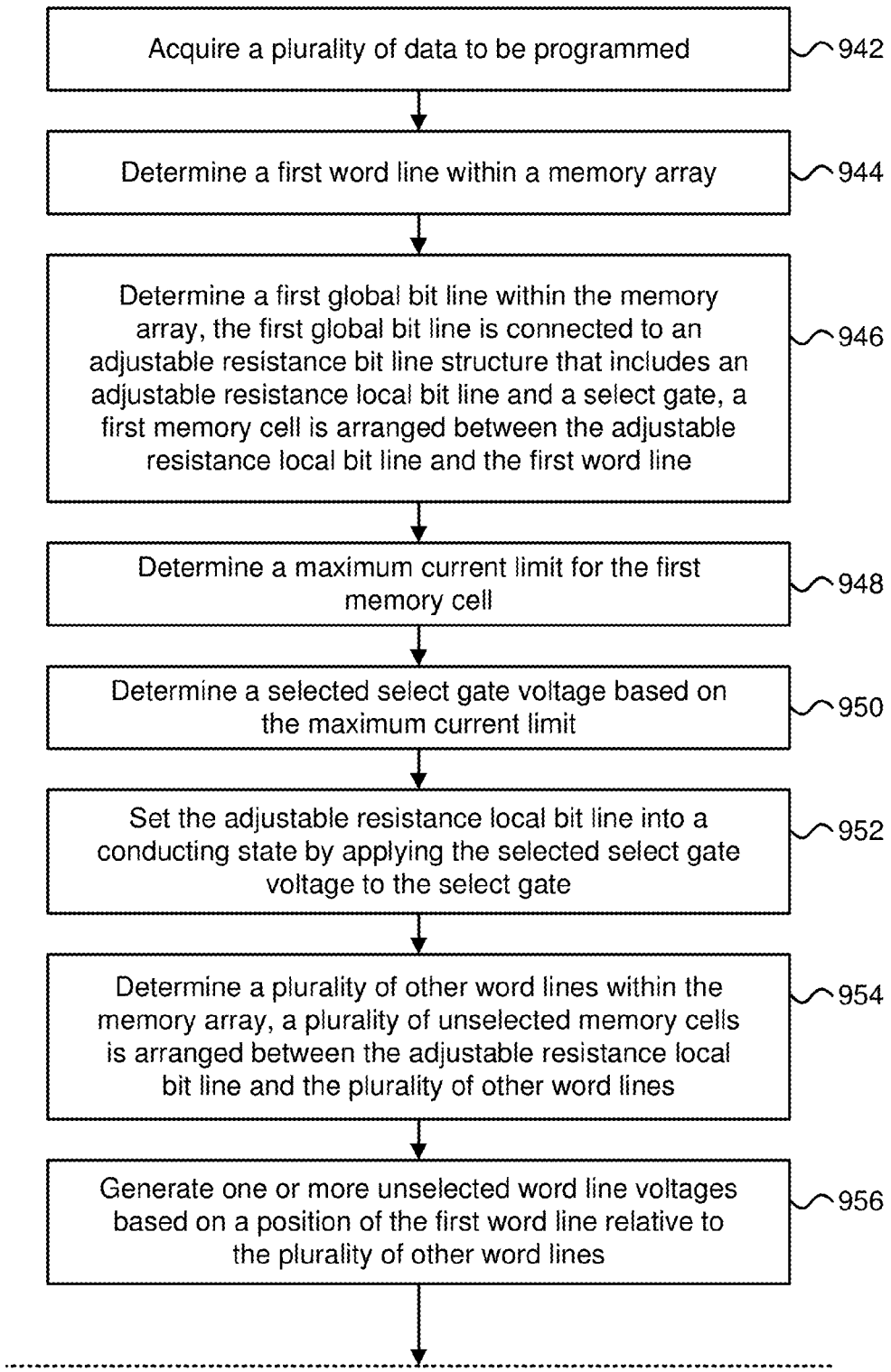
FIGS. 9B-9C depict a flowchart describing one embodiment of a process for performing a programming operation.
Figure 9C:
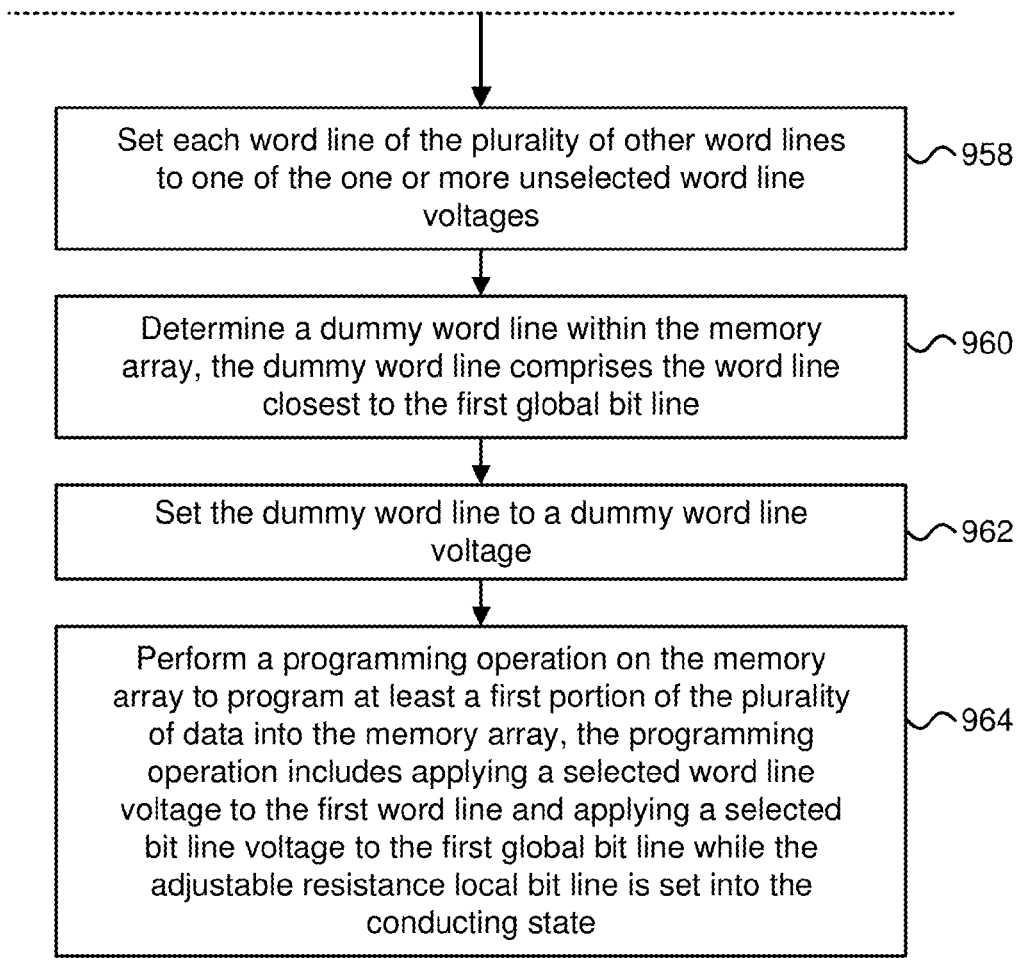

FIGS. 9B-9C depict a flowchart describing one embodiment of a process for performing a programming operation. In one embodiment, the process of FIGS. 9B-9C may be performed by a memory system, such as memory system 101 in FIG. 1A.

In step 942, a plurality of data to be programmed is acquired. The plurality of data to be programmed may be associated with one or more pages of data or a portion of a page of data. In step 944, a first word line within a memory array is determined. The first word line may correspond with a word line to be selected during a programming operation. In step 946, a first global bit line within the memory array is determined. The first global bit line may be connected to an adjustable resistance bit line structure that includes an adjustable resistance local bit line and a select gate. A first memory cell may be arranged between the adjustable resistance local bit line and the first word line.

In step 948, a maximum current limit for the first memory cell is determined. The maximum current limit may be determined based on whether the programming operation comprises a SET or RESET operation. In step 950, a selected select gate voltage is determined based on the maximum current limit. In step 952, the adjustable resistance local bit line is set into a conducting state by applying the selected select gate voltage to the select gate. In step 954, a plurality of other word lines within the memory array is determined. A plurality of unselected memory cells may be arranged between the adjustable resistance local bit line and the plurality of other word lines. In step 956, one or more unselected word line voltages are generated based on a position of the first word line relative to the plurality of other word lines. In one embodiment, the one or more unselected word line voltages may be generated using the circuit depicted in FIG. 9A. In step 958, each word line of the plurality of other word lines is set to one of the one or more unselected word line voltages.

In step 960, a dummy word line within the memory array is determined. The dummy word line may comprise the word line closest to the first global bit line or the word line closest to the bottom of the adjustable resistance bit line structure. A dummy memory cell connected to the dummy word line and the adjustable resistance local bit line may be left in an unformed state or set into a high resistance state. In step 962, the dummy word line is set to a dummy word line voltage. In one embodiment, the dummy word line may be set to the dummy word line voltage in order to adjust a channel voltage corresponding with a position of the dummy word line. In some embodiments, the dummy word line may be set to the dummy word line voltage prior to applying the selected select gate voltage to the select gate. In some cases, the dummy word line may be set to the dummy word line voltage prior to the select gate being set to the selected select gate voltage and/or prior to the plurality of other word lines being set to the one or more unselected word line voltages in order to prevent or reduce surge current through memory cells.

In step 964, a programming operation is performed on the memory array to program at least a first portion of the plurality of data into the memory array. The programming operation may include applying a selected word line voltage to the first word line and applying a selected bit line voltage to the first global bit line while the adjustable resistance local bit line is set into the conducting state.

In some embodiments, if a programming operation comprises a SET operation, then unselected word lines may be biased at different voltages prior to and/or during a selected memory cell being SET into a low resistance state in order to minimize the voltage stress placed across each of the unselected memory cells associated with the unselected word lines that occurs subsequent to the selected memory cell actually being SET into the low resistance state. In one example, if the programming operation comprises a SET operation, then unselected word line voltages may be generated and applied to the unselected word lines prior to the selected memory cell being SET into the low resistance state in order to minimize the voltage stress placed across each of the unselected memory cells after the selected memory cell has been SET into the low resistance state.

In other embodiments, if a programming operation comprises a RESET operation, then unselected word lines may be biased at different voltages prior to and/or during a selected memory cell being RESET into a high resistance state in order to minimize the voltage stress placed across each of the unselected memory cells associated with the unselected word lines that occurs prior to the selected memory cell actually being RESET into the high resistance state. In one example, if the programming operation comprises a RESET operation, then unselected word line voltages may be generated and applied to the unselected word lines prior to the selected memory cell being RESET into the high resistance state in order to minimize the voltage stress placed across each of the unselected memory cells before the selected memory cell has been RESET into the high resistance state.

In some embodiments, the voltages applied to a set of unselected word lines during a programming operation may be set in order to place at most a first voltage (e.g., at most 500 mV or at most 1.2V) across each of the memory cells connected to the set of unselected word lines.

Figure 9D:
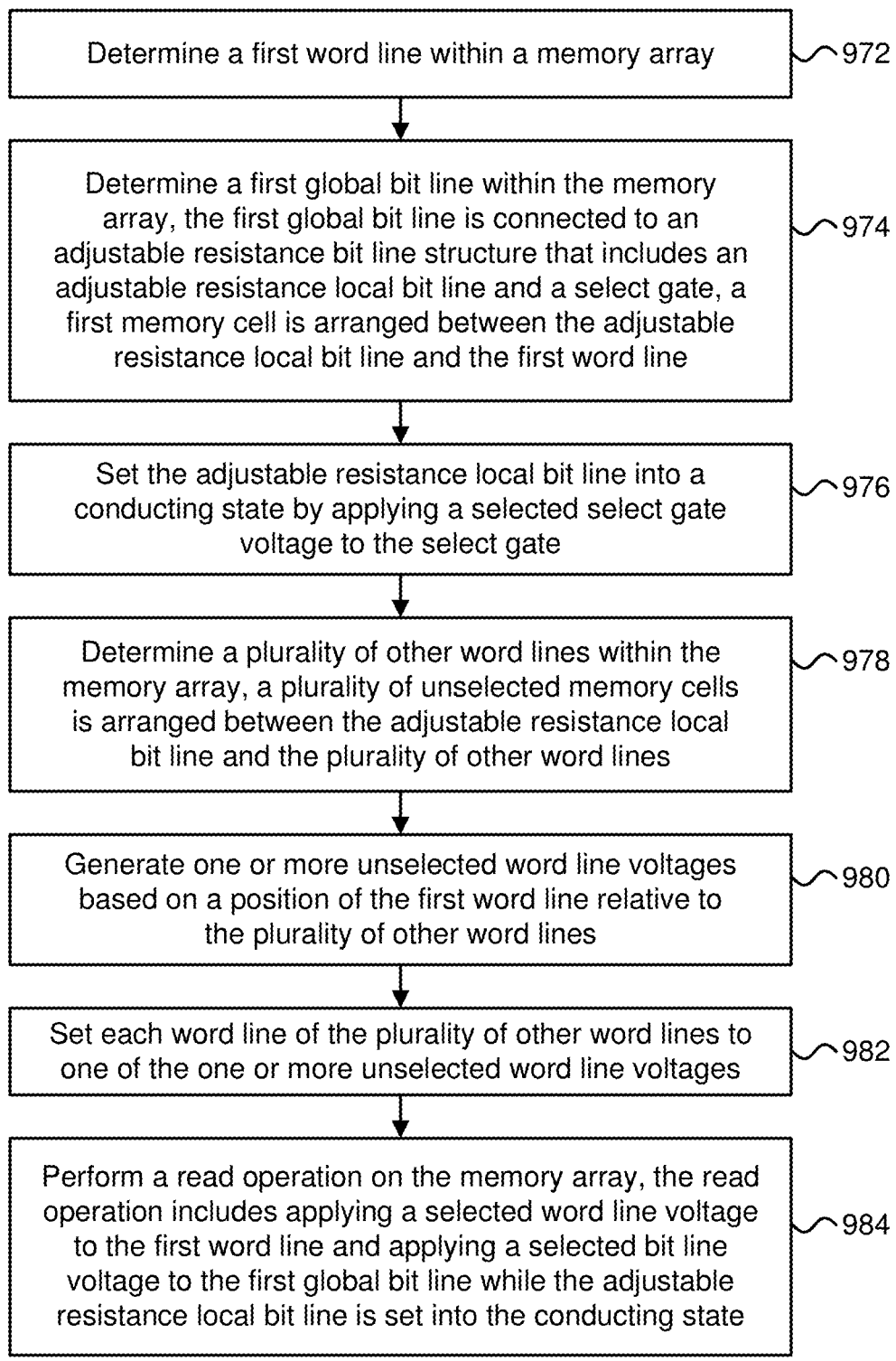
FIG. 9D depicts a flowchart describing one embodiment of a process for performing a read operation.

FIG. 9D depicts a flowchart describing one embodiment of a process for performing a read operation. In one embodiment, the process of FIG. 9D may be performed by a memory system, such as memory system 101 in FIG. 1A.

In step 972, a first word line within a memory array is determined. The first word line may correspond with a word line to be selected during a read operation. In step 974, a first global bit line within the memory array is determined. The first global bit line may be connected to an adjustable resistance bit line structure that includes an adjustable resistance local bit line and a select gate. A first memory cell may be arranged between the adjustable resistance local bit line and the first word line. In step 976, the adjustable resistance local bit line is set into a conducting state by applying a selected select gate voltage to the select gate. In step 978, a plurality of other word lines within the memory array is determined. A plurality of unselected memory cells may be arranged between the adjustable resistance local bit line and the plurality of other word lines. In step 980, one or more unselected word line voltages are generated based on a position of the first word line relative to the plurality of other word lines. In one embodiment, the one or more unselected word line voltages may be generated using the circuit depicted in FIG. 9A. In step 982, each word line of the plurality of other word lines is set to one of the one or more unselected word line voltages. In step 984, a read operation is performed on the memory array. The read operation may include applying a selected word line voltage to the first word line and applying a selected bit line voltage to the first global bit line while the adjustable resistance local bit line is set into the conducting state.

In some embodiments, unselected word lines may be biased at different voltages during a read operation in order to minimize the voltage stress placed across each of the unselected memory cells associated with the unselected word lines that occurs during the read operation. In some cases, the voltages applied to a set of unselected word lines during a read operation may be set in order to place at most a first voltage (e.g., at most 50 mV or at most 100 mV) across each of the memory cells connected to the set of unselected word lines.

Figures 10A, 10C:
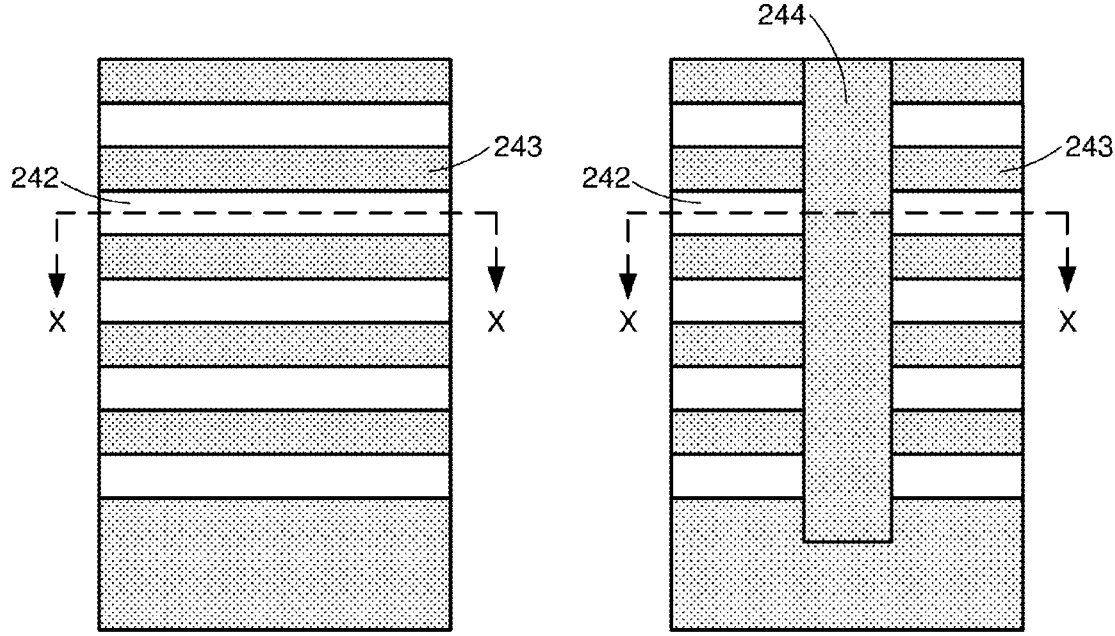
FIGS. 10A-10X depict various embodiments of cross-sectional views related to processes for fabricating portions of an adjustable resistance bit line structure.
Figures 10B, 10D:
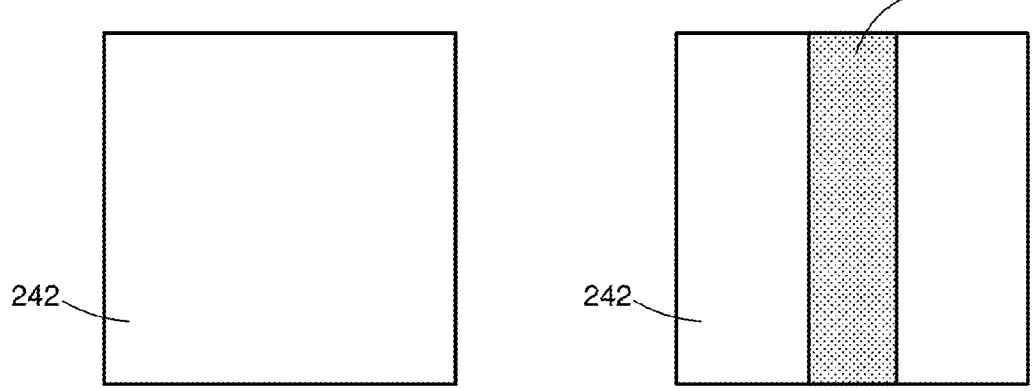

FIGS. 10A-10P depict various embodiments of cross-sectional views related to processes for fabricating a portion of an adjustable resistance bit line structure. As depicted in FIGS. 10A-10B, an alternating stack of word line layers and dielectric layers, such as word line layer 242 and dielectric layer 243, have been formed over a substrate. FIG. 10B depicts one embodiment of a cross-sectional view taken along line X-X of FIG. 10A. The word line layer 242 may comprise TiN, polysilicon, or tungsten (W). The dielectric layer 243 may comprise an oxide layer. As depicted in FIGS. 10C-10D, a trench that was etched extending through a plurality of word line layers and dielectric layers has been filled with oxide in order to form an oxide partition 244 that extends through the plurality of word line layers and dielectric layers. FIG. 10D depicts one embodiment of a cross-sectional view taken along line X-X of FIG. 10C.

Figure 10E:
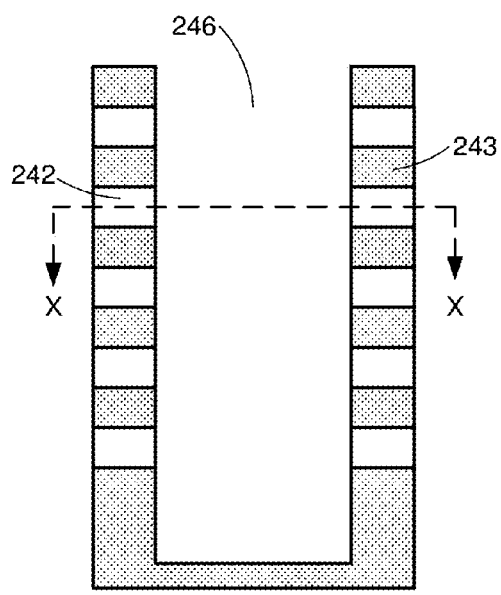
Figure 10G:
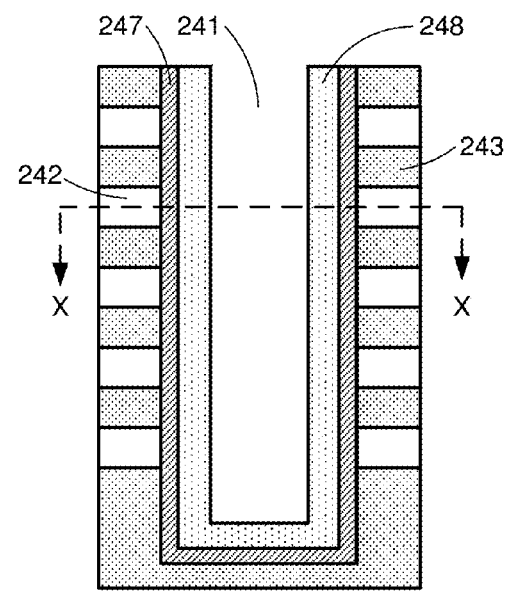
Figure 10F:
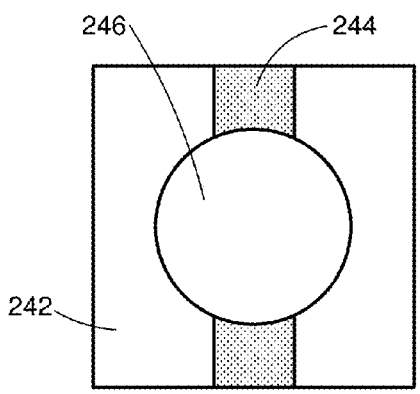

As depicted in FIGS. 10E-10F, a memory hole 246 has been etched extending through a plurality of word line layers and a plurality of dielectric layers. FIG. 10F depicts one embodiment of a cross-sectional view taken along line X-X of FIG. 10E. In some embodiments, a plurality of memory holes may be formed by etching through an alternating stack of word line layers and dielectric layers (e.g., etching through layers of TiN or polysilicon that are separated by oxide layers) to form the plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (RIE). In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist.

Figure 10H:
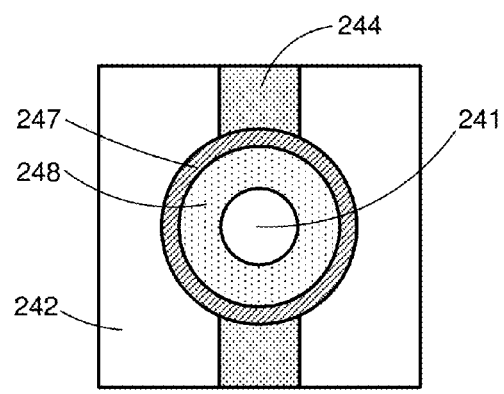

As depicted in FIGS. 10G-10H, a memory element layer 247 (e.g., comprising a ReRAM material) and an intrinsic polysilicon region 248 have been deposited within the memory hole 246. In one embodiment, the memory element layer 247 may comprise a conformal layer of memory element material surrounding the sides of the memory hole 246 and the intrinsic polysilicon region 248 may comprise a conformal layer of intrinsic polysilicon that has been deposited on a surface of the conformal layer of memory element material. The conformal layer of intrinsic polysilicon may have a thickness (or width) of 10 nm to 20 nm. As depicted, a narrow hole 241 has been formed such that the intrinsic polysilicon region 248 surrounds the narrow hole 241 in two dimensions. FIG. 10H depicts one embodiment of a cross-sectional view taken along line X-X of FIG. 10G. In one example, the memory element layer 247 may be formed within the memory hole 246 and the intrinsic polysilicon region 248 may be formed over the memory element layer 247. The memory element layer 247 and/or the intrinsic polysilicon region 248 may be deposited within the memory hole 246 using various deposition techniques such as chemical vapor deposition (CVD), physical vapor deposition (PVD), or atomic layer deposition (ALD). The memory element layer 247 may comprise a phase change material, a ferroelectric material, or a metal oxide such as nickel oxide or hafnium oxide. The intrinsic polysilicon region 248 may comprise undoped polysilicon, undoped silicon germanium, or undoped indium gallium arsenide. In some cases, the memory element layer 247 may have a thickness (or width) of 2 nm to 4 nm and the intrinsic polysilicon region 248 may have a thickness (or width) of 7 nm to 20 nm.

Figure 10I:
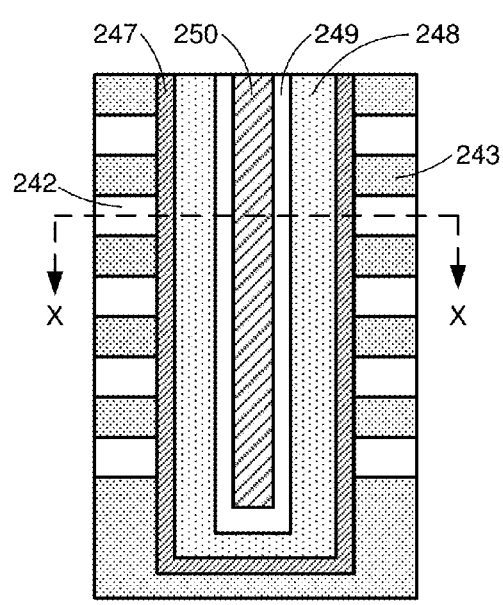
Figure 10K:
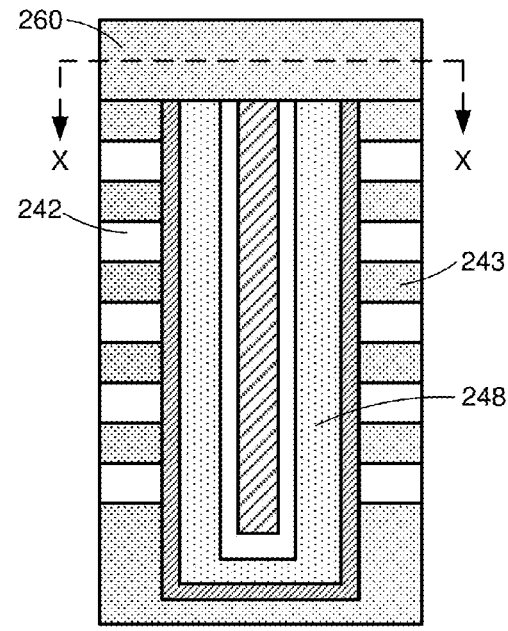
Figure 10J:
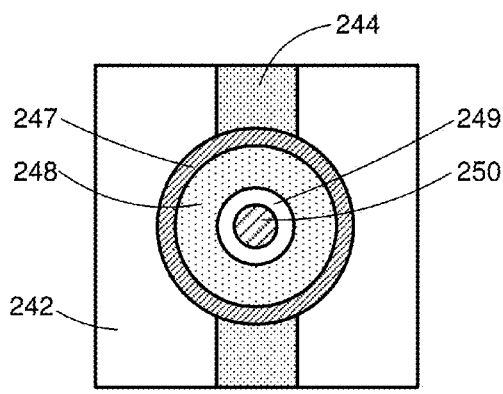

As depicted in FIGS. 10I-10J, a dielectric layer 249 and a select gate region 250 have been formed within the narrow hole 241. FIG. 10J depicts one embodiment of a cross-sectional view taken along line X-X of FIG. 10I. In one embodiment, the dielectric layer 249 may comprise a conformal layer of silicon dioxide coating an inside surface of the intrinsic polysilicon region 248. In some embodiments, the dielectric layer 249 and the select gate region 250 may be formed within the narrow hole 241 by depositing the dielectric layer 249 and the select gate region 250 using various deposition techniques such as chemical vapor deposition (CVD), physical vapor deposition (PVD), or atomic layer deposition (ALD). The select gate region 250 may comprise TiN or polysilicon. The dielectric layer 249 may comprise an oxide, silicon dioxide, silicon nitride, or a high-k dielectric material. In some cases, the dielectric layer 249 may have a thickness (or width) of 5 nm to 10 nm.

Figure 10L:
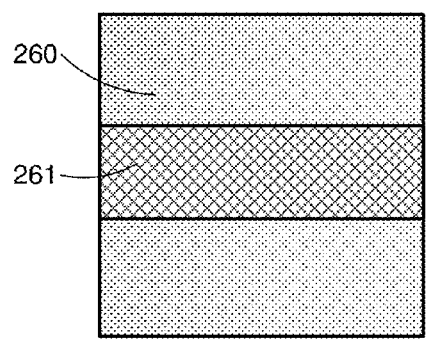

As depicted in FIGS. 10K-10L, an oxide layer 260 and a global bit line 261 have been formed above the select gate region 250. FIG. 10L depicts one embodiment of a cross-sectional view taken along line X-X of FIG. 10K. The global bit line 261 may comprise TiN or tungsten. As depicted in FIGS. 10M-10N, a top pillar hole 262 has been etched above the select gate region 250. FIG. 10N depicts one embodiment of a cross-sectional view taken along line X-X of FIG. 10M. As depicted in FIGS. 10O-10P, N+ polysilicon region 266, N+ polysilicon region 265, and oxide region 264 may be formed within the top pillar hole 262. FIG. 10P depicts one embodiment of a cross-sectional view taken along line X-X of FIG. 10O. The N+ polysilicon region 266 may provide an electrical connection from the intrinsic polysilicon region 248 to the global bit line 261. In one embodiment, a layer of N+ polysilicon may be deposited within the top pillar hole 262, etched, and then filled with oxide in order to form the oxide region 264, the N+ polysilicon region 266, and the N+ polysilicon region 265. In another embodiment, the N+ polysilicon region 266 may comprise a conformal layer of N+ polysilicon surrounding the sides of the top pillar hole 262 and the oxide region 264 may comprise a conformal layer of silicon dioxide that has been deposited on a surface of the conformal layer of N+ polysilicon.

In some embodiments, a distributed NMOS FET structure may be formed by using an N+ polysilicon region, such as N+ polysilicon region 266, directly connected to the intrinsic polysilicon region 248. In other embodiments, a distributed PMOS FET structure may be formed by using a P+ polysilicon region in place of the N+ polysilicon region 266.

FIGS. 10Q-10X depict various embodiments of cross-sectional views related to processes for fabricating a portion of an adjustable resistance bit line structure. As depicted in FIGS. 10Q-10R, a dielectric layer 249 and a select gate region 250 have been formed within the intrinsic polysilicon region 248. An oxide layer 270 has been overgrown or formed to have a thickness that is greater than the dielectric layer 243. FIG. 10R depicts one embodiment of a cross-sectional view taken along line X-X of FIG. 10Q.

As depicted in FIGS. 10S-10T, a portion of the oxide layer 270 and a portion of the memory element layer 247 have been etched to expose a top portion of the intrinsic polysilicon region 248. FIG. 10T depicts one embodiment of a cross-sectional view taken along line X-X of FIG. 10S. As depicted in FIGS. 10U-10V, the top portion of the intrinsic polysilicon region 248 has been doped in order to form N+ polysilicon region 271. FIG. 10V depicts one embodiment of a cross-sectional view taken along line X-X of FIG. 10U. In some cases, the N+ polysilicon region 271 may be formed via diffusion or ion implantation. The top portion of the intrinsic polysilicon region 248 may be doped with an n-type dopant (e.g., phosphorus or arsenic).

In some embodiments, a distributed NMOS FET structure may be formed by using an N+ polysilicon region, such as N+ polysilicon region 271, directly connected to the intrinsic polysilicon region 248. In other embodiments, a distributed PMOS FET structure may be formed by using a P+ polysilicon region in place of the N+ polysilicon region 271. In some cases, a P+ polysilicon region may be formed via diffusion or ion implantation. The top portion of the intrinsic polysilicon region 248 may be doped with a p-type dopant (e.g., boron).

As depicted in FIGS. 10W-10X, an oxide layer 272 and a global bit line 273 have been formed. FIG. 10X depicts one embodiment of a cross-sectional view taken along line X-X of FIG. 10W. The global bit line 273 may comprise TiN or tungsten. The oxide layer 272 may comprise an oxide or silicon dioxide. The N+ polysilicon region 271 may provide an electrical connection from the intrinsic polysilicon region 248 to the global bit line 273.

Some embodiments of the disclosed technology include systems and methods for reducing the number of unselected memory cells (e.g., H-cells or U-cells) or the amount of leakage current through unselected memory cells during read and/or write operations using an intrinsic vertical bit line architecture (iVBL). The iVBL architecture may improve memory performance and provide low current operation for a non-volatile memory array, such as a ReRAM array. In some cases, the iVBL architecture may eliminate or significantly reduce the leakage currents through H-cells by making unselected vertical bit lines connected to the H-cells highly resistive (e.g., more than 1 Gohm) or non-conducting and making selected vertical bit lines low resistance (e.g., less than 1 Kohm) or conducting (e.g., only a selected vertical bit line connected to a selected memory cell may be made conductive, while all other vertical bit lines may be made non-conductive).

One embodiment of the disclosed technology includes a first word line, an adjustable resistance bit line structure, and a first memory element arranged between the first word line and the adjustable resistance local bit line. The adjustable resistance bit line structure includes an adjustable resistance local bit line and a select gate. The adjustable resistance bit line structure configured to set a resistance of the adjustable resistance local bit line based on a first voltage applied to the select gate. In some cases, the adjustable resistance bit line structure may be configured to set the adjustable resistance local bit line into a non-conducting state based on the first voltage applied to the select gate. The adjustable resistance local bit line may comprise intrinsic polysilicon.

One embodiment of the disclosed technology includes a first word line, a global bit line, a vertical bit line structure including a layer of intrinsic polysilicon and a select gate, and a first memory element arranged between the first word line and the layer of intrinsic polysilicon. The layer of intrinsic polysilicon connected to the global bit line. The vertical bit line structure configured to set a resistance of the layer of intrinsic polysilicon based on a first voltage applied to the select gate.

One embodiment of the disclosed technology includes a first word line, a global bit line, a first adjustable resistance bit line structure including a first adjustable resistance local bit line connected to the global bit line, a first memory element arranged between the first word line and the first adjustable resistance local bit line, a second word line, a second adjustable resistance bit line structure including a second adjustable resistance local bit line connected to the global bit line, and a second memory element arranged between the second word line and the second adjustable resistance local bit line. The first adjustable resistance bit line structure configured to set the first adjustable resistance local bit line into a conducting state during a memory operation. The second adjustable resistance bit line structure configured to set the second adjustable resistance local bit line into a non-conducting state during the memory operation.

One embodiment of the disclosed technology includes a memory element layer, an adjustable resistance local bit line surrounded by the memory element layer, a dielectric layer surrounded by the adjustable resistance local bit line, a select gate surrounded by the dielectric layer, and a word line. A portion of the memory element layer arranged between the word line and the adjustable resistance local bit line. In some cases, a resistance of the adjustable resistance local bit line may be set based on a first voltage applied to the select gate. In some cases, the adjustable resistance local bit line may be set into a non-conducting state based on a first voltage applied to the select gate.

One embodiment of the disclosed technology includes a memory element layer, a layer of intrinsic polysilicon surrounded by the memory element layer in two dimensions, a dielectric layer surrounded by the layer of intrinsic polysilicon in the two dimensions, a select gate surrounded by the dielectric layer in the two dimensions, and a first word line. A first portion of the memory element layer arranged between the first word line and the layer of intrinsic polysilicon. A second portion of the memory element layer arranged between a second word line and the layer of intrinsic polysilicon. The first word line and the second word line are arranged within a word line layer.

One embodiment of the disclosed technology includes a select gate pillar, an adjustable resistance local bit line pillar, a dielectric region arranged between the select gate pillar and the adjustable resistance local bit line pillar, a first word line, and a first portion of a memory element layer arranged between the adjustable resistance local bit line pillar and the first word line. In some cases, the dielectric region is arranged between the select gate pillar and the adjustable resistance local bit line pillar in a first direction and the first portion of the memory element layer is arranged between the adjustable resistance local bit line pillar and the first word line in a second direction substantially orthogonal to the first direction. In some cases, a resistance of the adjustable resistance local bit line pillar is set based on a first voltage applied to the select gate pillar.

One embodiment of the disclosed technology includes identifying a first word line within a memory array and identifying a first global bit line within the memory array. The first global bit line is connected to an adjustable resistance bit line structure. The adjustable resistance bit line structure includes an adjustable resistance local bit line and a select gate. A first memory cell is arranged between the adjustable resistance local bit line and the first word line. The method further comprises setting the adjustable resistance local bit line into a conducting state by applying a first voltage to the select gate and performing a memory operation on the memory array. The memory operation includes applying a selected word line voltage to the first word line and a selected bit line voltage to the first global bit line while the adjustable resistance local bit line is set into the conducting state. In some cases, the memory operation may comprise a programming operation, a SET operation, a RESET operation, or a read operation.

One embodiment of the disclosed technology includes a memory array and one or more managing circuits. The memory array includes a first adjustable resistance bit line structure and a second adjustable resistance bit line structure. The first adjustable resistance bit line structure connected to a first set of memory cells. The second adjustable resistance bit line structure connected a second set of memory cells. The one or more managing circuits in communication with the first adjustable resistance bit line structure and the second adjustable resistance bit line structure. The one or more managing circuits configured to set the first adjustable resistance bit line structure into a conducting state and the second adjustable resistance bit line structure into a non-conducting state during a memory operation.

One embodiment of the disclosed technology includes determining a first word line within a memory array and determining a first global bit line within the memory array. The first global bit line is connected to an adjustable resistance bit line structure that includes an adjustable resistance local bit line and a select gate. A first memory cell is arranged between the adjustable resistance local bit line and the first word line. The method further comprises determining a dummy word line within the memory array that comprises the word line closest to the first global bit line, determining a dummy word line voltage, and performing a memory operation on the memory array. The memory operation includes applying a selected word line voltage to the first word line and applying a selected bit line voltage to the first global bit line while the adjustable resistance local bit line is set into a conducting state. The memory operation includes applying the dummy word line voltage to the dummy word line while the adjustable resistance local bit line is set into the conducting state.

One embodiment of the disclosed technology includes identifying a dummy word line within a memory array. The memory array includes a first word line and a first global bit line. The first global bit line is connected to an adjustable resistance bit line structure that includes an adjustable resistance local bit line and a select gate. A first memory cell is arranged between the adjustable resistance local bit line and the first word line. The dummy word line comprises the word line closest to the first global bit line. The method further comprises determining a dummy word line voltage, determining a maximum current limit for the first memory cell, determining a selected select gate voltage based on the maximum current limit, and performing a memory operation on the memory array. The memory operation includes applying a selected word line voltage to the first word line and applying a selected bit line voltage to the first global bit line while the adjustable resistance local bit line is set into a conducting state. The memory operation includes applying the dummy word line voltage to the dummy word line while the adjustable resistance local bit line is set into the conducting state. The memory operation includes applying the selected select gate voltage to the select gate during the memory operation such that a current through the first memory cell does not exceed the maximum current limit for the first memory cell.

One embodiment of the disclosed technology includes identifying a first word line within a memory array and identifying a first global bit line within the memory array. The first global bit line is connected to an adjustable resistance bit line structure that includes an adjustable resistance local bit line and a select gate. A first memory cell is arranged between the adjustable resistance local bit line and the first word line. The method further comprises determining a plurality of unselected word line voltages to be applied to a plurality of unselected word lines within the memory array. A plurality of unselected memory cells is arranged between the adjustable resistance local bit line and the plurality of unselected word lines. The method further comprises performing a memory operation on the memory array. The memory operation includes applying a selected word line voltage to the first word line and applying a selected bit line voltage to the first global bit line while the adjustable resistance local bit line is set into a conducting state. The memory operation includes applying the plurality of unselected word line voltages to the plurality of unselected word lines while the adjustable resistance local bit line is set into the conducting state. In some cases, the memory operation comprises a RESET operation and the determining a plurality of unselected word line voltages includes determining the plurality of unselected word line voltages such that the voltage stress across each of the plurality of unselected memory cells is substantially 0V prior to the first memory cell being RESET. In some cases, the memory operation comprises a SET operation and the determining a plurality of unselected word line voltages includes determining the plurality of unselected word line voltages such that the voltage stress across each of the plurality of unselected memory cells is substantially 0V after the first memory cell is SET.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-volatile storage system, comprising:
   a first word line;
   an adjustable resistance bit line structure, the adjustable resistance bit line structure includes an adjustable resistance local bit line and a select gate; and
   a first memory element arranged between the first word line and the adjustable resistance local bit line, the select gate is electrically isolated from the adjustable resistance local bit line, the adjustable resistance bit line structure configured to set a resistance of the adjustable resistance local bit line based on a first voltage applied to the select gate.

2. The non-volatile storage system of claim 1, wherein:
   the adjustable resistance bit line structure configured to adjust the adjustable resistance local bit line from conducting state into a non-conducting state based on the first voltage applied to the select gate.

3. The non-volatile storage system of claim 1, wherein:
the adjustable resistance local bit line comprises one of undoped polysilicon, undoped silicon germanium, or undoped indium gallium arsenide;
the first memory element is directly connected to the adjustable resistance local bit line; and
the adjustable resistance local bit line is arranged between the first memory element and the select gate.

4. The non-volatile storage system of claim 1, wherein:
the adjustable resistance bit line structure includes a dielectric layer arranged between the select gate and the adjustable resistance local bit line.

5. The non-volatile storage system of claim 1, wherein:
the first memory element includes a ReRAM material.

6. The non-volatile storage system of claim 1, wherein:
the adjustable resistance local bit line comprises a vertical bit line that is substantially orthogonal to a substrate.

7. The non-volatile storage system of claim 1, wherein:
the adjustable resistance local bit line is connected to a global bit line via an integrated resistor arranged between the adjustable resistance local bit line and the global bit line; and
the select gate is connected to a thin-film transistor, the first voltage is applied to the select gate via the thin-film transistor.

8. The non-volatile storage system of claim 1, wherein:
the global bit line is selectively connected to a sense amplifier when the global bit line comprises a selected global bit line.

9. The non-volatile storage system of claim 1, further comprising:
a second word line; and
a second memory element arranged between the second word line and the adjustable resistance local bit line, the first word line is directly connected to the first memory element, the second word line is directly connected to the second memory element, the second memory element is directly connected to the adjustable resistance local bit line.

10. A non-volatile memory, comprising:
a first word line;
a global bit line;
a vertical bit line structure, the vertical bit line structure includes a layer of intrinsic polysilicon and a select gate; and
a first memory element arranged between the first word line and the layer of intrinsic polysilicon, the select gate is electrically isolated from the adjustable resistance local bit line, the layer of intrinsic polysilicon connected to the global bit line, the vertical bit line structure configured to set a resistance of the layer of intrinsic polysilicon based on a first voltage applied to the select gate.

11. The non-volatile memory of claim 10, wherein:
the vertical bit line structure configured to adjust the layer of intrinsic polysilicon from a conducting state into a non-conducting state based on a first voltage applied to the select gate.

12. The non-volatile memory of claim 10, wherein:
the layer of intrinsic polysilicon is connected to the global bit line via a layer of N+ polysilicon.

13. The non-volatile memory of claim 10, wherein:
the layer of intrinsic polysilicon is connected to the global bit line via an integrated resistor arranged between the layer of intrinsic polysilicon and the global bit line; and
the select gate is connected to a thin-film transistor, the first voltage is applied to the select gate via the thin-film transistor.

14. The non-volatile memory of claim 10, wherein:
the vertical bit line structure includes a dielectric layer arranged between the select gate and the layer of intrinsic polysilicon.

15. The non-volatile memory of claim 10, wherein:
the first memory element includes a ReRAM material.

16. The non-volatile memory of claim 10, wherein:
the global bit line is selectively connected to a sense amplifier when the global bit line comprises a selected global bit line.

17. A non-volatile memory, comprising:
a first word line;
a global bit line;
a first adjustable resistance bit line structure, the first adjustable resistance bit line structure includes a first adjustable resistance local bit line connected to the global bit line;
a first memory element, the first memory element arranged between the first word line and the first adjustable resistance local bit line;
a first select gate electrically isolated from the second adjustable resistance local bit line;
a second word line;
a second adjustable resistance bit line structure, the second adjustable resistance bit line structure includes a second adjustable resistance local bit line connected to the global bit line;
a second select gate electrically isolated from the second adjustable resistance local bit line;
and a second memory element, the second memory element arranged between the second word line and the second adjustable resistance local bit line, the first adjustable resistance bit line structure configured to set the first adjustable resistance local bit line into a conducting state during a memory operation, the second adjustable resistance bit line structure configured to set the second adjustable resistance local bit line into a non-conducting state during the memory operation.

18. The non-volatile memory of claim 17, wherein:
the first adjustable resistance bit line structure includes a first select gate, the first adjustable resistance local bit line is set into the conducting state during the memory operation via application of a first voltage to the first select gate; and
the second adjustable resistance bit line structure includes a second select gate, the second adjustable resistance local bit line is set into the non-conducting state during the memory operation via application of a second voltage different from the first voltage to the second select gate.

19. The non-volatile memory of claim 18, wherein:
the first adjustable resistance local bit line comprises one of undoped polysilicon, undoped silicon germanium, or undoped indium gallium arsenide; and
the first adjustable resistance bit line structure includes a first dielectric layer arranged between the first select gate and the first adjustable resistance local bit line; and
the first memory element includes a ReRAM material.

20. The non-volatile memory of claim 17, wherein:
the memory operation comprises a programming operation.

* * * * *